(12) United States Patent
Sekiguchi et al.

(10) Patent No.: US 10,934,482 B2
(45) Date of Patent: Mar. 2, 2021

(54) COLOR CONVERSION COMPOSITION, COLOR CONVERSION SHEET, AND LIGHT-EMITTING BODY, LIGHTING DEVICE, BACKLIGHT UNIT, AND DISPLAY EACH INCLUDING SAME

(71) Applicant: Toray Industries, Inc., Tokyo (JP)

(72) Inventors: Hiroki Sekiguchi, Otsu (JP); Yuichiro Iguchi, Otsu (JP); Ryo Nagase, Otsu (JP)

(73) Assignee: TORAY INDUSTRIES, INC, Tokyo (JP)

( * ) Notice: Subject to any disclaimer, the term of this patent is extended or adjusted under 35 U.S.C. 154(b) by 134 days.

(21) Appl. No.: 16/329,417

(22) PCT Filed: Aug. 23, 2017

(86) PCT No.: PCT/JP2017/030070
§ 371 (c)(1),
(2) Date: Feb. 28, 2019

(87) PCT Pub. No.: WO2018/043237
PCT Pub. Date: Mar. 8, 2018

(65) Prior Publication Data
US 2019/0194537 A1    Jun. 27, 2019

(30) Foreign Application Priority Data
Sep. 5, 2016    (JP) .............................. JP2016-172577

(51) Int. Cl.
*C09K 11/06* (2006.01)
*G02B 5/20* (2006.01)
(Continued)

(52) U.S. Cl.
CPC ............ *C09K 11/06* (2013.01); *C08K 5/0091* (2013.01); *C08L 25/08* (2013.01); *C08L 45/00* (2013.01);
(Continued)

(58) Field of Classification Search
CPC combination set(s) only.
See application file for complete search history.

(56) References Cited

U.S. PATENT DOCUMENTS 5,446,157 A     8/1995   Morgan et al.
2012/0037890 A1 2/2012   Okuda et al.
(Continued)

FOREIGN PATENT DOCUMENTS

CN     103237846 A    8/2013
CN     104861864 A    8/2015
(Continued)

OTHER PUBLICATIONS

NLPIP Lighting Answers: How are LEDs affected by heat? (Year: 2003).*
(Continued)

*Primary Examiner* — Ramsey Zacharia
(74) *Attorney, Agent, or Firm* — RatnerPrestia

(57) ABSTRACT

A color conversion composition is configured to convert incident light into light having a wavelength longer than that of the incident light. The color conversion composition includes: an organic luminescent material (A) having a full width at half maximum of a peak of 10 nm or larger and 50 nm or smaller, the peak indicating a maximum radiant intensity in an emission spectrum; and a resin (B) having an alicyclic structure, a ratio of a repeating unit having the alicyclic structure in the resin being 50% by weight or higher in a total amount of the resin.

16 Claims, 6 Drawing Sheets

(51) Int. Cl.
- *G02F 1/13357* (2006.01)
- *H01L 33/50* (2010.01)
- *C08K 5/00* (2006.01)
- *C08L 25/08* (2006.01)
- *C08L 45/00* (2006.01)
- *C08L 65/00* (2006.01)

(52) U.S. Cl.
CPC ............... *C08L 65/00* (2013.01); *G02B 5/20* (2013.01); *G02F 1/133603* (2013.01); *H01L 33/501* (2013.01); *H01L 33/502* (2013.01); *C08G 2261/3324* (2013.01); *C08G 2261/418* (2013.01); *C08G 2261/60* (2013.01); *C08G 2261/95* (2013.01); *C09K 2200/0423* (2013.01); *C09K 2200/0476* (2013.01); *H01L 2933/0041* (2013.01)

(56) References Cited

U.S. PATENT DOCUMENTS

| | | |
|---|---|---|
| 2012/0214921 A1 | 8/2012 | Niino |
| 2012/0308792 A1 | 12/2012 | Kawashima et al. |
| 2013/0264601 A1 | 10/2013 | Matsumura et al. |
| 2015/0232745 A1 | 8/2015 | Cho et al. |
| 2016/0351810 A1 | 12/2016 | Umehara et al. |

FOREIGN PATENT DOCUMENTS

| | | |
|---|---|---|
| JP | 08509471 A | 10/1996 |
| JP | 2000208262 A | 7/2000 |
| JP | 2003163376 A | 6/2003 |
| JP | 2006251076 A | 9/2006 |
| JP | 2009004351 A | 1/2009 |
| JP | 2011102841 A | 5/2011 |
| JP | 2011241160 A | 12/2011 |
| JP | 2013041910 A | 2/2013 |
| JP | 2013087243 A | 5/2013 |
| JP | 2014136771 A | 7/2014 |
| JP | 2016111208 A | 6/2016 |
| TW | 201035079 A | 10/2010 |
| WO | 2011052581 A1 | 5/2011 |
| WO | 2011083618 A1 | 7/2011 |
| WO | 2014129067 A1 | 8/2014 |
| WO | 2015119039 A1 | 8/2015 |

OTHER PUBLICATIONS

Fedors, Robert F., "A Method for Estimating Both the Solubility Parameters and Molar Volumes of Liquids", Polymer Engineering and Science, 1974, vol. 14, No. 2, pp. 147-154.

International Search Report for International Application No. PCT/JP2017/030070, dated Nov. 21, 2017—5 pages.

Korean Notification of Reason for Refusal for Korean Application No. 10-2019-7004672, dated Sep. 8, 2020, with translation, 14 pages.

Chinese Office Action for Chinese Application No. 201780054169.7, dated Sep. 30, 2020, with translation, 19 pages.

Taiwan Office Action with Search Report for Taiwan Application No. 106129468, dated Dec. 9, 2020, 8 pages.

* cited by examiner

COLOR CONVERSION COMPOSITION, COLOR CONVERSION SHEET, AND LIGHT-EMITTING BODY, LIGHTING DEVICE, BACKLIGHT UNIT, AND DISPLAY EACH INCLUDING SAME

CROSS REFERENCE TO RELATED APPLICATIONS

This is the U.S. National Phase application of PCT/JP2017/030070, filed Aug. 23, 2017, which claims priority to Japanese Patent Application No. 2016-172577, filed Sep. 5, 2016, the disclosures of each of these applications being incorporated herein by reference in their entireties for all purposes.

FIELD OF THE INVENTION

The present invention relates to a color conversion composition, a color conversion sheet, and a light-emitting body, a lighting device, a backlight unit, and a display each including the same.

BACKGROUND OF THE INVENTION

Application of a multicoloring technique making use of a color conversion method to liquid crystal displays, organic electroluminescent (EL) displays, lighting devices, and other devices is being energetically studied. Color conversion means conversion of light emitted from a light-emitting body into light having a longer wavelength, and, for example, indicates conversion of blue light emission into green or red light emission.

A composition having such a color conversion function (hereinafter, referred to as a color conversion composition) is made into a sheet, and combined with, for example, a blue light source, whereby the three primary colors, namely, blue, green, and red can be extracted, in other words, white light can be obtained from the blue light source. A white light source obtained by combining the blue light source with the sheet having the color conversion function is used as a backlight unit, and a combination of this backlight unit, a liquid crystal driving unit, and color filters allows a full-color display to be produced. Without the liquid crystal driving unit, the residual part can be used as a white light source as it is, which can be applied as a white light source such as light-emitting diode (LED) lighting using an LED.

Examples of a problem to be solved in an light-emitting body, a lighting device, and a liquid crystal display each making use of a color conversion system include the enhancement of color reproducibility and durability. To enhance color reproducibility, there is a method in which blue, green and red emission spectra of a backlight unit are each shifted to the longer wavelength side or the shorter wavelength side to enhance the color purity of each of the colors, namely, blue, green and red.

Specifically, a technique of controlling the peak wavelength of an emission spectrum by controlling the dielectric constant of a resin when at least one dye compound selected from the group consisting of a perylene-based dye, a phthalocyanine-based dye, a tetraaza porphyrin-based dye, and a porphyrin-based dye is dispersed in the resin to form a wavelength conversion material (for example, see Patent Literature 1). As examples of the technique using an organic luminescent material as a component of a color conversion composition, a technique using a cyanine compound (for example, see Patent Literature 2), a technique using a pyrromethene compound (for example, see Patent Literature 3), and a technique using a rohdamine compound (see, for example, Patent Literature 4) have been disclosed.

PATENT LITERATURE

Patent Literature 1: Japanese Patent Application Laid-open No. 2016-111208
Patent Literature 2: Japanese Patent Application Laid-open No. 2011-102841
Patent Literature 3: Japanese Patent Application Laid-open No. 2014-136771
Patent Literature 4: Japanese Patent Application Laid-open No. 2013-87243

SUMMARY OF THE INVENTION

However, even when the peak wavelength of the emission spectrum of an organic luminescent material is shifted, with the shift only, color reproducibility was not sufficiently enhanced. In addition, some of the above-mentioned organic luminescent materials have good color reproducibility, but, do not have durability enough to be used for light-emitting bodies, lighting devices, or liquid crystal displays.

The present invention has been made in view of the above-mentioned circumstances, and an object of the present invention is to achieve both color reproducibility enhancement and higher durability in a color conversion composition used for displays and lighting devices, and in a color conversion sheet including the color conversion composition.

To solve the problem described above and to achieve the object, a color conversion composition according to the present invention is a color conversion composition configured to convert incident light into light having a wavelength longer than that of the incident light. The color conversion composition includes: an organic luminescent material (A) having a full width at half maximum of a peak of 10 nm or larger and 50 nm or smaller, the peak indicating a maximum radiant intensity in an emission spectrum; and a resin (B) having an alicyclic structure, a ratio of a repeating unit having the alicyclic structure in the resin being 50% by weight or higher in a total amount of the resin.

In the color conversion composition according to the present invention, a ratio of the repeating unit having the alicyclic structure in the resin (B) is 90% by weight or higher in the total amount of the resin (B).

In the color conversion composition according to the present invention, the resin (B) has a cycloolefin structure in at least a part of a main chain and a side chain.

In the color conversion composition according to the present invention, the resin (B) has a glass transition temperature of 80° C. or higher and 130° C. or lower.

The color conversion composition according to the present invention further includes at least one of a tertiary amine, a catechol derivative, and a nickel compound. The tertiary amine, the catechol derivative, and the nickel compound have a molar extinction coefficient ε of 100 L/(mol·cm) or smaller in an entire wavelength region of 400 nm or longer and 800 nm or shorter.

In the color conversion composition according to the present invention, a wavelength of the peak indicating the maximum radiant intensity of the organic luminescent material (A) is observed in a region of 500 nm or longer and 580 nm or shorter.

In the color conversion composition according to the present invention, the organic luminescent material (A) is a pyrromethene derivative.

In the color conversion composition according to the present invention, the organic luminescent material (A) is a compound of Formula (1):

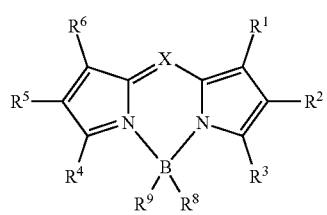

(1)

wherein X is C—$R^7$ or N; $R^1$ to $R^9$ are the same as or different from each other, and are selected from hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring each formed between adjacent substituents.

In the color conversion composition according to the present invention, X in Formula (1) is C—$R^7$, and $R^7$ is a group of Formula (2):

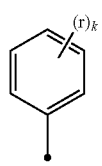

(2)

wherein r is selected from a group consisting of hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, and a phosphine oxide group; k is an integer of 1 to 3; when k is 2 or larger, r is the same as or different from each other.

In the color conversion composition according to the present invention, the $R^1$, the $R^3$, the $R^4$, and the $R^6$ in Formula (1) are the same as or different from each other, and are a substituted or unsubstituted alkyl group.

The color conversion composition according to the present invention further includes a thermoplastic resin different from the resin (B).

A color conversion sheet according to the present invention includes a color conversion layer including the color conversion composition according to any one of the above-mentioned inventions.

In the color conversion sheet according to the present invention, the color conversion layer is a color conversion layer (X) including: an organic luminescent material (A) having a full width at half maximum of a peak of 10 nm or larger and 50 nm or smaller, the peak indicating a maximum radiant intensity in an emission spectrum; and a resin (B) having an alicyclic structure, a ratio of a repeating unit having the alicyclic structure in the resin being 50% by weight or higher in a total amount of the resin. A wavelength of the peak indicating the maximum radiant intensity is observed in a region of 500 nm or longer and 580 nm or shorter by using excitation light having a wavelength in a range of 400 nm or longer and 500 nm or shorter. The color conversion sheet further includes a color conversion layer (Y) including: an organic luminescent material (E) exhibiting light emission in which a wavelength of a peak is observed in a region of 580 nm or longer and 750 nm or shorter upon being excited by at least one of excitation light having a wavelength in a range of 400 nm or longer and 500 nm or shorter and light emitted from the organic luminescent material (A); and a thermoplastic resin (C) different from the resin (B).

In the color conversion sheet according to the present invention, when a solubility parameter of the resin (B) included in the color conversion layer (X) is $SP_B(cal/cm^3)^{0.5}$ and a solubility parameter of the thermoplastic resin (C) included in the color conversion layer (Y) is $SP_C(cal/cm^3)^{0.5}$, a relationship between $SP_B$ and $SP_C$ is $SP_B \leq SP_C$.

A light-emitting body according to the present invention includes: a blue light-emitting diode; and the color conversion composition according to any one of the above-mentioned inventions.

A light-emitting body according to the present invention includes: a blue light-emitting diode; and the color conversion sheet according to any one of the above-mentioned inventions.

The light-emitting body according to the present invention further includes a resin layer between the blue light-emitting diode and the color conversion sheet.

A lighting device according to the present invention includes the light-emitting body according to any one of the above-mentioned inventions.

A backlight unit according to the present invention includes the lighting device according to the above-mentioned inventions.

A display according to the present invention include the backlight unit according to the above-mentioned inventions.

The present invention has the effect of providing a color conversion composition and a color conversion sheet each being capable of achieving both color reproducibility enhancement and higher durability. The color conversion composition and the color conversion sheet according to the present invention have the effect of achieving a light-emitting body, a lighting device, a backlight unit, and a display each being excellent in color reproducibility and durability.

DETAILED DESCRIPTION OF EMBODIMENTS OF THE INVENTION

Figure 1:
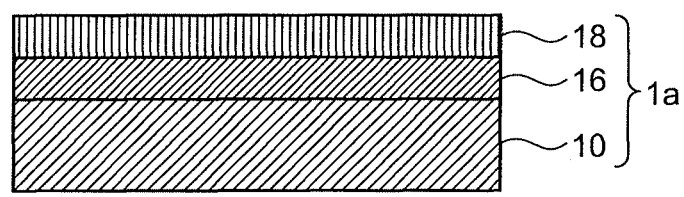
FIG. 1 is a Schematic sectional view illustrating an example of a color conversion sheet according to an embodiment of the present invention.

Hereinafter, preferred embodiments of a color conversion composition, a color conversion sheet, and a light-emitting body, a lighting device, a backlight unit, and a display each including the same according to the present invention will be described in detail. The present invention, however, is not limited to the following embodiments and various modifications can be made in accordance with purposes and applications.

<Color Conversion Composition>

A color conversion composition according to the embodiment of the present invention is configured to convert incident light into light having a wavelength longer than that of the incident light, and includes an organic luminescent material (A) and a resin (B). The organic luminescent material (A) has a full width at half maximum of a peak of 10 nm or larger and 50 nm or smaller, the peak indicating the maximum radiant intensity in an emission spectrum. The resin (B) has an alicyclic structure, a ratio of a repeating unit having the alicyclic structure in the resin being 50% by weight or higher in the total amount of the resin.

<Organic Luminescent Material>

The color conversion composition according to the embodiment of the present invention includes at least the above-described organic luminescent material (A) as an organic luminescent material. The organic luminescent material is a luminescent material made of an organic substance. Here, the luminescent material in the present invention means a material that, when irradiated with any light, emits light having a wavelength different from that of the above-mentioned light. Generally, examples of the luminescent material include inorganic fluorescent materials, fluorescent pigments, fluorescent dyes, and quantum dots, but, from the viewpoint of achieving higher color reproducibility, organic luminescent materials are preferably employed.

To achieve higher color reproducibility, the full width at half maximum of a peak indicating the maximum radiant intensity in the emission spectrum of the luminescent material is preferably narrower. The full width at half maximum means a width between two points of a peak at which the intensity of the peak is equal to half of its maximum value, and is also referred to as the full width at half maximum (FWHM).

In the emission spectrum of the organic luminescent material (A), the full width at half maximum of a peak indicating the maximum radiant intensity is 10 nm or larger and 50 nm or smaller. This full width at half maximum is preferably 15 nm or larger, and more preferably 20 nm or larger. Furthermore, the full width at half maximum is preferably 45 nm or smaller, and more preferably 40 nm or smaller. When the full width at half maximum of the peak indicating the maximum radiant intensity is within the above-mentioned range, higher color purity can be achieved. Thus, color reproducibility can be enhanced. When the full width at half maximum is smaller than 10 nm or larger than 50 nm, color purity decreases, and accordingly, higher color reproducibility cannot be achieved.

The organic luminescent material (A) preferably emits light in such a manner that the wavelength of a peak indicating the maximum radiant intensity in the emission spectrum of the organic luminescent material (A) is observed in a range of 500 nm or longer and 580 nm or shorter. Hereinafter, light emission in which a peak wavelength is observed in a range of 500 nm or longer and 580 nm or shorter is referred to as "green light emission". Excitation light for this green light emission is preferably excitation light having a wavelength of 400 nm or longer and 500 nm or shorter. Generally, excitation light having larger energy more easily causes decomposition of a luminescent material. However, excitation light having a wavelength of 400 nm or longer and 500 nm or shorter has comparatively smaller excitation energy. Hence, as long as excitation light for green light emission has a wavelength within the above-mentioned range, green light emission with sufficient color purity can be achieved without causing decomposition of a luminescent material in a color conversion composition.

To achieve a larger color gamut and enhance color reproducibility, an overlap between blue, green, and red emission spectra is preferably smaller. For example, in the case where blue light having a wavelength of 400 nm and longer and 500 nm or shorter and accordingly moderate excitation energy is used as excitation light, light emission in which a peak wavelength is observed in a region of 500 nm or longer is preferably used as green light emission. This is because, in this case, an overlap between blue and green emission spectra is smaller, and accordingly color reproducibility is enhanced. From the viewpoint of increasing this effect, the lower limit of the peak wavelength of the organic luminescent material (A) is more preferably 510 nm or longer, and still more preferably 515 nm or longer, and particularly preferably 520 nm or longer.

To make an overlap between green and red emission spectra smaller, light emission whose peak wavelength is observed in a range of 580 nm or shorter is preferably used as green light emission. From the viewpoint of increasing this effect, the upper limit of the peak wavelength of the organic luminescent material (A) is more preferably 550 nm or shorter, still more preferably 540 nm or shorter, and particularly preferably 530 nm or shorter.

The color conversion composition according to the embodiment of the present invention may further include another organic luminescent material (E). The organic luminescent material (E) is different from the luminescent material (A), and emits light whose peak wavelength is observed in a region of 580 nm or longer and 750 nm or shorter.

Hereinafter, light emission in which a peak wavelength is observed in a range of 580 nm or longer and 750 nm or shorter is referred to as "red light emission". Excitation light for this red light emission is preferably at least one of excitation light having a wavelength of 400 nm or longer and 500 nm or shorter and light emitted from the organic luminescent material (A).

A part of excitation light having a wavelength of 400 nm or longer and 500 nm or shorter penetrates the color conversion sheet including the color conversion composition according to the embodiment of the present invention, and therefore, when a blue LED having a sharp light-emission peak is employed, blue, green, and red emission spectra are exhibited in a sharp form, and thus, white light with sufficient color purity can be achieved. As a result, particularly in displays, a larger color gamut with more vivid colors can be efficiently created. In addition, in lighting applications, light emission characteristics in green and red regions are particularly improved, compared with a white LED, which is currently a mainstream, formed by a combination of a blue LED and a yellow fluorescent material, and therefore, a preferable white light source having enhanced color rendering properties can be achieved.

In the case where light emission in which a peak wavelength is observed in a region of 500 nm or longer and 580 nm or shorter is made use of as green light emission, light emission in which a peak wavelength is observed in a region of 580 nm or longer is preferably made use of as red light emission. The reason for this is, in this case, that an overlap between green and red emission spectra is smaller, and that accordingly color reproducibility is enhanced. From the viewpoint of increasing this effect, the lower limit of the peak wavelength of the organic luminescent material (E) is more preferably 620 nm or longer, still more preferably 630 nm or longer, and particularly preferably 635 nm or longer.

The upper limit of the peak wavelength of the red light is only required to be 750 nm or shorter, which is nearly the upper bound of the visible range, but, the upper limit is more preferably 700 nm or shorter because such upper limit leads to higher visibility. From the viewpoint of increasing this effect, the upper limit of the peak wavelength of the organic luminescent material (E) is still more preferably 680 nm or shorter, and particularly preferably 660 nm or shorter.

In other words, in the case where blue light having a wavelength of 400 nm or longer and 500 nm or shorter is used as excitation light, the peak wavelength of green light is observed in a region of preferably 500 nm or longer and 580 nm or shorter, more preferably 510 nm or longer and 550 nm or shorter, still more preferably 515 nm or longer and 540 nm or shorter, and particularly preferably 520 nm or longer and 530 nm or shorter. The peak wavelength of red light is observed in a region of preferably 580 nm or longer and 750 nm or shorter, more preferably 620 nm or longer and 700 nm or shorter, still more preferably 630 nm or longer and 680 nm or shorter, and particularly preferably 635 nm or longer and 660 nm or shorter.

Specific examples of the organic luminescent material (A) and the organic luminescent material (E) which are included in the color conversion composition according to the embodiment of the present invention include compounds having a condensed aryl ring and derivatives thereof, compounds having a heteroaryl ring and derivatives thereof, borane derivatives, stilbene derivatives, aromatic acetylene derivatives, tetraphenylbutadiene derivatives, aldazine derivatives, pyrromethene derivatives, diketopyrrolo[3,4-c] pyrrole derivatives, coumarin derivatives, azole derivatives and metal complexes thereof, cyanine-based compounds, xanthene-based compounds, thioxanthene-based compounds, polyphenylene-based compounds, naphthalimide derivatives, phthalocyanine derivatives and metal complexes thereof, porphyrin derivatives and metal complexes thereof, oxazine-based compounds, helicene-based compounds, aromatic amine derivatives, and organic metal complex compounds.

Examples of the compounds having a condensed aryl ring and the derivatives thereof include naphthalene, anthracene, phenanthrene, pyrene, chrysene, naphthacene, triphenylene, perylene, fluoranthene, fluorene, and indene. Examples of the compounds having a heteroaryl ring and the derivatives thereof include furan, pyrrole, thiophene, silole, 9-silafluorene, 9,9'-spirobisilafluorene, benzothiophene, benzofuran, indole, dibenzothiophene, dibenzofuran, imidazopyridine, phenanthroline, pyridine, pyrazine, naphthyridine, quinoxaline, and pyrrolopyridine. Examples of the stilbene derivatives include 1,4-distyrylbenzene, 4,4'-bis(2-(4-diphenylaminophenyl)ethenyl)biphenyl, and 4,4'-bis(N-(stilben-4-yl)-N-phenylamino)stilbene. Examples of the coumarin derivatives include coumarin 6, coumarin 7, and coumarin 153. Examples of the azole derivatives and the metal complexes thereof include imidazole, triazole, thiadiazole, carbazole, oxazole, oxadiazole, and triazole. Examples of the cyanine-based compounds include indocyanine green. Examples of the xanthene-based compounds and the thioxanthene-based compounds include fluorescein, eosine, and rhodamine. Examples of the oxazine-based compounds include Nile red and Nile blue. Examples of the aromatic amine derivatives include N,N'-diphenyl-N,N'-di(3-methylphenyl)-4,4'-diphenyl-1,1'-diamine. Examples of the organic metal complex compounds include iridium (Ir), ruthenium (Ru), rhodium (Rh), palladium (Pd), platinum (Pt), osmium (Os), and rhenium (Re).

The organic luminescent material (A) and the organic luminescent material (E) are not limited to the above-mentioned organic luminescent materials. Furthermore, the color conversion composition according to the embodiment of the present invention is only required to include at least one selected from the above-mentioned organic luminescent materials, and may include two or more of the organic luminescent materials.

The organic luminescent material (A) and the organic luminescent material (E) may be a fluorescent material or a phosphorescent material, but, from the viewpoint of achieving higher color reproducibility, a fluorescent material is preferred. Among the above-mentioned materials, the compounds having a condensed aryl ring and the derivatives thereof are preferred because of their high thermal stability and high light stability. In particular, the organic luminescent material (A) and the organic luminescent material (E) are preferably a pyrromethene derivative because a pyrromethene derivative has a narrower full width at half maximum and earns a higher luminescence quantum yield. Examples of the pyrromethene derivative include, but not limited to, a compound of Formula (1).

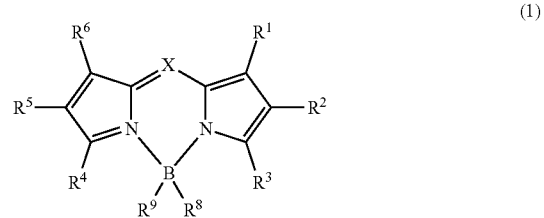

(1)

In Formula (1), X is C—R$^7$ or N; R$^1$ to R$^9$ may be the same as or different from each other, and are selected from hydrogen, an alkyl group, a cycloalkyl group, a heterocyclic group, an alkenyl group, a cycloalkenyl group, an alkynyl group, a hydroxy group; a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring each formed between adjacent substituents. In all of the above-mentioned groups, hydrogen may be replaced with deuterium. The same applies to the following compounds or partial structures thereof.

In the following description, for example, "a substituted or unsubstituted C$_{6-40}$ aryl group" means an aryl group in which the number of all the carbon atoms, including the number of carbon atoms contained in a substituent substituted for the aryl group, is 6 to 40. The same applies to other substituents whose number of carbon atoms is defined.

In all the above-mentioned substituted groups, a substituent is preferably an alkyl group, a cycloalkyl group, a heterocyclic group, an alkenyl group a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, or a phosphine oxide group, and more preferably a specific substituent preferably recited in the descriptions of substituents. The above-mentioned substituents may be further substituted with the above-mentioned substituents.

The "unsubstituted" in the term "substituted or unsubstituted" means that a hydrogen atom or a deuterium atom has been substituted. The same applies to the term "substituted or unsubstituted" in the following compounds or partial structures thereof.

Among all the above-mentioned groups, the alkyl group refers to a saturated aliphatic hydrocarbon group, such as a methyl group, an ethyl group, an n-propyl group, an isopropyl group, an n-butyl group, a sec-butyl group, and a tert-butyl group. This saturated aliphatic hydrocarbon group may or does not necessarily have a substituent. When the alkyl group is substituted, an additional substituent is not particularly limited. Examples of the additional substituent include an alkyl group, halogen, an aryl group, and a heteroaryl group. This point of view is also common to the following descriptions. In addition, the number of carbon atoms in the alkyl group is not particularly limited, but is preferably 1 or larger and 20 or smaller, and more preferably 1 or larger and 8 or smaller, from the viewpoints of availability and cost.

The cycloalkyl group refers to a saturated alicyclic hydrocarbon group, such as a cyclopropyl group, a cyclohexyl group, a norbornyl group, or an adamantyl group. This saturated alicyclic hydrocarbon group may or does not necessarily have a substituent. The number of carbon atoms in an alkyl group moiety is not particularly limited, but is preferably in a range of 3 or larger and 20 or smaller.

The heterocyclic group refers to an aliphatic ring having an atom other than carbon in the ring, such as a pyran ring, a piperidine ring, or a cyclic amide. This heterocyclic group may or does not necessarily have a substituent. The number of carbon atoms in the heterocyclic group is not particularly limited, but is preferably in a range of 2 or larger and 20 or smaller.

The alkenyl group refers to an unsaturated aliphatic hydrocarbon group having a double bond, such as a vinyl group, an allyl group, or a butadienyl group. This unsaturated aliphatic hydrocarbon group may or does not necessarily have a substituent. The number of carbon atoms in the alkenyl group is not particularly limited, but is preferably in a range of 2 or larger and 20 or smaller.

The cycloalkenyl group refers to an unsaturated alicyclic hydrocarbon group having a double bond, such as a cyclopentenyl group, a cyclopentadienyl group, or a cyclohexenyl group. This unsaturated alicyclic hydrocarbon group may or does not necessarily have a substituent.

The alkynyl group refers to an unsaturated aliphatic hydrocarbon group having a triple bond, such as an ethynyl group. This unsaturated aliphatic hydrocarbon group may or does not necessarily have a substituent. The number of carbon atoms in the alkynyl group is not particularly limited, but is preferably in a range of 2 or larger and 20 or smaller.

The alkoxy group refers to a functional group to which an aliphatic hydrocarbon group is bonded through an ether bond, such as a methoxy group, an ethoxy group, or a propoxy group. This aliphatic hydrocarbon group may or does not necessarily have a substituent. The carbon number of the alkoxy group is not particularly limited, but is preferably in a range of 1 or larger and 20 or smaller.

The alkylthio group is a group formed by substituting a sulfur atom for an oxygen atom of an ether bond of an alkoxy group. The hydrocarbon group of the alkylthio group may or does not necessarily have a substituent. The number of carbon atoms in the alkylthio group is not particularly limited, but is preferably in a range of 1 or larger and 20 or smaller.

The aryl ether group refers to a functional group to which an aromatic hydrocarbon group is bonded through an ether bond, such as a phenoxy group. This aromatic hydrocarbon group may or does not necessarily have a substituent. The number of carbon atoms in the aryl ether group is not particularly limited, but is preferably in a range of 6 or larger and 40 or smaller.

The aryl thioether group is a group formed by substituting a sulfur atom for an oxygen atom of an ether bond of an aryl ether group. An aromatic hydrocarbon group in the aryl thioether group may or does not necessarily have a substituent. The number of carbon atoms in the aryl thioether group is not particularly limited, but is preferably in a range of 6 or larger and 40 or smaller.

The aryl group refers to an aromatic hydrocarbon group, such as a phenyl group, a biphenyl group, a terphenyl group, a naphthyl group, a fluorenyl group, a benzofluorenyl group, a dibenzofluorenyl group, a phenanthryl group, an anthracenyl group, a benzophenanthryl group, a benzoanthracenyl group, a chrysenyl group, a pyrenyl group, a fluoranthenyl group, a triphenylenyl group, a benzofluoranthenyl group, a dibenzoanthracenyl group, a perylenyl group, or a helicenyl group. Among these groups, a phenyl group, a biphenyl group, a terphenyl group, a naphthyl group, a fluorenyl group, a phenanthryl group, an anthracenyl group, a pyrenyl group, a fluoranthenyl group, and a triphenylenyl group are preferred. The aryl group may or does not necessarily have a substituent. The number of carbon atoms in the aryl group is not particularly limited, but is in a range of preferably 6 or larger and 40 or smaller, and more preferably 6 or larger and 30 or smaller.

In the case where $R^1$ to $R^9$ are a substituted or unsubstituted aryl group, this aryl group is preferably a phenyl group, a biphenyl group, a terphenyl group, a naphthyl group, a fluorenyl group, a phenanthryl group, or an anthracenyl group, more preferably a phenyl group, a biphenyl group, a terphenyl group, or a naphthyl group, still more preferably a phenyl group, a biphenyl group, or a terphenyl group, and particularly preferably a phenyl group.

In the case where a substituent of each of $R^1$ to $R^9$ is further substituted with an aryl group, this aryl group is preferably a phenyl group, a biphenyl group, a terphenyl group, a naphthyl group, a fluorenyl group, a phenanthryl group, or an anthracenyl group, more preferably a phenyl group, a biphenyl group, a terphenyl group, or a naphthyl group, and particularly preferably a phenyl group.

The heteroarl group refers to a cyclic aromatic group having one or a plurality of atoms other than carbon in the ring, such as a pyridyl group, a furanyl group, a thiophenyl group, a quinolinyl group, an isoquinolinyl group, a pyrazinyl group, a pyrimidyl group, a pyridazinyl group, a triazinyl group, a naphthylidinyl group, a cinnolinyl group, a phthaladinyl group, a quinoxalinyl group, a quinazolinyl group, a benzofuranyl group, a benzothiophenyl group, an indolyl group, a dibenzofuranyl group, a dibenzothiophenyl group, a carbazolyl group, a benzocarbazolyl group, a carbolinyl group, an indolocarbazolyl group, a benzofurocarbazolyl group, a benzothienocarbazolyl group, a dihydroindenocarbazolyl group, a benzoquinolinyl group, an acridinyl group, a dibenzoacridinyl group, a benzimidazolyl group, an imidazopyridyl group, a benzoxazolyl group, a benzothiazolyl group, or a phenanthrolinyl group. Here, the naphthylidinyl group refers to any of 1,5-naphthylidinyl group, 1,6-naphthylidinyl group, 1,7-naphthylidinyl group, 1,8-naphthylidinyl group, 2,6-naphthylidinyl group, and 2,7-naphthylidinyl group.

The heteroaryl group may or does not necessarily have a substituent. The number of carbon atoms in the heteroaryl group is not particularly limited, but is in a range of preferably 2 or larger and 40 or smaller, and more preferably 2 or larger and 30 or smaller.

In the case where $R^1$ to $R^9$ are a substituted or unsubstituted heteroaryl group, this heteroaryl group is preferably a pyridyl group, a furanyl group, a thiophenyl group, a quinolinyl group, a pyrimidyl group, a triazinyl group, a benzofuranyl group, a benzothiophenyl group, an indolyl group, a dibenzofuranyl group, a dibenzothiophenyl group, a carbazolyl group, a benzimidazolyl group, an imidazopyridyl group, a benzoxazolyl group, a benzothiazolyl group, or a phenanthrolinyl group, more preferably a pyridyl group, a furanyl group, a thiophenyl group, or a quinolinyl group, and particularly preferably a pyridyl group.

In the case where a substituent of each of $R^1$ to $R^9$ is further substituted with a heteroaryl group, this heteroaryl group is preferably a pyridyl group, a furanyl group, a thiophenyl group, a quinolinyl group, a pyrimidyl group, a triazinyl group, a benzofuranyl group, a benzothiophenyl group, an indolyl group, a dibenzofuranyl group, a dibenzothiophenyl group, a carbazolyl group, a benzoimidazolyl group, an imidazopyridyl group, a benzoxazolyl group, a benzothiazolyl group, or a phenanthrolinyl group, more preferably a pyridyl group, a furanyl group, a thiophenyl group, or a quinolinyl group, and particularly preferably a pyridyl group.

The halogen refers to an atom selected from fluorine, chlorine, bromine, and iodine. The carbonyl group, the carboxy group, the oxycarbonyl group, and the carbamoyl group may or does not necessarily have a substituent. Here, examples of the substituent include an alkyl group, a cycloalkyl group, an aryl group, and a heteroaryl group. These substituents may be further substituted.

The amino group is a substituted or unsubstituted amino group. Examples of a substituent in the substituted amino group include an aryl group, a heteroaryl group, a linear alkyl group, and a branched alkyl group. As the aryl group and the heteroaryl group, a phenyl group, a naphthyl group, a pyridyl group, and a quinolinyl group are preferred. These substituents may be further substituted. The number of carbon atoms in the amino group is not particularly limited, but is in a range of preferably 2 or larger and 50 or smaller, more preferably 6 or larger and 40 or smaller, and particularly preferably 6 or larger and 30 or smaller.

The silyl group refers to an alkylsilyl group, such as a trimethylsilyl group, a triethylsilyl group, a tert-butyldimethylsilyl group, a propyldimethylsilyl group, or a vinyldimethylsilyl group; or an arylsilyl group, such as a phenyldimethylsilyl group, a tert-butyldiphenylsilyl group, a triphenylsilyl group, or a trinaphthylsilyl group. A substituent on silicon of the silyl group may be further substituted. The number of carbon atoms in the silyl group is not particularly limited, but is preferably in a range of 1 or larger and 30 or smaller.

The siloxanyl group refers to a silicon compound group through an ether bond, such as a trimethylsiloxanyl group. A substituent on silicon of the siloxanyl group may be further substituted.

The boryl group is a substituted or unsubstituted boryl group. Examples of a substituent in the substituted boryl group include an aryl group, a heteroaryl group, a linear alkyl group, a branched alkyl group, an aryl ether group, an alkoxy group, and a hydroxy group. Among these groups, an aryl group and an aryl ether group are preferred.

The phosphine oxide group refers to a group represented by $-P(=O)R^{10}R^{11}$. $R^{10}$ and $R^{11}$ are selected from the same groups as those of $R^1$ to $R^9$.

The condensed ring formed between adjacent substituents refers to a ring formed by mutual bonding between any two adjacent substituents (for example, $R^1$ and $R^2$ in Formula (1)) to form a conjugated or non-conjugated cyclic skeleton. Besides carbon, the condensed ring may include a constituent element selected from nitrogen, oxygen, sulfur, phosphorus, and silicon. The condensed ring may further condense with another ring. The same applies to the aliphatic ring formed between adjacent substituents.

The compound of Formula (1) exhibits a full width at half maximum of a peak of 10 nm or larger and 50 nm or smaller, the peak indicating the maximum radiant intensity in the emission spectrum, and earns high luminescence quantum yield, thus allowing high color reproducibility and efficient color conversion to be achieved.

Furthermore, by introducing an appropriate substituent into an appropriate portion of the compound of Formula (1), various characteristics and properties of the compound, such as light emission efficiency, color purity, thermal stability, light stability, and dispersibility, can be adjusted.

For example, compared with a case in which all of $R^1$, $R^3$, $R^4$, and $R^6$ are hydrogens, a case in which at least one of $R^1$, $R^3$, $R^4$, and $R^6$ is a substituted or unsubstituted alkyl group, a substituted or unsubstituted aryl group, or a substituted or unsubstituted heteroaryl group exhibits better thermal stability and light stability.

In the case where at least one of $R^1$, $R^3$, $R^4$, and $R^6$ is a substituted or unsubstituted alkyl group, this alkyl group is preferably a $C_{1-6}$ alkyl group, such as a methyl group, an ethyl group, an n-propyl group, an isopropyl group, an n-butyl group, a sec-butyl group, a tert-butyl group, a pentyl group, or a hexyl group. Among these groups, a methyl group, an ethyl group, an n-propyl group, an isopropyl group, an n-butyl group, a sec-butyl group, and a tert-butyl group are more preferred because these groups are more excellent in thermal stability. Furthermore, from the viewpoints of preventing concentration quenching and enhancing a luminescence quantum yield, a sterically bulky tert-butyl group is still more preferred as the alkyl group. From the viewpoints of the ease of synthesis and the ease of availability of raw materials, a methyl group is also preferably used as the alkyl group.

In the case where at least one of $R^1$, $R^3$, $R^4$, and $R^6$ is a substituted or unsubstituted aryl group, this aryl group is preferably a phenyl group, a biphenyl group, a terphenyl group, or a naphthyl group, more preferably a phenyl group or a biphenyl group, and particularly preferably a phenyl group.

In the case where at least one of $R^1$, $R^3$, $R^4$, and $R^6$ is a substituted or unsubstituted heteroaryl group, this heteroaryl group is preferably a pyridyl group, a quinolinyl group, or a thiophenyl group, more preferably a pyridyl group or a quinolinyl group, and particularly more preferably a pyridyl group.

All of $R^1$, $R^3$, $R^4$, and $R^6$ may be the same as or different from each other. $R^1$, $R^3$, $R^4$, and $R^6$ each are preferably a substituted or unsubstituted alkyl group because of its good solubility in a binder resin and a solvent. From the viewpoints of the ease of synthesis and the ease of availability of raw materials, a methyl group is preferably used as this alkyl group.

All of $R^1$, $R^3$, $R^4$, and $R^6$ may be the same as or different from each other. $R^1$, $R^3$, $R^4$, and $R^6$ each are preferably a substituted or unsubstituted aryl group or a substituted or unsubstituted heteroaryl group because these groups lead to better thermal stability and light stability. In particular, all of $R^1$, $R^3$, $R^4$, and $R^6$ may be the same as or different from each other, and are more preferably a substituted or unsubstituted aryl group.

Some substituents are capable of enhancing a plurality of properties, such as light emission efficiency, color purity, thermal stability, light stability, and dispersibility, but only a small number of substituents exhibit sufficient performance in all the properties. In particular, it is difficult to achieve both high light emission efficiency and high color purity. Therefore, by introducing a plurality of substituents into the compound of Formula (1), the compound can be balanced in terms of light emission characteristics and color purity, for example.

In particular, all of $R^1$, $R^3$, $R^4$, and $R^6$ may be the same as or different from each other, and in the case where $R^1$, $R^3$, $R^4$, and $R^6$ are a substituted or unsubstituted aryl group, a plurality of substituents is preferably introduced, for example, in such a manner that $R^1 \neq R^4$, $R^3 \neq R^6$, $R^1 \neq R^3$, or $R^4 \neq R^6$. Here, "≠" means that groups have different structures. For example, in the case of $R^1 \neq R^4$, the structures of $R^1$ and $R^4$ are different from each other. Such introduction of a plurality of substituents allows an aryl group capable of affecting color purity and an aryl group capable of affecting light emission efficiency to be introduced at the same time into the compound of Formula (1). Thus, color purity and light emission efficiency can be minutely adjusted.

In particular, a case of $R^1 \neq R^3$ or $R^4 \neq R^6$ is preferred from the viewpoint of enhancing light emission efficiency and color purity with a good balance. In this case, one or more aryl groups having an influence on color purity can be introduced into a pyrrole ring at each end of the compound of Formula (1), while an aryl group having an influence on light emission efficiency can be introduced into any portion other than the pyrrole rings. Thus, both of these properties can be enhanced to the maximum. In addition, when $R^1 \neq R^3$ or $R^4 \neq R^6$, $R^1 = R^4$ and $R^3 = R^6$ are more preferred from the viewpoint of enhancing both heat resistance and color purity.

The aryl group mainly affecting color purity is preferably an aryl group substituted with an electron donating group. In the organic electronics, the electron donating group is an atomic group that, by an induction effect or a resonance effect, donates electrons to an atomic group substituted with the electron donating group. Examples of the electron donating group include an alkyl group and an alkoxy group. In particular, a $C_{1-8}$ alkyl group and a $C_{1-8}$ alkoxy group are preferred. A methyl group, an ethyl group, a tert-butyl group, and a methoxy group are more preferred. From the viewpoint of dispersibility, a tert-butyl group and a methoxy group are particularly preferred since the use of these groups as an electron donating group can prevent quenching due to aggregation of molecules in the compound of Formula (1). The substitution position of a substituent is not particularly limited, but twisting of a bond needs to be prevented in order to enhance the light stability of the compound of Formula (1), and therefore the substituent is preferably bonded at a meta- or para-position relative to a bonding site to a pyrromethene skeleton.

The aryl group mainly affecting light emission efficiency is preferably an aryl group having a bulky substituent, such as a tert-butyl group, an adamantyl group or a methoxy group.

All of $R^1$, $R^3$, $R^4$, and $R^6$ may be the same as or different from each other, and in the case where $R^1$, $R^3$, $R^4$, and $R^6$ are a substituted or unsubstituted aryl group, $R^1$, $R^3$, $R^4$, and $R^6$ each are preferably selected from Ar-1 to Ar-6 mentioned below. In this case, examples of a preferred combination of $R^1$, $R^3$, $R^4$, and $R^6$ include, but are not limited to, combinations listed in Tables 1-1 to 1-11.

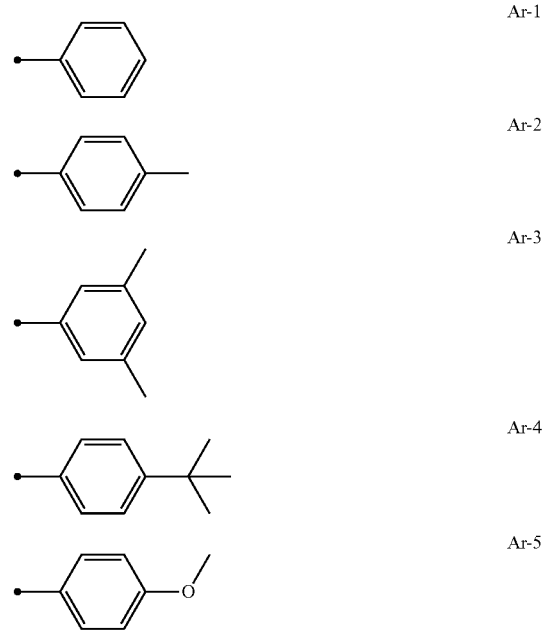

-continued

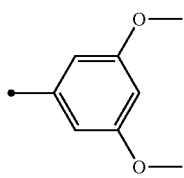
Ar-6

TABLE 1-1

| R1 | R3 | R4 | R6 |
|---|---|---|---|
| Ar-1 | Ar-1 | Ar-1 | Ar-1 |
| Ar-1 | Ar-1 | Ar-1 | Ar-2 |
| Ar-1 | Ar-1 | Ar-1 | Ar-3 |
| Ar-1 | Ar-1 | Ar-1 | Ar-4 |
| Ar-1 | Ar-1 | Ar-1 | Ar-5 |
| Ar-1 | Ar-1 | Ar-1 | Ar-6 |
| Ar-1 | Ar-1 | Ar-2 | Ar-1 |
| Ar-1 | Ar-1 | Ar-2 | Ar-2 |
| Ar-1 | Ar-1 | Ar-2 | Ar-3 |
| Ar-1 | Ar-1 | Ar-2 | Ar-4 |
| Ar-1 | Ar-1 | Ar-2 | Ar-5 |
| Ar-1 | Ar-1 | Ar-2 | Ar-6 |
| Ar-1 | Ar-1 | Ar-3 | Ar-1 |
| Ar-1 | Ar-1 | Ar-3 | Ar-2 |
| Ar-1 | Ar-1 | Ar-3 | Ar-3 |
| Ar-1 | Ar-1 | Ar-3 | Ar-4 |
| Ar-1 | Ar-1 | Ar-3 | Ar-5 |
| Ar-1 | Ar-1 | Ar-3 | Ar-6 |
| Ar-1 | Ar-1 | Ar-4 | Ar-1 |
| Ar-1 | Ar-1 | Ar-4 | Ar-2 |
| Ar-1 | Ar-1 | Ar-4 | Ar-3 |
| Ar-1 | Ar-1 | Ar-4 | Ar-4 |
| Ar-1 | Ar-1 | Ar-4 | Ar-5 |
| Ar-1 | Ar-1 | Ar-4 | Ar-6 |
| Ar-1 | Ar-1 | Ar-5 | Ar-1 |
| Ar-1 | Ar-1 | Ar-5 | Ar-2 |
| Ar-1 | Ar-1 | Ar-5 | Ar-3 |
| Ar-1 | Ar-1 | Ar-5 | Ar-4 |
| Ar-1 | Ar-1 | Ar-5 | Ar-5 |
| Ar-1 | Ar-1 | Ar-5 | Ar-6 |
| Ar-1 | Ar-1 | Ar-6 | Ar-1 |
| Ar-1 | Ar-1 | Ar-6 | Ar-2 |
| Ar-1 | Ar-1 | Ar-6 | Ar-3 |
| Ar-1 | Ar-1 | Ar-6 | Ar-4 |
| Ar-1 | Ar-1 | Ar-6 | Ar-5 |
| Ar-1 | Ar-1 | Ar-6 | Ar-6 |
| Ar-1 | Ar-2 | Ar-1 | Ar-2 |
| Ar-1 | Ar-2 | Ar-1 | Ar-3 |
| Ar-1 | Ar-2 | Ar-1 | Ar-4 |
| Ar-1 | Ar-2 | Ar-1 | Ar-5 |
| Ar-1 | Ar-2 | Ar-1 | Ar-6 |
| Ar-1 | Ar-2 | Ar-2 | Ar-1 |
| Ar-1 | Ar-2 | Ar-2 | Ar-2 |
| Ar-1 | Ar-2 | Ar-2 | Ar-3 |
| Ar-1 | Ar-2 | Ar-2 | Ar-4 |
| Ar-1 | Ar-2 | Ar-2 | Ar-5 |
| Ar-1 | Ar-2 | Ar-2 | Ar-6 |
| Ar-1 | Ar-2 | Ar-3 | Ar-1 |
| Ar-1 | Ar-2 | Ar-3 | Ar-2 |
| Ar-1 | Ar-2 | Ar-3 | Ar-3 |
| Ar-1 | Ar-2 | Ar-3 | Ar-4 |
| Ar-1 | Ar-2 | Ar-3 | Ar-5 |
| Ar-1 | Ar-2 | Ar-3 | Ar-6 |
| Ar-1 | Ar-2 | Ar-4 | Ar-1 |
| Ar-1 | Ar-2 | Ar-4 | Ar-2 |
| Ar-1 | Ar-2 | Ar-4 | Ar-3 |
| Ar-1 | Ar-2 | Ar-4 | Ar-4 |
| Ar-1 | Ar-2 | Ar-4 | Ar-5 |
| Ar-1 | Ar-2 | Ar-4 | Ar-6 |

TABLE 1-2

| R1 | R3 | R4 | R6 |
|---|---|---|---|
| Ar-1 | Ar-2 | Ar-5 | Ar-1 |
| Ar-1 | Ar-2 | Ar-5 | Ar-2 |
| Ar-1 | Ar-2 | Ar-5 | Ar-3 |
| Ar-1 | Ar-2 | Ar-5 | Ar-4 |
| Ar-1 | Ar-2 | Ar-5 | Ar-5 |
| Ar-1 | Ar-2 | Ar-5 | Ar-6 |
| Ar-1 | Ar-2 | Ar-6 | Ar-1 |
| Ar-1 | Ar-2 | Ar-6 | Ar-2 |
| Ar-1 | Ar-2 | Ar-6 | Ar-3 |
| Ar-1 | Ar-2 | Ar-6 | Ar-4 |
| Ar-1 | Ar-2 | Ar-6 | Ar-5 |
| Ar-1 | Ar-2 | Ar-6 | Ar-6 |
| Ar-1 | Ar-3 | Ar-1 | Ar-2 |
| Ar-1 | Ar-3 | Ar-1 | Ar-3 |
| Ar-1 | Ar-3 | Ar-1 | Ar-4 |
| Ar-1 | Ar-3 | Ar-1 | Ar-5 |
| Ar-1 | Ar-3 | Ar-1 | Ar-6 |
| Ar-1 | Ar-3 | Ar-2 | Ar-2 |
| Ar-1 | Ar-3 | Ar-2 | Ar-3 |
| Ar-1 | Ar-3 | Ar-2 | Ar-4 |
| Ar-1 | Ar-3 | Ar-2 | Ar-5 |
| Ar-1 | Ar-3 | Ar-2 | Ar-6 |
| Ar-1 | Ar-3 | Ar-3 | Ar-1 |
| Ar-1 | Ar-3 | Ar-3 | Ar-2 |
| Ar-1 | Ar-3 | Ar-3 | Ar-3 |
| Ar-1 | Ar-3 | Ar-3 | Ar-4 |
| Ar-1 | Ar-3 | Ar-3 | Ar-5 |
| Ar-1 | Ar-3 | Ar-3 | Ar-6 |
| Ar-1 | Ar-3 | Ar-4 | Ar-1 |
| Ar-1 | Ar-3 | Ar-4 | Ar-2 |
| Ar-1 | Ar-3 | Ar-4 | Ar-3 |
| Ar-1 | Ar-3 | Ar-4 | Ar-4 |
| Ar-1 | Ar-3 | Ar-4 | Ar-5 |
| Ar-1 | Ar-3 | Ar-4 | Ar-6 |
| Ar-1 | Ar-3 | Ar-5 | Ar-1 |
| Ar-1 | Ar-3 | Ar-5 | Ar-2 |
| Ar-1 | Ar-3 | Ar-5 | Ar-3 |
| Ar-1 | Ar-3 | Ar-5 | Ar-4 |
| Ar-1 | Ar-3 | Ar-5 | Ar-5 |
| Ar-1 | Ar-3 | Ar-5 | Ar-6 |
| Ar-1 | Ar-3 | Ar-6 | Ar-1 |
| Ar-1 | Ar-3 | Ar-6 | Ar-2 |
| Ar-1 | Ar-3 | Ar-6 | Ar-3 |
| Ar-1 | Ar-3 | Ar-6 | Ar-4 |
| Ar-1 | Ar-3 | Ar-6 | Ar-5 |
| Ar-1 | Ar-3 | Ar-6 | Ar-6 |
| Ar-1 | Ar-4 | Ar-1 | Ar-2 |
| Ar-1 | Ar-4 | Ar-1 | Ar-3 |
| Ar-1 | Ar-4 | Ar-1 | Ar-4 |
| Ar-1 | Ar-4 | Ar-1 | Ar-5 |
| Ar-1 | Ar-4 | Ar-1 | Ar-6 |
| Ar-1 | Ar-4 | Ar-2 | Ar-2 |
| Ar-1 | Ar-4 | Ar-2 | Ar-3 |
| Ar-1 | Ar-4 | Ar-2 | Ar-4 |
| Ar-1 | Ar-4 | Ar-2 | Ar-5 |
| Ar-1 | Ar-4 | Ar-2 | Ar-6 |
| Ar-1 | Ar-4 | Ar-3 | Ar-2 |
| Ar-1 | Ar-4 | Ar-3 | Ar-3 |
| Ar-1 | Ar-4 | Ar-3 | Ar-4 |
| Ar-1 | Ar-4 | Ar-3 | Ar-5 |
| Ar-1 | Ar-4 | Ar-3 | Ar-6 |

TABLE 1-3

| R1 | R3 | R4 | R6 |
|---|---|---|---|
| Ar-1 | Ar-4 | Ar-4 | Ar-1 |
| Ar-1 | Ar-4 | Ar-4 | Ar-2 |
| Ar-1 | Ar-4 | Ar-4 | Ar-3 |
| Ar-1 | Ar-4 | Ar-4 | Ar-4 |
| Ar-1 | Ar-4 | Ar-4 | Ar-5 |
| Ar-1 | Ar-4 | Ar-4 | Ar-6 |
| Ar-1 | Ar-4 | Ar-5 | Ar-1 |
| Ar-1 | Ar-4 | Ar-5 | Ar-2 |
| Ar-1 | Ar-4 | Ar-5 | Ar-3 |

TABLE 1-3-continued

| R1 | R3 | R4 | R6 |
|---|---|---|---|
| Ar-1 | Ar-4 | Ar-5 | Ar-4 |
| Ar-1 | Ar-4 | Ar-5 | Ar-5 |
| Ar-1 | Ar-4 | Ar-5 | Ar-6 |
| Ar-1 | Ar-4 | Ar-6 | Ar-1 |
| Ar-1 | Ar-4 | Ar-6 | Ar-2 |
| Ar-1 | Ar-4 | Ar-6 | Ar-3 |
| Ar-1 | Ar-4 | Ar-6 | Ar-4 |
| Ar-1 | Ar-4 | Ar-6 | Ar-5 |
| Ar-1 | Ar-4 | Ar-6 | Ar-6 |
| Ar-1 | Ar-5 | Ar-1 | Ar-2 |
| Ar-1 | Ar-5 | Ar-1 | Ar-3 |
| Ar-1 | Ar-5 | Ar-1 | Ar-4 |
| Ar-1 | Ar-5 | Ar-1 | Ar-5 |
| Ar-1 | Ar-5 | Ar-1 | Ar-6 |
| Ar-1 | Ar-5 | Ar-2 | Ar-2 |
| Ar-1 | Ar-5 | Ar-2 | Ar-3 |
| Ar-1 | Ar-5 | Ar-2 | Ar-4 |
| Ar-1 | Ar-5 | Ar-2 | Ar-5 |
| Ar-1 | Ar-5 | Ar-2 | Ar-6 |
| Ar-1 | Ar-5 | Ar-3 | Ar-2 |
| Ar-1 | Ar-5 | Ar-3 | Ar-3 |
| Ar-1 | Ar-5 | Ar-3 | Ar-4 |
| Ar-1 | Ar-5 | Ar-3 | Ar-5 |
| Ar-1 | Ar-5 | Ar-3 | Ar-6 |
| Ar-1 | Ar-5 | Ar-4 | Ar-2 |
| Ar-1 | Ar-5 | Ar-4 | Ar-3 |
| Ar-1 | Ar-5 | Ar-4 | Ar-4 |
| Ar-1 | Ar-5 | Ar-4 | Ar-5 |
| Ar-1 | Ar-5 | Ar-4 | Ar-6 |
| Ar-1 | Ar-5 | Ar-5 | Ar-1 |
| Ar-1 | Ar-5 | Ar-5 | Ar-2 |
| Ar-1 | Ar-5 | Ar-5 | Ar-3 |
| Ar-1 | Ar-5 | Ar-5 | Ar-4 |
| Ar-1 | Ar-5 | Ar-5 | Ar-5 |
| Ar-1 | Ar-5 | Ar-5 | Ar-6 |
| Ar-1 | Ar-5 | Ar-6 | Ar-1 |
| Ar-1 | Ar-5 | Ar-6 | Ar-2 |
| Ar-1 | Ar-5 | Ar-6 | Ar-3 |
| Ar-1 | Ar-5 | Ar-6 | Ar-4 |
| Ar-1 | Ar-5 | Ar-6 | Ar-5 |
| Ar-1 | Ar-5 | Ar-6 | Ar-6 |
| Ar-1 | Ar-6 | Ar-1 | Ar-2 |
| Ar-1 | Ar-6 | Ar-1 | Ar-3 |
| Ar-1 | Ar-6 | Ar-1 | Ar-4 |
| Ar-1 | Ar-6 | Ar-1 | Ar-5 |
| Ar-1 | Ar-6 | Ar-1 | Ar-6 |
| Ar-1 | Ar-6 | Ar-2 | Ar-2 |
| Ar-1 | Ar-6 | Ar-2 | Ar-3 |
| Ar-1 | Ar-6 | Ar-2 | Ar-4 |
| Ar-1 | Ar-6 | Ar-2 | Ar-5 |
| Ar-1 | Ar-6 | Ar-2 | Ar-6 |

TABLE 1-4

| R1 | R3 | R4 | R6 |
|---|---|---|---|
| Ar-1 | Ar-6 | Ar-3 | Ar-2 |
| Ar-1 | Ar-6 | Ar-3 | Ar-3 |
| Ar-1 | Ar-6 | Ar-3 | Ar-4 |
| Ar-1 | Ar-6 | Ar-3 | Ar-5 |
| Ar-1 | Ar-6 | Ar-3 | Ar-6 |
| Ar-1 | Ar-6 | Ar-4 | Ar-2 |
| Ar-1 | Ar-6 | Ar-4 | Ar-3 |
| Ar-1 | Ar-6 | Ar-4 | Ar-4 |
| Ar-1 | Ar-6 | Ar-4 | Ar-5 |
| Ar-1 | Ar-6 | Ar-4 | Ar-6 |
| Ar-1 | Ar-6 | Ar-5 | Ar-2 |
| Ar-1 | Ar-6 | Ar-5 | Ar-3 |
| Ar-1 | Ar-6 | Ar-5 | Ar-4 |
| Ar-1 | Ar-6 | Ar-5 | Ar-5 |
| Ar-1 | Ar-6 | Ar-5 | Ar-6 |
| Ar-1 | Ar-6 | Ar-6 | Ar-1 |
| Ar-1 | Ar-6 | Ar-6 | Ar-2 |
| Ar-1 | Ar-6 | Ar-6 | Ar-3 |
| Ar-1 | Ar-6 | Ar-6 | Ar-4 |

TABLE 1-4-continued

| R1 | R3 | R4 | R6 |
|---|---|---|---|
| Ar-1 | Ar-6 | Ar-6 | Ar-5 |
| Ar-1 | Ar-6 | Ar-6 | Ar-6 |
| Ar-2 | Ar-1 | Ar-1 | Ar-2 |
| Ar-2 | Ar-1 | Ar-1 | Ar-3 |
| Ar-2 | Ar-1 | Ar-1 | Ar-4 |
| Ar-2 | Ar-1 | Ar-1 | Ar-5 |
| Ar-2 | Ar-1 | Ar-1 | Ar-6 |
| Ar-2 | Ar-1 | Ar-2 | Ar-2 |
| Ar-2 | Ar-1 | Ar-2 | Ar-3 |
| Ar-2 | Ar-1 | Ar-2 | Ar-4 |
| Ar-2 | Ar-1 | Ar-2 | Ar-5 |
| Ar-2 | Ar-1 | Ar-2 | Ar-6 |
| Ar-2 | Ar-1 | Ar-3 | Ar-2 |
| Ar-2 | Ar-1 | Ar-3 | Ar-3 |
| Ar-2 | Ar-1 | Ar-3 | Ar-4 |
| Ar-2 | Ar-1 | Ar-3 | Ar-5 |
| Ar-2 | Ar-1 | Ar-3 | Ar-6 |
| Ar-2 | Ar-1 | Ar-4 | Ar-2 |
| Ar-2 | Ar-1 | Ar-4 | Ar-3 |
| Ar-2 | Ar-1 | Ar-4 | Ar-4 |
| Ar-2 | Ar-1 | Ar-4 | Ar-5 |
| Ar-2 | Ar-1 | Ar-4 | Ar-6 |
| Ar-2 | Ar-1 | Ar-5 | Ar-2 |
| Ar-2 | Ar-1 | Ar-5 | Ar-3 |
| Ar-2 | Ar-1 | Ar-5 | Ar-4 |
| Ar-2 | Ar-1 | Ar-5 | Ar-5 |
| Ar-2 | Ar-1 | Ar-5 | Ar-6 |
| Ar-2 | Ar-1 | Ar-6 | Ar-2 |
| Ar-2 | Ar-1 | Ar-6 | Ar-3 |
| Ar-2 | Ar-1 | Ar-6 | Ar-4 |
| Ar-2 | Ar-1 | Ar-6 | Ar-5 |
| Ar-2 | Ar-1 | Ar-6 | Ar-6 |
| Ar-2 | Ar-2 | Ar-1 | Ar-3 |
| Ar-2 | Ar-2 | Ar-1 | Ar-4 |
| Ar-2 | Ar-2 | Ar-1 | Ar-5 |
| Ar-2 | Ar-2 | Ar-1 | Ar-6 |
| Ar-2 | Ar-2 | Ar-2 | Ar-2 |
| Ar-2 | Ar-2 | Ar-2 | Ar-3 |
| Ar-2 | Ar-2 | Ar-2 | Ar-4 |
| Ar-2 | Ar-2 | Ar-2 | Ar-5 |
| Ar-2 | Ar-2 | Ar-2 | Ar-6 |

TABLE 1-5

| R1 | R3 | R4 | R6 |
|---|---|---|---|
| Ar-2 | Ar-2 | Ar-3 | Ar-2 |
| Ar-2 | Ar-2 | Ar-3 | Ar-3 |
| Ar-2 | Ar-2 | Ar-3 | Ar-4 |
| Ar-2 | Ar-2 | Ar-3 | Ar-5 |
| Ar-2 | Ar-2 | Ar-3 | Ar-6 |
| Ar-2 | Ar-2 | Ar-4 | Ar-2 |
| Ar-2 | Ar-2 | Ar-4 | Ar-3 |
| Ar-2 | Ar-2 | Ar-4 | Ar-4 |
| Ar-2 | Ar-2 | Ar-4 | Ar-5 |
| Ar-2 | Ar-2 | Ar-4 | Ar-6 |
| Ar-2 | Ar-2 | Ar-5 | Ar-2 |
| Ar-2 | Ar-2 | Ar-5 | Ar-3 |
| Ar-2 | Ar-2 | Ar-5 | Ar-4 |
| Ar-2 | Ar-2 | Ar-5 | Ar-5 |
| Ar-2 | Ar-2 | Ar-5 | Ar-6 |
| Ar-2 | Ar-2 | Ar-6 | Ar-2 |
| Ar-2 | Ar-2 | Ar-6 | Ar-3 |
| Ar-2 | Ar-2 | Ar-6 | Ar-4 |
| Ar-2 | Ar-2 | Ar-6 | Ar-5 |
| Ar-2 | Ar-2 | Ar-6 | Ar-6 |
| Ar-2 | Ar-3 | Ar-1 | Ar-3 |
| Ar-2 | Ar-3 | Ar-1 | Ar-4 |
| Ar-2 | Ar-3 | Ar-1 | Ar-5 |
| Ar-2 | Ar-3 | Ar-1 | Ar-6 |
| Ar-2 | Ar-3 | Ar-2 | Ar-3 |
| Ar-2 | Ar-3 | Ar-2 | Ar-4 |
| Ar-2 | Ar-3 | Ar-2 | Ar-5 |
| Ar-2 | Ar-3 | Ar-2 | Ar-6 |
| Ar-2 | Ar-3 | Ar-3 | Ar-2 |

TABLE 1-5-continued

| R1 | R3 | R4 | R6 |
|---|---|---|---|
| Ar-2 | Ar-3 | Ar-3 | Ar-3 |
| Ar-2 | Ar-3 | Ar-3 | Ar-4 |
| Ar-2 | Ar-3 | Ar-3 | Ar-5 |
| Ar-2 | Ar-3 | Ar-3 | Ar-6 |
| Ar-2 | Ar-3 | Ar-4 | Ar-2 |
| Ar-2 | Ar-3 | Ar-4 | Ar-3 |
| Ar-2 | Ar-3 | Ar-4 | Ar-4 |
| Ar-2 | Ar-3 | Ar-4 | Ar-5 |
| Ar-2 | Ar-3 | Ar-4 | Ar-6 |
| Ar-2 | Ar-3 | Ar-5 | Ar-2 |
| Ar-2 | Ar-3 | Ar-5 | Ar-3 |
| Ar-2 | Ar-3 | Ar-5 | Ar-4 |
| Ar-2 | Ar-3 | Ar-5 | Ar-5 |
| Ar-2 | Ar-3 | Ar-5 | Ar-6 |
| Ar-2 | Ar-3 | Ar-6 | Ar-2 |
| Ar-2 | Ar-3 | Ar-6 | Ar-3 |
| Ar-2 | Ar-3 | Ar-6 | Ar-4 |
| Ar-2 | Ar-3 | Ar-6 | Ar-5 |
| Ar-2 | Ar-3 | Ar-6 | Ar-6 |
| Ar-2 | Ar-4 | Ar-1 | Ar-3 |
| Ar-2 | Ar-4 | Ar-1 | Ar-4 |
| Ar-2 | Ar-4 | Ar-1 | Ar-5 |
| Ar-2 | Ar-4 | Ar-1 | Ar-6 |
| Ar-2 | Ar-4 | Ar-2 | Ar-3 |
| Ar-2 | Ar-4 | Ar-2 | Ar-4 |
| Ar-2 | Ar-4 | Ar-2 | Ar-5 |
| Ar-2 | Ar-4 | Ar-2 | Ar-6 |
| Ar-2 | Ar-4 | Ar-3 | Ar-3 |
| Ar-2 | Ar-4 | Ar-3 | Ar-4 |
| Ar-2 | Ar-4 | Ar-3 | Ar-5 |
| Ar-2 | Ar-4 | Ar-3 | Ar-6 |

TABLE 1-6

| R1 | R3 | R4 | R6 |
|---|---|---|---|
| Ar-2 | Ar-4 | Ar-4 | Ar-2 |
| Ar-2 | Ar-4 | Ar-4 | Ar-3 |
| Ar-2 | Ar-4 | Ar-4 | Ar-4 |
| Ar-2 | Ar-4 | Ar-4 | Ar-5 |
| Ar-2 | Ar-4 | Ar-4 | Ar-6 |
| Ar-2 | Ar-4 | Ar-5 | Ar-2 |
| Ar-2 | Ar-4 | Ar-5 | Ar-3 |
| Ar-2 | Ar-4 | Ar-5 | Ar-4 |
| Ar-2 | Ar-4 | Ar-5 | Ar-5 |
| Ar-2 | Ar-4 | Ar-5 | Ar-6 |
| Ar-2 | Ar-4 | Ar-6 | Ar-2 |
| Ar-2 | Ar-4 | Ar-6 | Ar-3 |
| Ar-2 | Ar-4 | Ar-6 | Ar-4 |
| Ar-2 | Ar-4 | Ar-6 | Ar-5 |
| Ar-2 | Ar-4 | Ar-6 | Ar-6 |
| Ar-2 | Ar-5 | Ar-1 | Ar-3 |
| Ar-2 | Ar-5 | Ar-1 | Ar-4 |
| Ar-2 | Ar-5 | Ar-1 | Ar-5 |
| Ar-2 | Ar-5 | Ar-1 | Ar-6 |
| Ar-2 | Ar-5 | Ar-2 | Ar-3 |
| Ar-2 | Ar-5 | Ar-2 | Ar-4 |
| Ar-2 | Ar-5 | Ar-2 | Ar-5 |
| Ar-2 | Ar-5 | Ar-2 | Ar-6 |
| Ar-2 | Ar-5 | Ar-3 | Ar-3 |
| Ar-2 | Ar-5 | Ar-3 | Ar-4 |
| Ar-2 | Ar-5 | Ar-3 | Ar-5 |
| Ar-2 | Ar-5 | Ar-3 | Ar-6 |
| Ar-2 | Ar-5 | Ar-4 | Ar-3 |
| Ar-2 | Ar-5 | Ar-4 | Ar-4 |
| Ar-2 | Ar-5 | Ar-4 | Ar-5 |
| Ar-2 | Ar-5 | Ar-4 | Ar-6 |
| Ar-2 | Ar-5 | Ar-5 | Ar-2 |
| Ar-2 | Ar-5 | Ar-5 | Ar-3 |
| Ar-2 | Ar-5 | Ar-5 | Ar-4 |
| Ar-2 | Ar-5 | Ar-5 | Ar-5 |
| Ar-2 | Ar-5 | Ar-5 | Ar-6 |
| Ar-2 | Ar-5 | Ar-6 | Ar-2 |
| Ar-2 | Ar-5 | Ar-6 | Ar-3 |
| Ar-2 | Ar-5 | Ar-6 | Ar-4 |

TABLE 1-6-continued

| R1 | R3 | R4 | R6 |
|---|---|---|---|
| Ar-2 | Ar-5 | Ar-6 | Ar-5 |
| Ar-2 | Ar-5 | Ar-6 | Ar-6 |
| Ar-2 | Ar-6 | Ar-1 | Ar-3 |
| Ar-2 | Ar-6 | Ar-1 | Ar-4 |
| Ar-2 | Ar-6 | Ar-1 | Ar-5 |
| Ar-2 | Ar-6 | Ar-1 | Ar-6 |
| Ar-2 | Ar-6 | Ar-2 | Ar-3 |
| Ar-2 | Ar-6 | Ar-2 | Ar-4 |
| Ar-2 | Ar-6 | Ar-2 | Ar-5 |
| Ar-2 | Ar-6 | Ar-2 | Ar-6 |
| Ar-2 | Ar-6 | Ar-3 | Ar-3 |
| Ar-2 | Ar-6 | Ar-3 | Ar-4 |
| Ar-2 | Ar-6 | Ar-3 | Ar-5 |
| Ar-2 | Ar-6 | Ar-3 | Ar-6 |
| Ar-2 | Ar-6 | Ar-4 | Ar-3 |
| Ar-2 | Ar-6 | Ar-4 | Ar-4 |
| Ar-2 | Ar-6 | Ar-4 | Ar-5 |
| Ar-2 | Ar-6 | Ar-4 | Ar-6 |
| Ar-2 | Ar-6 | Ar-5 | Ar-3 |
| Ar-2 | Ar-6 | Ar-5 | Ar-4 |
| Ar-2 | Ar-6 | Ar-5 | Ar-5 |
| Ar-2 | Ar-6 | Ar-5 | Ar-6 |

TABLE 1-7

| R1 | R3 | R4 | R6 |
|---|---|---|---|
| Ar-2 | Ar-6 | Ar-6 | Ar-2 |
| Ar-2 | Ar-6 | Ar-6 | Ar-3 |
| Ar-2 | Ar-6 | Ar-6 | Ar-4 |
| Ar-2 | Ar-6 | Ar-6 | Ar-5 |
| Ar-2 | Ar-6 | Ar-6 | Ar-6 |
| Ar-3 | Ar-1 | Ar-1 | Ar-3 |
| Ar-3 | Ar-1 | Ar-1 | Ar-4 |
| Ar-3 | Ar-1 | Ar-1 | Ar-5 |
| Ar-3 | Ar-1 | Ar-1 | Ar-6 |
| Ar-3 | Ar-1 | Ar-2 | Ar-3 |
| Ar-3 | Ar-1 | Ar-2 | Ar-4 |
| Ar-3 | Ar-1 | Ar-2 | Ar-5 |
| Ar-3 | Ar-1 | Ar-2 | Ar-6 |
| Ar-3 | Ar-1 | Ar-3 | Ar-3 |
| Ar-3 | Ar-1 | Ar-3 | Ar-4 |
| Ar-3 | Ar-1 | Ar-3 | Ar-5 |
| Ar-3 | Ar-1 | Ar-3 | Ar-6 |
| Ar-3 | Ar-1 | Ar-4 | Ar-3 |
| Ar-3 | Ar-1 | Ar-4 | Ar-4 |
| Ar-3 | Ar-1 | Ar-4 | Ar-5 |
| Ar-3 | Ar-1 | Ar-4 | Ar-6 |
| Ar-3 | Ar-1 | Ar-5 | Ar-3 |
| Ar-3 | Ar-1 | Ar-5 | Ar-4 |
| Ar-3 | Ar-1 | Ar-5 | Ar-5 |
| Ar-3 | Ar-1 | Ar-5 | Ar-6 |
| Ar-3 | Ar-1 | Ar-6 | Ar-3 |
| Ar-3 | Ar-1 | Ar-6 | Ar-4 |
| Ar-3 | Ar-1 | Ar-6 | Ar-5 |
| Ar-3 | Ar-1 | Ar-6 | Ar-6 |
| Ar-3 | Ar-2 | Ar-1 | Ar-4 |
| Ar-3 | Ar-2 | Ar-1 | Ar-5 |
| Ar-3 | Ar-2 | Ar-1 | Ar-6 |
| Ar-3 | Ar-2 | Ar-2 | Ar-3 |
| Ar-3 | Ar-2 | Ar-2 | Ar-4 |
| Ar-3 | Ar-2 | Ar-2 | Ar-5 |
| Ar-3 | Ar-2 | Ar-2 | Ar-6 |
| Ar-3 | Ar-2 | Ar-3 | Ar-3 |
| Ar-3 | Ar-2 | Ar-3 | Ar-4 |
| Ar-3 | Ar-2 | Ar-3 | Ar-5 |
| Ar-3 | Ar-2 | Ar-3 | Ar-6 |
| Ar-3 | Ar-2 | Ar-4 | Ar-3 |
| Ar-3 | Ar-2 | Ar-4 | Ar-4 |
| Ar-3 | Ar-2 | Ar-4 | Ar-5 |
| Ar-3 | Ar-2 | Ar-4 | Ar-6 |
| Ar-3 | Ar-2 | Ar-5 | Ar-3 |
| Ar-3 | Ar-2 | Ar-5 | Ar-4 |
| Ar-3 | Ar-2 | Ar-5 | Ar-5 |
| Ar-3 | Ar-2 | Ar-5 | Ar-6 |

TABLE 1-7-continued

| R1 | R3 | R4 | R6 |
| --- | --- | --- | --- |
| Ar-3 | Ar-2 | Ar-6 | Ar-3 |
| Ar-3 | Ar-2 | Ar-6 | Ar-4 |
| Ar-3 | Ar-2 | Ar-6 | Ar-5 |
| Ar-3 | Ar-2 | Ar-6 | Ar-6 |
| Ar-3 | Ar-3 | Ar-1 | Ar-4 |
| Ar-3 | Ar-3 | Ar-1 | Ar-5 |
| Ar-3 | Ar-3 | Ar-1 | Ar-6 |
| Ar-3 | Ar-3 | Ar-2 | Ar-4 |
| Ar-3 | Ar-3 | Ar-2 | Ar-5 |
| Ar-3 | Ar-3 | Ar-2 | Ar-6 |
| Ar-3 | Ar-3 | Ar-3 | Ar-3 |
| Ar-3 | Ar-3 | Ar-3 | Ar-4 |
| Ar-3 | Ar-3 | Ar-3 | Ar-5 |

TABLE 1-8

| R1 | R3 | R4 | R6 |
| --- | --- | --- | --- |
| Ar-3 | Ar-3 | Ar-3 | Ar-6 |
| Ar-3 | Ar-3 | Ar-4 | Ar-3 |
| Ar-3 | Ar-3 | Ar-4 | Ar-4 |
| Ar-3 | Ar-3 | Ar-4 | Ar-5 |
| Ar-3 | Ar-3 | Ar-4 | Ar-6 |
| Ar-3 | Ar-3 | Ar-5 | Ar-3 |
| Ar-3 | Ar-3 | Ar-5 | Ar-4 |
| Ar-3 | Ar-3 | Ar-5 | Ar-5 |
| Ar-3 | Ar-3 | Ar-5 | Ar-6 |
| Ar-3 | Ar-3 | Ar-6 | Ar-3 |
| Ar-3 | Ar-3 | Ar-6 | Ar-4 |
| Ar-3 | Ar-3 | Ar-6 | Ar-5 |
| Ar-3 | Ar-3 | Ar-6 | Ar-6 |
| Ar-3 | Ar-4 | Ar-1 | Ar-4 |
| Ar-3 | Ar-4 | Ar-1 | Ar-5 |
| Ar-3 | Ar-4 | Ar-1 | Ar-6 |
| Ar-3 | Ar-4 | Ar-2 | Ar-4 |
| Ar-3 | Ar-4 | Ar-2 | Ar-5 |
| Ar-3 | Ar-4 | Ar-2 | Ar-6 |
| Ar-3 | Ar-4 | Ar-3 | Ar-4 |
| Ar-3 | Ar-4 | Ar-3 | Ar-5 |
| Ar-3 | Ar-4 | Ar-3 | Ar-6 |
| Ar-3 | Ar-4 | Ar-4 | Ar-3 |
| Ar-3 | Ar-4 | Ar-4 | Ar-4 |
| Ar-3 | Ar-4 | Ar-4 | Ar-5 |
| Ar-3 | Ar-4 | Ar-4 | Ar-6 |
| Ar-3 | Ar-4 | Ar-5 | Ar-3 |
| Ar-3 | Ar-4 | Ar-5 | Ar-4 |
| Ar-3 | Ar-4 | Ar-5 | Ar-5 |
| Ar-3 | Ar-4 | Ar-5 | Ar-6 |
| Ar-3 | Ar-4 | Ar-6 | Ar-3 |
| Ar-3 | Ar-4 | Ar-6 | Ar-4 |
| Ar-3 | Ar-4 | Ar-6 | Ar-5 |
| Ar-3 | Ar-4 | Ar-6 | Ar-6 |
| Ar-3 | Ar-5 | Ar-1 | Ar-4 |
| Ar-3 | Ar-5 | Ar-1 | Ar-5 |
| Ar-3 | Ar-5 | Ar-1 | Ar-6 |
| Ar-3 | Ar-5 | Ar-2 | Ar-4 |
| Ar-3 | Ar-5 | Ar-2 | Ar-5 |
| Ar-3 | Ar-5 | Ar-2 | Ar-6 |
| Ar-3 | Ar-5 | Ar-3 | Ar-4 |
| Ar-3 | Ar-5 | Ar-3 | Ar-5 |
| Ar-3 | Ar-5 | Ar-3 | Ar-6 |
| Ar-3 | Ar-5 | Ar-4 | Ar-4 |
| Ar-3 | Ar-5 | Ar-4 | Ar-5 |
| Ar-3 | Ar-5 | Ar-4 | Ar-6 |
| Ar-3 | Ar-5 | Ar-5 | Ar-3 |
| Ar-3 | Ar-5 | Ar-5 | Ar-4 |
| Ar-3 | Ar-5 | Ar-5 | Ar-5 |
| Ar-3 | Ar-5 | Ar-5 | Ar-6 |
| Ar-3 | Ar-5 | Ar-6 | Ar-3 |
| Ar-3 | Ar-5 | Ar-6 | Ar-4 |
| Ar-3 | Ar-5 | Ar-6 | Ar-5 |
| Ar-3 | Ar-5 | Ar-6 | Ar-6 |
| Ar-3 | Ar-6 | Ar-1 | Ar-4 |
| Ar-3 | Ar-6 | Ar-1 | Ar-5 |
| Ar-3 | Ar-6 | Ar-1 | Ar-6 |

TABLE 1-8-continued

| R1 | R3 | R4 | R6 |
| --- | --- | --- | --- |
| Ar-3 | Ar-6 | Ar-2 | Ar-4 |
| Ar-3 | Ar-6 | Ar-2 | Ar-5 |
| Ar-3 | Ar-6 | Ar-2 | Ar-6 |

TABLE 1-9

| R1 | R3 | R4 | R6 |
| --- | --- | --- | --- |
| Ar-3 | Ar-6 | Ar-3 | Ar-4 |
| Ar-3 | Ar-6 | Ar-3 | Ar-5 |
| Ar-3 | Ar-6 | Ar-3 | Ar-6 |
| Ar-3 | Ar-6 | Ar-4 | Ar-4 |
| Ar-3 | Ar-6 | Ar-4 | Ar-5 |
| Ar-3 | Ar-6 | Ar-4 | Ar-6 |
| Ar-3 | Ar-6 | Ar-5 | Ar-4 |
| Ar-3 | Ar-6 | Ar-5 | Ar-5 |
| Ar-3 | Ar-6 | Ar-5 | Ar-6 |
| Ar-3 | Ar-6 | Ar-6 | Ar-3 |
| Ar-3 | Ar-6 | Ar-6 | Ar-4 |
| Ar-3 | Ar-6 | Ar-6 | Ar-5 |
| Ar-3 | Ar-6 | Ar-6 | Ar-6 |
| Ar-4 | Ar-1 | Ar-1 | Ar-4 |
| Ar-4 | Ar-1 | Ar-1 | Ar-5 |
| Ar-4 | Ar-1 | Ar-1 | Ar-6 |
| Ar-4 | Ar-1 | Ar-2 | Ar-4 |
| Ar-4 | Ar-1 | Ar-2 | Ar-5 |
| Ar-4 | Ar-1 | Ar-2 | Ar-6 |
| Ar-4 | Ar-1 | Ar-3 | Ar-4 |
| Ar-4 | Ar-1 | Ar-3 | Ar-5 |
| Ar-4 | Ar-1 | Ar-3 | Ar-6 |
| Ar-4 | Ar-1 | Ar-4 | Ar-4 |
| Ar-4 | Ar-1 | Ar-4 | Ar-5 |
| Ar-4 | Ar-1 | Ar-4 | Ar-6 |
| Ar-4 | Ar-1 | Ar-5 | Ar-4 |
| Ar-4 | Ar-1 | Ar-5 | Ar-5 |
| Ar-4 | Ar-1 | Ar-5 | Ar-6 |
| Ar-4 | Ar-1 | Ar-6 | Ar-4 |
| Ar-4 | Ar-1 | Ar-6 | Ar-5 |
| Ar-4 | Ar-1 | Ar-6 | Ar-6 |
| Ar-4 | Ar-2 | Ar-1 | Ar-5 |
| Ar-4 | Ar-2 | Ar-1 | Ar-6 |
| Ar-4 | Ar-2 | Ar-2 | Ar-4 |
| Ar-4 | Ar-2 | Ar-2 | Ar-5 |
| Ar-4 | Ar-2 | Ar-2 | Ar-6 |
| Ar-4 | Ar-2 | Ar-3 | Ar-4 |
| Ar-4 | Ar-2 | Ar-3 | Ar-5 |
| Ar-4 | Ar-2 | Ar-3 | Ar-6 |
| Ar-4 | Ar-2 | Ar-4 | Ar-4 |
| Ar-4 | Ar-2 | Ar-4 | Ar-5 |
| Ar-4 | Ar-2 | Ar-4 | Ar-6 |
| Ar-4 | Ar-2 | Ar-5 | Ar-4 |
| Ar-4 | Ar-2 | Ar-5 | Ar-5 |
| Ar-4 | Ar-2 | Ar-5 | Ar-6 |
| Ar-4 | Ar-2 | Ar-6 | Ar-4 |
| Ar-4 | Ar-2 | Ar-6 | Ar-5 |
| Ar-4 | Ar-2 | Ar-6 | Ar-6 |
| Ar-4 | Ar-3 | Ar-1 | Ar-5 |
| Ar-4 | Ar-3 | Ar-1 | Ar-6 |
| Ar-4 | Ar-3 | Ar-2 | Ar-5 |
| Ar-4 | Ar-3 | Ar-2 | Ar-6 |
| Ar-4 | Ar-3 | Ar-3 | Ar-4 |
| Ar-4 | Ar-3 | Ar-3 | Ar-5 |
| Ar-4 | Ar-3 | Ar-3 | Ar-6 |
| Ar-4 | Ar-3 | Ar-4 | Ar-4 |
| Ar-4 | Ar-3 | Ar-4 | Ar-5 |
| Ar-4 | Ar-3 | Ar-4 | Ar-6 |
| Ar-4 | Ar-3 | Ar-5 | Ar-4 |
| Ar-4 | Ar-3 | Ar-5 | Ar-5 |
| Ar-4 | Ar-3 | Ar-5 | Ar-6 |

TABLE 1-10

| R1 | R3 | R4 | R6 |
|---|---|---|---|
| Ar-4 | Ar-3 | Ar-6 | Ar-4 |
| Ar-4 | Ar-3 | Ar-6 | Ar-5 |
| Ar-4 | Ar-3 | Ar-6 | Ar-6 |
| Ar-4 | Ar-4 | Ar-1 | Ar-5 |
| Ar-4 | Ar-4 | Ar-1 | Ar-6 |
| Ar-4 | Ar-4 | Ar-2 | Ar-5 |
| Ar-4 | Ar-4 | Ar-2 | Ar-6 |
| Ar-4 | Ar-4 | Ar-3 | Ar-5 |
| Ar-4 | Ar-4 | Ar-3 | Ar-6 |
| Ar-4 | Ar-4 | Ar-4 | Ar-4 |
| Ar-4 | Ar-4 | Ar-4 | Ar-5 |
| Ar-4 | Ar-4 | Ar-4 | Ar-6 |
| Ar-4 | Ar-4 | Ar-5 | Ar-4 |
| Ar-4 | Ar-4 | Ar-5 | Ar-5 |
| Ar-4 | Ar-4 | Ar-5 | Ar-6 |
| Ar-4 | Ar-4 | Ar-6 | Ar-4 |
| Ar-4 | Ar-4 | Ar-6 | Ar-5 |
| Ar-4 | Ar-4 | Ar-6 | Ar-6 |
| Ar-4 | Ar-5 | Ar-1 | Ar-5 |
| Ar-4 | Ar-5 | Ar-1 | Ar-6 |
| Ar-4 | Ar-5 | Ar-2 | Ar-5 |
| Ar-4 | Ar-5 | Ar-2 | Ar-6 |
| Ar-4 | Ar-5 | Ar-3 | Ar-5 |
| Ar-4 | Ar-5 | Ar-3 | Ar-6 |
| Ar-4 | Ar-5 | Ar-4 | Ar-5 |
| Ar-4 | Ar-5 | Ar-4 | Ar-6 |
| Ar-4 | Ar-5 | Ar-5 | Ar-4 |
| Ar-4 | Ar-5 | Ar-5 | Ar-5 |
| Ar-4 | Ar-5 | Ar-5 | Ar-6 |
| Ar-4 | Ar-5 | Ar-6 | Ar-4 |
| Ar-4 | Ar-5 | Ar-6 | Ar-5 |
| Ar-4 | Ar-5 | Ar-6 | Ar-6 |
| Ar-4 | Ar-6 | Ar-1 | Ar-5 |
| Ar-4 | Ar-6 | Ar-1 | Ar-6 |
| Ar-4 | Ar-6 | Ar-2 | Ar-5 |
| Ar-4 | Ar-6 | Ar-2 | Ar-6 |
| Ar-4 | Ar-6 | Ar-3 | Ar-5 |
| Ar-4 | Ar-6 | Ar-3 | Ar-6 |
| Ar-4 | Ar-6 | Ar-4 | Ar-5 |
| Ar-4 | Ar-6 | Ar-4 | Ar-6 |
| Ar-4 | Ar-6 | Ar-5 | Ar-5 |
| Ar-4 | Ar-6 | Ar-5 | Ar-6 |
| Ar-4 | Ar-6 | Ar-6 | Ar-4 |
| Ar-4 | Ar-6 | Ar-6 | Ar-5 |
| Ar-4 | Ar-6 | Ar-6 | Ar-6 |
| Ar-5 | Ar-1 | Ar-1 | Ar-5 |
| Ar-5 | Ar-1 | Ar-1 | Ar-6 |
| Ar-5 | Ar-1 | Ar-2 | Ar-5 |
| Ar-5 | Ar-1 | Ar-2 | Ar-6 |
| Ar-5 | Ar-1 | Ar-3 | Ar-5 |
| Ar-5 | Ar-1 | Ar-3 | Ar-6 |
| Ar-5 | Ar-1 | Ar-4 | Ar-5 |
| Ar-5 | Ar-1 | Ar-4 | Ar-6 |
| Ar-5 | Ar-1 | Ar-5 | Ar-5 |
| Ar-5 | Ar-1 | Ar-5 | Ar-6 |
| Ar-5 | Ar-1 | Ar-6 | Ar-5 |
| Ar-5 | Ar-1 | Ar-6 | Ar-6 |
| Ar-5 | Ar-2 | Ar-1 | Ar-6 |
| Ar-5 | Ar-2 | Ar-2 | Ar-5 |
| Ar-5 | Ar-2 | Ar-2 | Ar-6 |
| Ar-5 | Ar-2 | Ar-3 | Ar-5 |
| Ar-5 | Ar-2 | Ar-3 | Ar-6 |

TABLE 1-11

| R1 | R3 | R4 | R6 |
|---|---|---|---|
| Ar-5 | Ar-2 | Ar-4 | Ar-5 |
| Ar-5 | Ar-2 | Ar-4 | Ar-6 |
| Ar-5 | Ar-2 | Ar-5 | Ar-5 |
| Ar-5 | Ar-2 | Ar-5 | Ar-6 |
| Ar-5 | Ar-2 | Ar-6 | Ar-5 |
| Ar-5 | Ar-2 | Ar-6 | Ar-6 |
| Ar-5 | Ar-3 | Ar-1 | Ar-6 |
| Ar-5 | Ar-3 | Ar-2 | Ar-6 |
| Ar-5 | Ar-3 | Ar-3 | Ar-5 |
| Ar-5 | Ar-3 | Ar-3 | Ar-6 |
| Ar-5 | Ar-3 | Ar-4 | Ar-5 |
| Ar-5 | Ar-3 | Ar-4 | Ar-6 |
| Ar-5 | Ar-3 | Ar-5 | Ar-5 |
| Ar-5 | Ar-3 | Ar-5 | Ar-6 |
| Ar-5 | Ar-3 | Ar-6 | Ar-5 |
| Ar-5 | Ar-3 | Ar-6 | Ar-6 |
| Ar-5 | Ar-4 | Ar-1 | Ar-6 |
| Ar-5 | Ar-4 | Ar-2 | Ar-6 |
| Ar-5 | Ar-4 | Ar-3 | Ar-6 |
| Ar-5 | Ar-4 | Ar-4 | Ar-5 |
| Ar-5 | Ar-4 | Ar-4 | Ar-6 |
| Ar-5 | Ar-4 | Ar-5 | Ar-5 |
| Ar-5 | Ar-4 | Ar-5 | Ar-6 |
| Ar-5 | Ar-4 | Ar-6 | Ar-5 |
| Ar-5 | Ar-4 | Ar-6 | Ar-6 |
| Ar-5 | Ar-5 | Ar-1 | Ar-6 |
| Ar-5 | Ar-5 | Ar-2 | Ar-6 |
| Ar-5 | Ar-5 | Ar-3 | Ar-6 |
| Ar-5 | Ar-5 | Ar-4 | Ar-6 |
| Ar-5 | Ar-5 | Ar-5 | Ar-5 |
| Ar-5 | Ar-5 | Ar-5 | Ar-6 |
| Ar-5 | Ar-5 | Ar-6 | Ar-5 |
| Ar-5 | Ar-5 | Ar-6 | Ar-6 |
| Ar-5 | Ar-6 | Ar-1 | Ar-6 |
| Ar-5 | Ar-6 | Ar-2 | Ar-6 |
| Ar-5 | Ar-6 | Ar-3 | Ar-6 |
| Ar-5 | Ar-6 | Ar-4 | Ar-6 |
| Ar-5 | Ar-6 | Ar-5 | Ar-6 |
| Ar-5 | Ar-6 | Ar-6 | Ar-5 |
| Ar-5 | Ar-6 | Ar-6 | Ar-6 |
| Ar-6 | Ar-1 | Ar-1 | Ar-6 |
| Ar-6 | Ar-1 | Ar-2 | Ar-6 |
| Ar-6 | Ar-1 | Ar-3 | Ar-6 |
| Ar-6 | Ar-1 | Ar-4 | Ar-6 |
| Ar-6 | Ar-1 | Ar-5 | Ar-6 |
| Ar-6 | Ar-1 | Ar-6 | Ar-6 |
| Ar-6 | Ar-2 | Ar-2 | Ar-6 |
| Ar-6 | Ar-2 | Ar-3 | Ar-6 |
| Ar-6 | Ar-2 | Ar-4 | Ar-6 |
| Ar-6 | Ar-2 | Ar-5 | Ar-6 |
| Ar-6 | Ar-2 | Ar-6 | Ar-6 |
| Ar-6 | Ar-3 | Ar-3 | Ar-6 |
| Ar-6 | Ar-3 | Ar-4 | Ar-6 |
| Ar-6 | Ar-3 | Ar-5 | Ar-6 |
| Ar-6 | Ar-3 | Ar-6 | Ar-6 |
| Ar-6 | Ar-4 | Ar-4 | Ar-6 |
| Ar-6 | Ar-4 | Ar-5 | Ar-6 |
| Ar-6 | Ar-4 | Ar-6 | Ar-6 |
| Ar-6 | Ar-5 | Ar-5 | Ar-6 |
| Ar-6 | Ar-5 | Ar-6 | Ar-6 |
| Ar-6 | Ar-6 | Ar-6 | Ar-6 |

$R^2$ and $R^5$ are preferably any of hydrogen, an alkyl group, a carbonyl group, an oxycarbonyl group, and an aryl group. Among these groups, hydrogen and an alkyl group are preferred from the viewpoint of thermal stability, and hydrogen is more preferred because hydrogen allows a narrower full width at half maximum in the emission spectrum to be more easily achieved.

$R^5$ and $R^9$ are preferably any of an alkyl group, an aryl group, a heteroaryl group, fluorine, a fluorine-containing alkyl group, a fluorine-containing heteroaryl group, and a fluorine-containing aryl group. Among these groups, $R^8$ and $R^9$ are more preferably fluorine or a fluorine-containing aryl group because fluorine and a fluorine-containing aryl group are stable against excitation light and lead to a higher luminescence quantum yield. Furthermore, from the viewpoint of the ease of synthesis, $R^8$ and $R^9$ are still more preferably fluorine.

The fluorine-containing aryl group is an aryl group containing fluorine. Examples of the fluorine-containing aryl group include a fluorophenyl group, a trifluoromethylphenyl group, and a pentafluorophenyl group. The fluorine-containing heteroaryl group is a heteroaryl group containing fluorine. Examples of the fluorine-containing heteroaryl group include a fluoropyridyl group, a trifluoromethylpyridyl group, and a trifluoropyridyl group. The fluorine-containing alkyl group is an alkyl group containing fluorine. Examples of the fluorine-containing alkyl group include a trifluoromethyl group and a pentafluoroethyl group.

In Formula (1), X is preferably C—$R^7$ from the viewpoint of light stability. When X is C—$R^7$, the substituent $R^7$ has a great influence on the durability of the compound of Formula (1), that is, a temporal decrease in the light emission intensity of this compound. Specifically, when $R^7$ is hydrogen, because of the high reactivity of the hydrogen, the hydrogen easily reacts with water and oxygen contained in the air. This reaction causes the decomposition of the compound of Formula (1). When $R^7$ is a substituent having a large degree of freedom of motion of a molecular chain, such as an alkyl group, the reactivity actually decreases while the aggregation of compounds in a composition proceeds with the lapse of time, and, as a result, a decrease in light emission intensity is caused by concentration quenching. Thus, $R^7$ is preferably a group that is rigid, has a small degree of freedom of motion, and is unlikely to cause aggregation. Specifically, $R^7$ is preferably any of a substituted or unsubstituted aryl group and a substituted or unsubstituted heteroaryl group.

From the viewpoints of offering a higher luminescence quantum yield and causing less thermal decomposition and the viewpoint of light stability, X is preferably C—$R^7$, and $R^7$ is preferably a substituted or unsubstituted aryl group. From the viewpoint of not impairing a light emission wavelength, a phenyl group, a biphenyl group, a terphenyl group, a naphthyl group, a fluorenyl group, a phenanthryl group, and an anthracenyl group are preferred as the aryl group.

To further enhance the light stability of the compound of Formula (1), twisting in a carbon-carbon bond between $R^7$ and a pyrromethene skeleton needs to be appropriately prevented. This is because, when an excessive twist exists, light stability decreases, for example, reactivity to excitation light increases. From these viewpoints, $R^7$ is preferably a substituted or unsubstituted phenyl group, a substituted or unsubstituted biphenyl group, a substituted or unsubstituted terphenyl group, or a substituted or unsubstituted naphthyl group, more preferably a substituted or unsubstituted phenyl group, a substituted or unsubstituted biphenyl group, or a substituted or unsubstituted terphenyl group, and particularly preferably a substituted or unsubstituted phenyl group.

In addition, $R^7$ is preferably an appropriately bulky substituent. When $R^7$ has a certain degree of bulkiness, molecules can be prevented from aggregation. As a result, the light emission efficiency and durability of the compound of Formula (1) are further enhanced.

Further preferable examples of the bulky substituent include a structure of $R^7$ in Formula (2) illustrated below. That is, in Formula (1), X is more preferably C—$R^7$, and $R^7$ is more preferably a group of Formula (2).

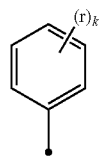

(2)

In Formula (2), r is selected from the group consisting of hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, and a phosphine oxide group. k is an integer of 1 to 3. When k is 2 or larger, r may be the same as or different from each other.

From the viewpoint of offering a higher luminescence quantum yield, r is preferably a substituted or unsubstituted aryl group. Particularly preferred examples of the aryl group include a phenyl group and a naphthyl group. When r is an aryl group, k in Formula (2) is preferably 1 or 2. From the viewpoint of more efficiently preventing aggregation of molecules, k is larger preferably 2. Furthermore, when k is 2 or larger, at least one of rs is preferably substituted with an alkyl group. From the viewpoint of thermal stability, particularly preferred examples of the alkyl group in this case include a methyl group, an ethyl group, and a tert-butyl group.

From the viewpoints of controlling fluorescence wavelength and absorption wavelength and increasing compatibility with a solvent, r is preferably a substituted or unsubstituted alkyl group, a substituted or unsubstituted alkoxy group, or halogen, and more preferably a methyl group, an ethyl group, a tert-butyl group, or a methoxy group. From the viewpoint of dispersibility, r is particularly preferably a tert-butyl group or a methoxy group. When r is a tert-butyl group or a methoxy group, quenching due to the aggregation of molecules can be more effectively prevented.

As another aspect of the compound of Formula (1), at least one of $R^1$ to $R^7$ is preferably an electron withdrawing group. In particular, it is preferred that: (1) at least one of $R^1$ to $R^6$ is an electron withdrawing group; (2) $R^7$ is an electron withdrawing group; or (3) at least one of $R^1$ to $R^6$ is an electron withdrawing group and $R^7$ is an electron withdrawing group. By thus introducing an electron withdrawing group into a pyrromethene skeleton of the above-mentioned compound, the electron density of the pyrromethene skeleton can be greatly reduced. With this reduction in electron density, the stability of the compound against oxygen is further improved, and as a result, the durability of the compound can be made higher.

The electron withdrawing group is also referred to as an electron accepting group, and is an atomic group that, in the organic electronics, attracts an electron from a substituted atomic group due to an inductive effect or a resonance effect. Examples of the electron withdrawing group include a group having a positive value as a substituent constant (σp (para)) of Hammett's Rule. The substituent constant (σp (para)) of Hammett's Rule can be cited from Kagaku Binran Kiso-Hen, 5th Edition (II, p. 380). Note that, although some phenyl groups take a positive value as described above, the electron withdrawing group does not include a phenyl group in the present invention.

Examples of the electron withdrawing group include —F (σp: +0.06), —Cl (σp: +0.23), —Br (σp: +0.23), —I (σp: +0.18), —$CO_2R^{12}$ (σp: +0.45 when $R^{12}$ is an ethyl group), —$CONH_2$ (σp: +0.38), —$COR^{12}$ (σp: +0.49 when $R^{12}$ is a methyl group), —$CF_3$ (σp: +0.50), —$SO_2R^{12}$ (σp: +0.69 when $R^{12}$ is a methyl group), and —$NO2$ (σp: +0.81). $R^{12}$s are each independently a hydrogen atom, a substituted or unsubstituted aromatic hydrocarbon group having a ring-forming carbon number of 6 to 30, a substituted or unsubstituted heterocyclic group having a ring-forming carbon number of 5 to 30, a substituted or unsubstituted $C_{1-30}$ alkyl group, or a substituted or unsubstituted $C_{1-30}$ cycloalkyl group. Specific examples of these groups include the same examples as those described above.

Preferred examples of the electron withdrawing group include fluorine, a fluorine-containing aryl group, a fluorine-containing heteroaryl group, a fluorine-containing alkyl group, a substituted or unsubstituted acyl group, a substituted or unsubstituted ester group, a substituted or unsubstituted amide group, a substituted or unsubstituted sulfonyl group, and a cyano group. This is because these groups are difficult to be chemically decomposed.

More preferred examples of the electron withdrawing group include a fluorine-containing alkyl group, a substituted or unsubstituted acyl group, a substituted or unsubstituted ester group, and a cyano group. This is because these groups lead to the effects of prevention of concentration quenching and an enhanced luminescence quantum yield. The electron withdrawing group is particularly preferably a substituted or unsubstituted ester group.

One particularly preferred example of the compound of Formula (1) is a compound in which all of $R^1$, $R^3$, $R^4$, and $R^6$ may be the same as or different from each other; $R^1$, $R^3$, $R^4$, and $R^6$ are a substituted or unsubstituted alkyl group; and X is C—$R^7$, the $R^7$ being a group of Formula (2). In this case, $R^7$ is particularly preferably a group of Formula (2) in which r is a substituted or unsubstituted phenyl group. This group is particularly preferred for the organic luminescent material (E).

Another particularly preferred example of the compound of Formula (1) is a compound in which all of $R^1$, $R^3$, $R^4$, and $R^6$ may be the same as or different from each other; $R^1$, $R^3$, $R^4$, and $R^6$ are selected from the above-mentioned Ar-1 to Ar-6; and X is C—$R^7$, the $R^7$ being a group of Formula (2). In this case, $R^7$ is more preferably a group of Formula (2) in which r is a tert-butyl group or a methoxy group. $R^7$ is particularly preferably a group of Formula (2) in which r is a methoxy group. This group is particularly preferred for the organic luminescent material (A).

Examples of the compound of Formula (1) are shown below, but the compound is not limited to these compounds.

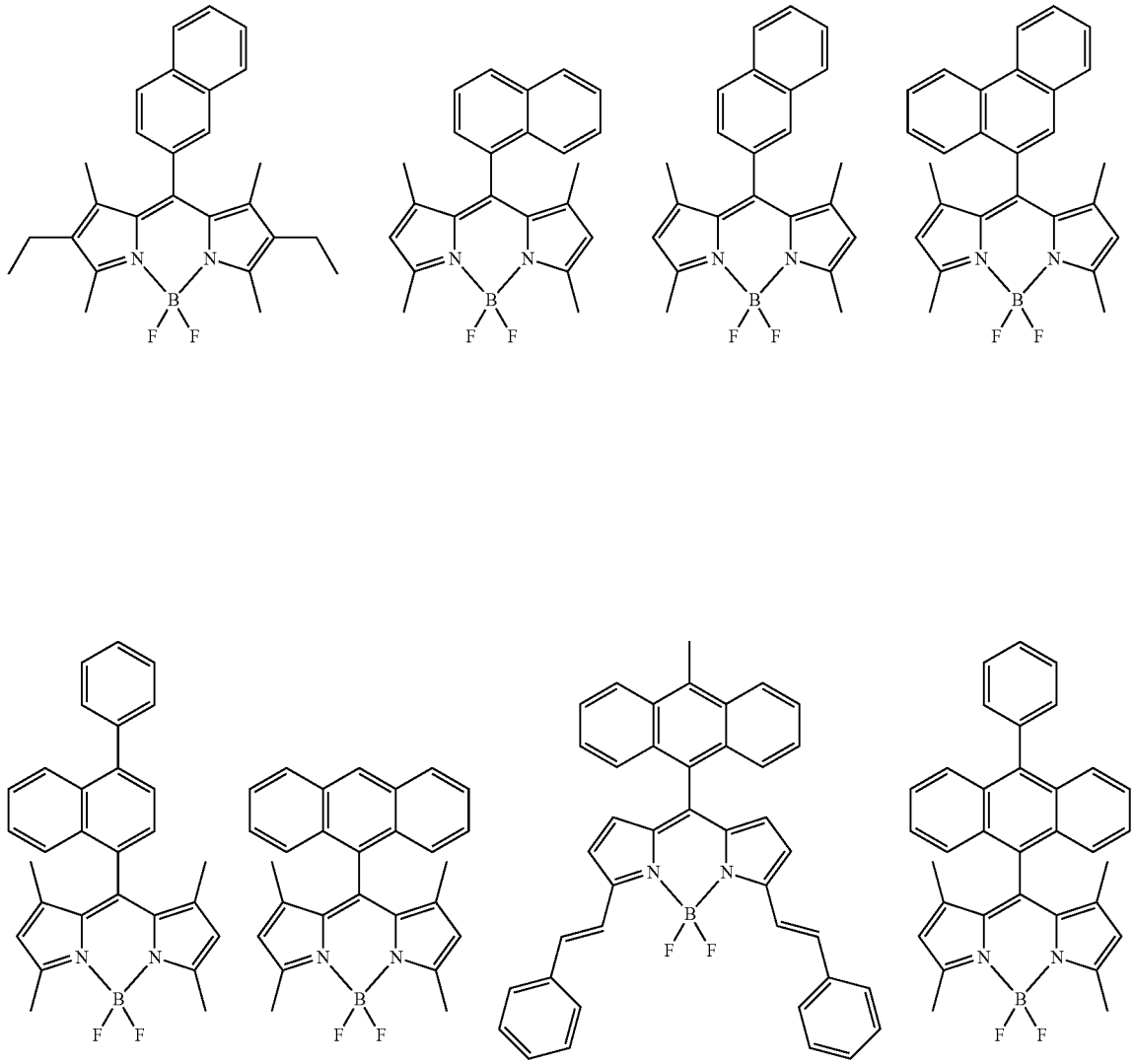

-continued
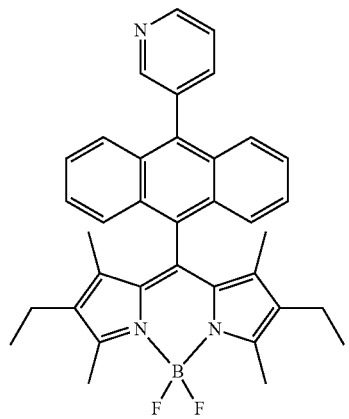
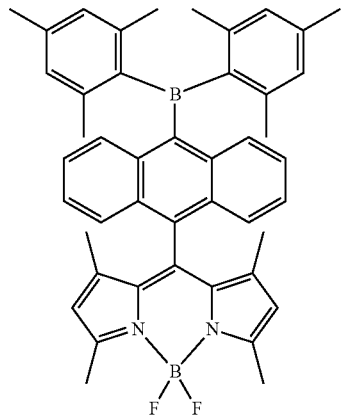
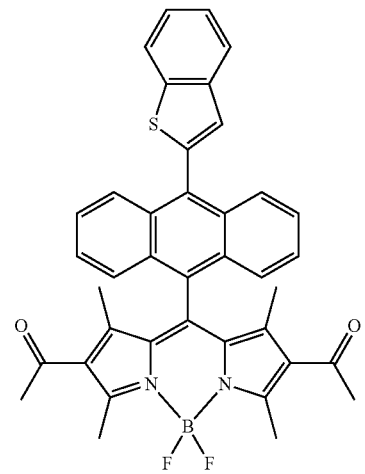
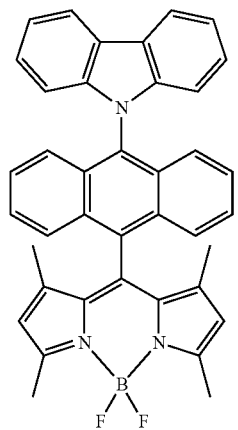
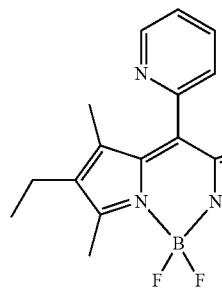
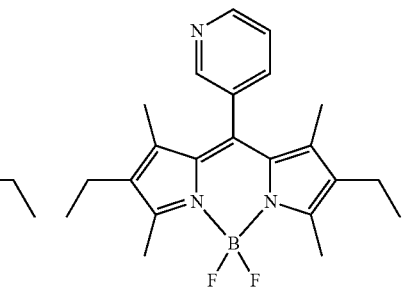
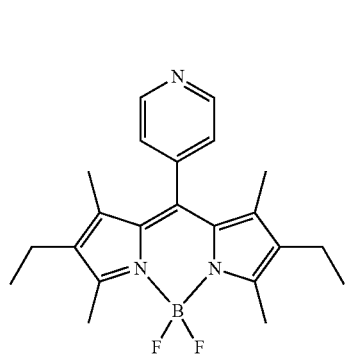
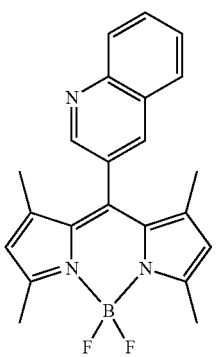
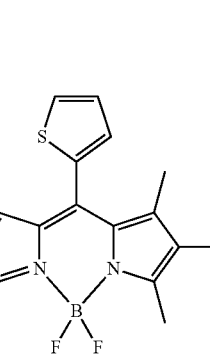
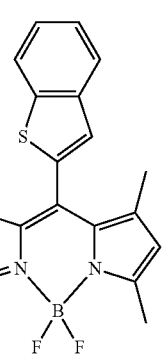
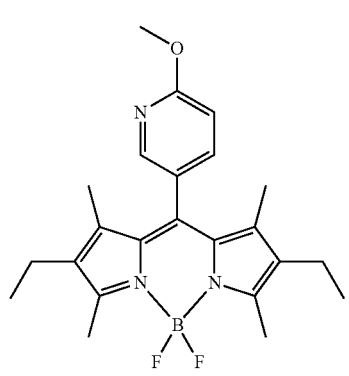
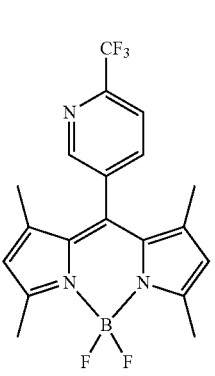
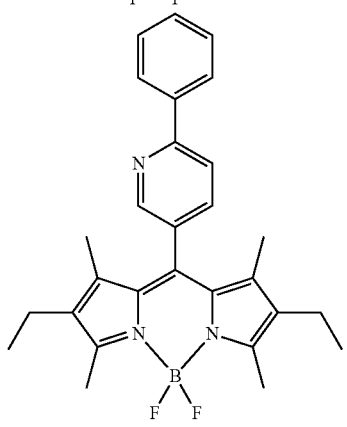

-continued
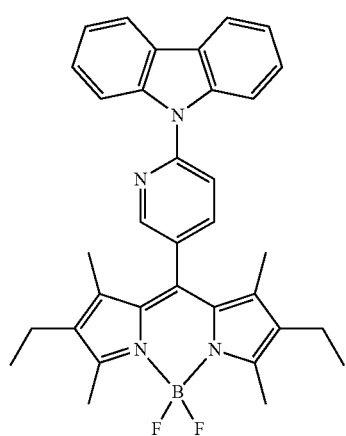
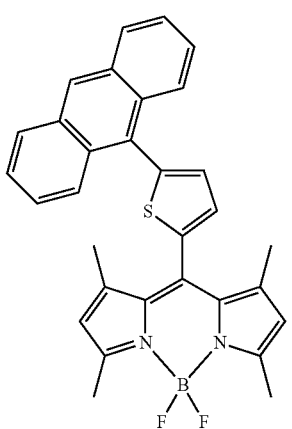
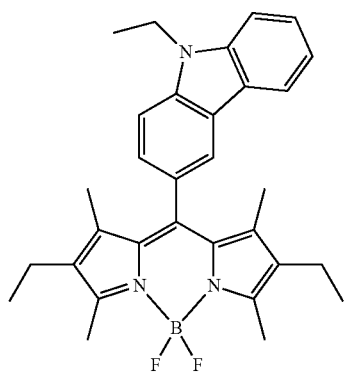
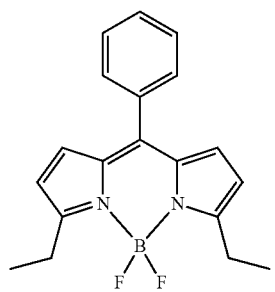
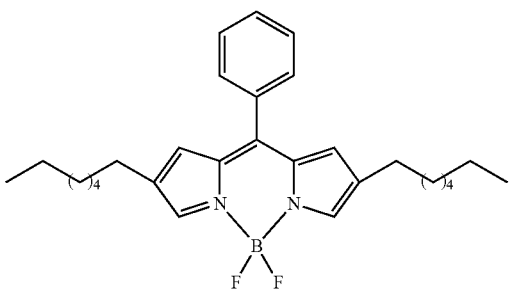
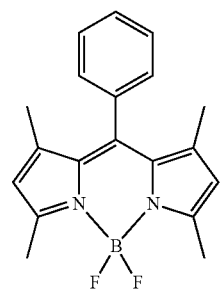
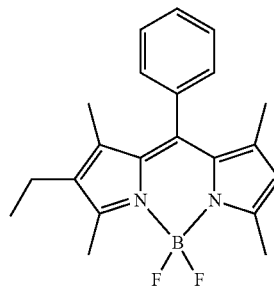
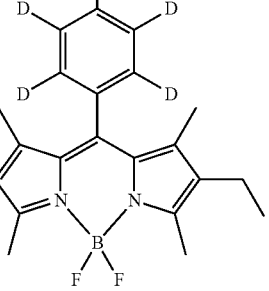
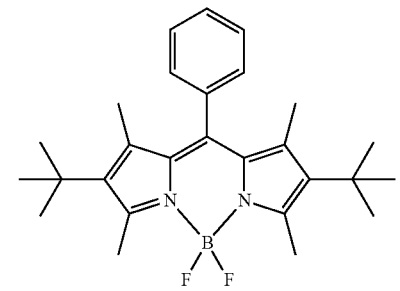
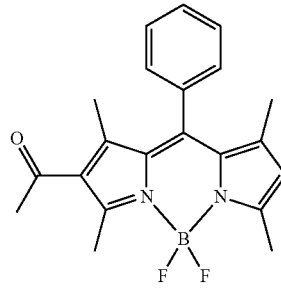
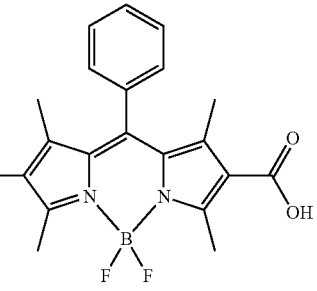
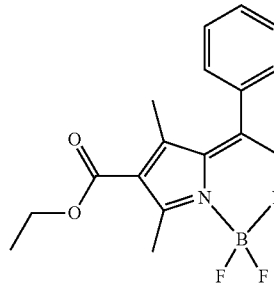
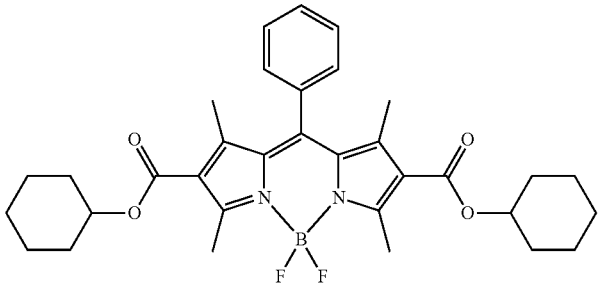

-continued
33
34
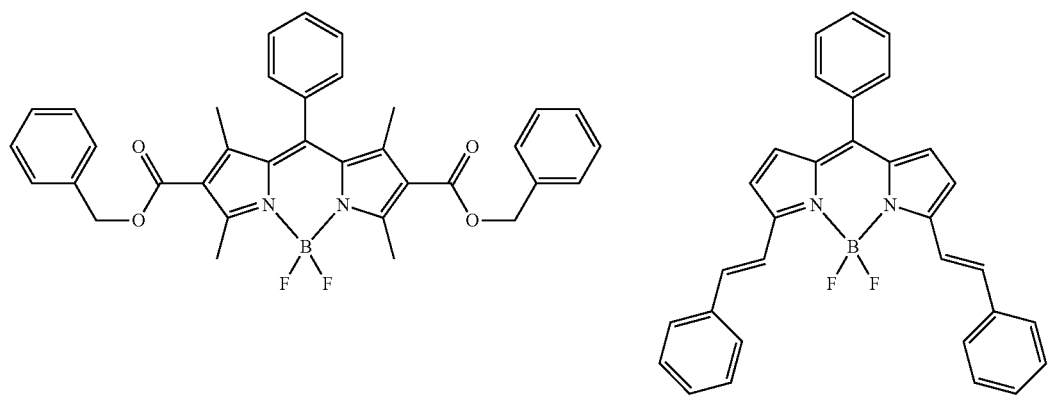
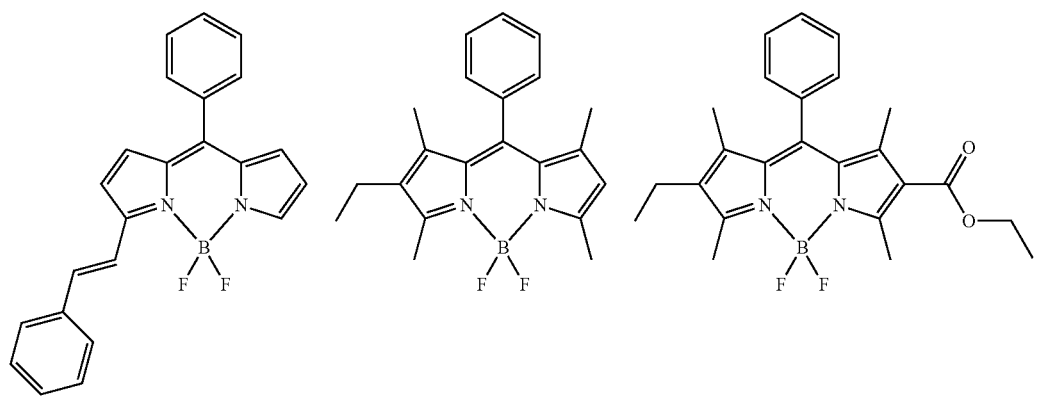
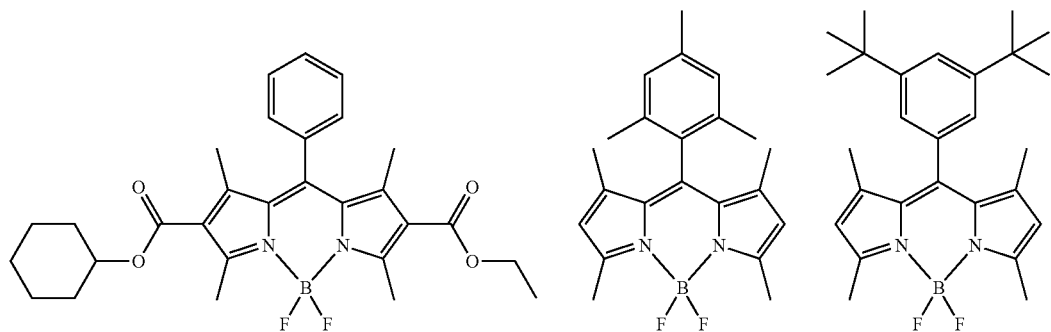
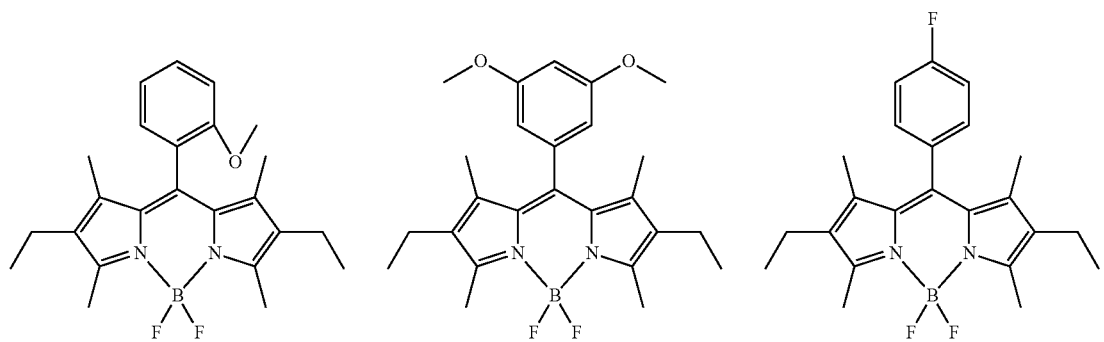

-continued
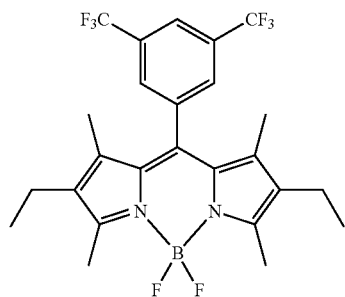
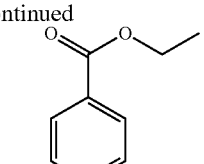
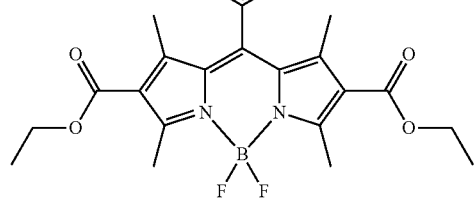
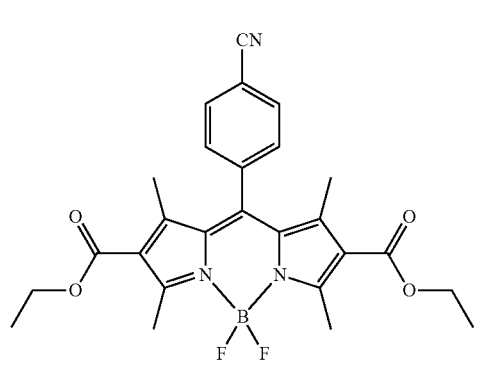
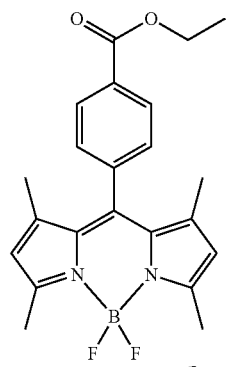
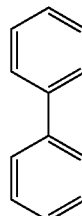
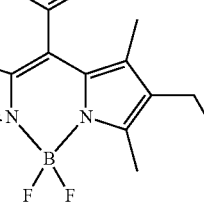
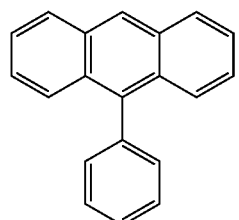
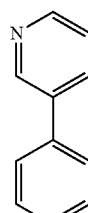
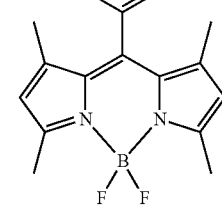
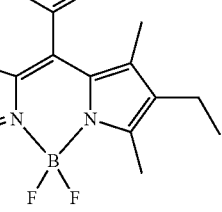
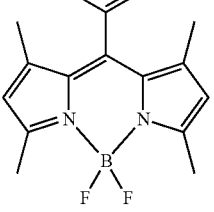
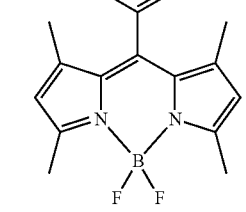
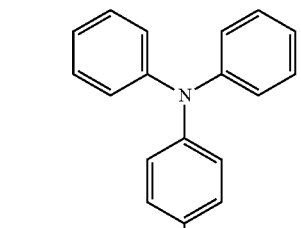
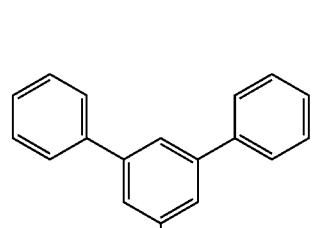
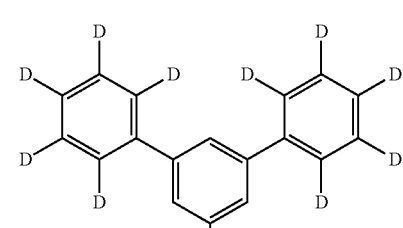
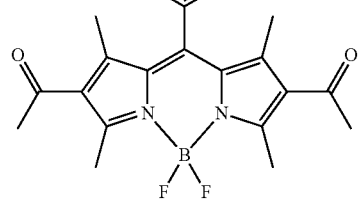
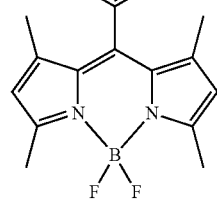
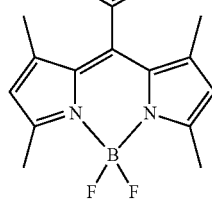

37
-continued
38
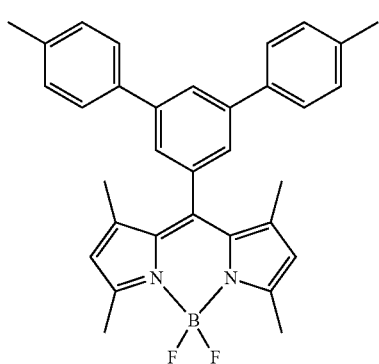
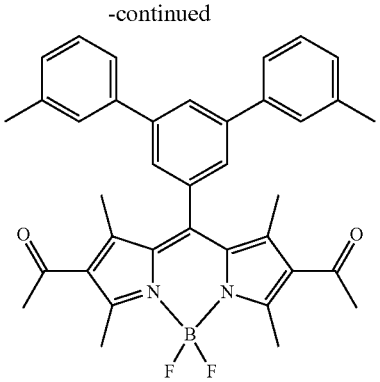
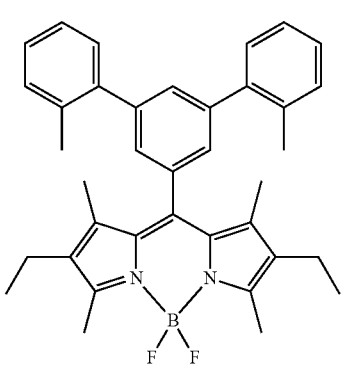
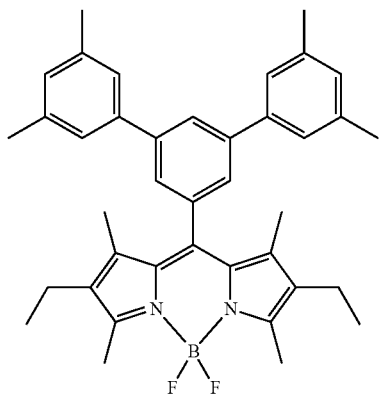
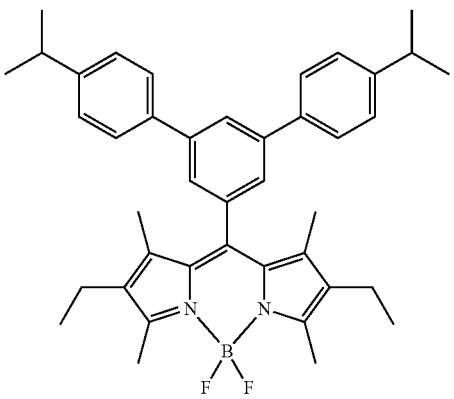
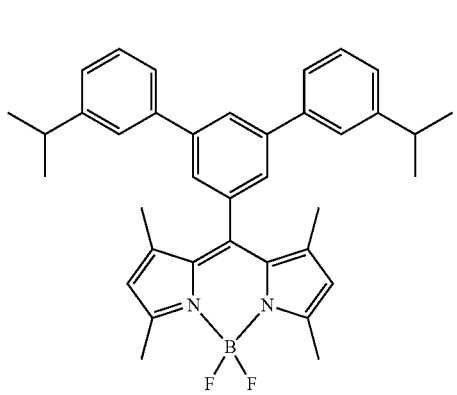
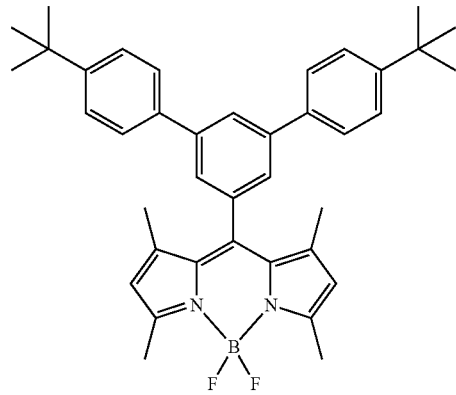
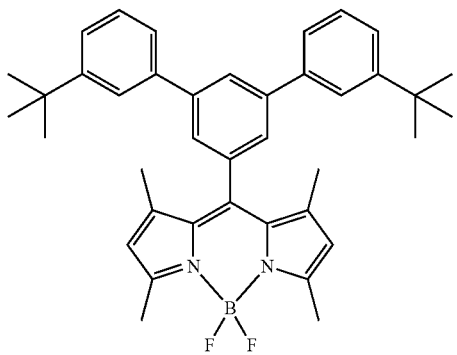
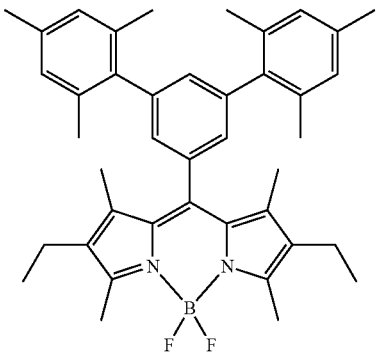

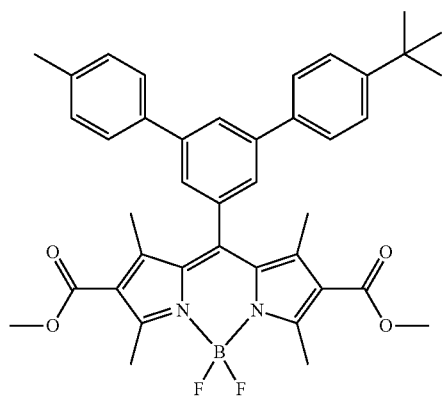
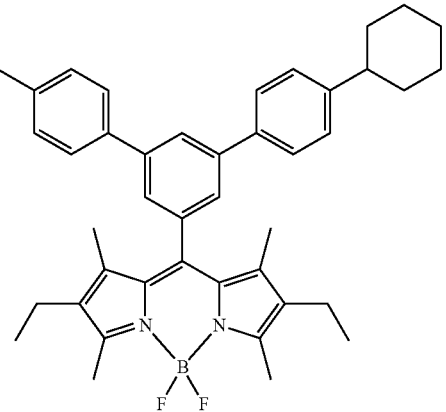
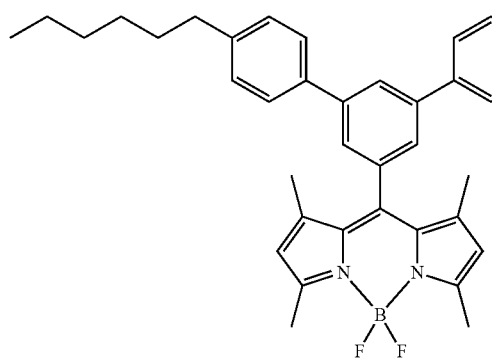
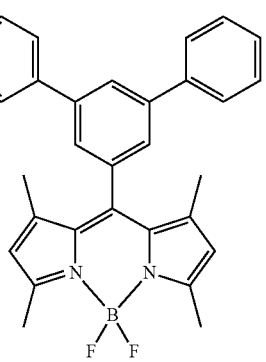
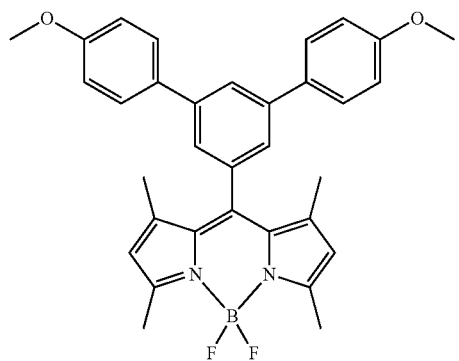
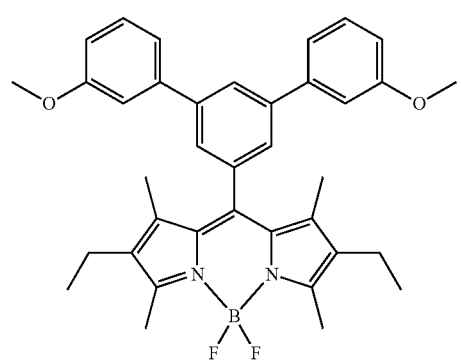
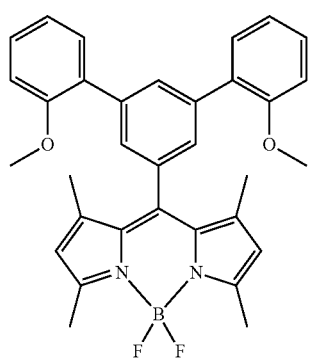
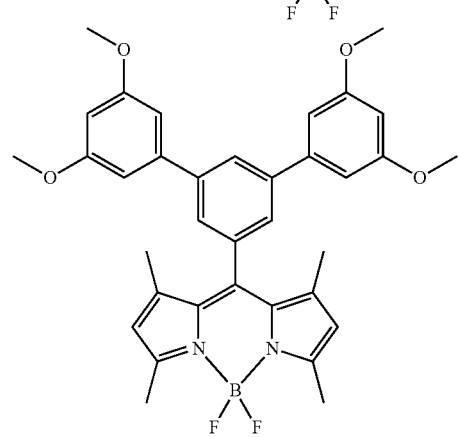

41 42
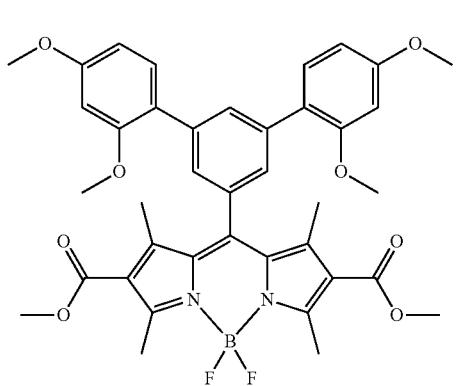 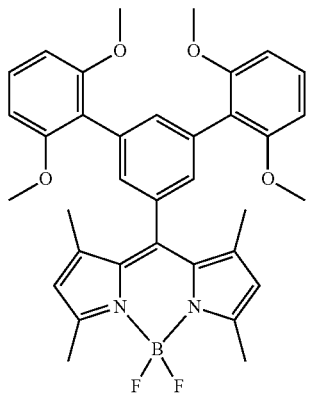
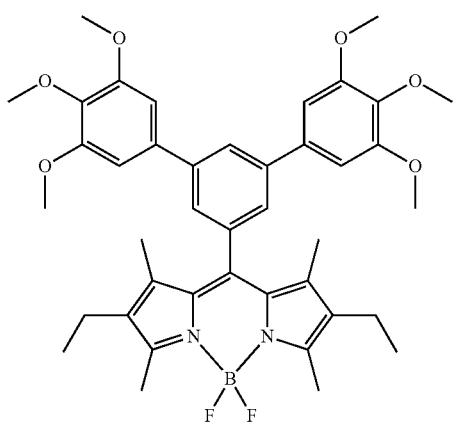 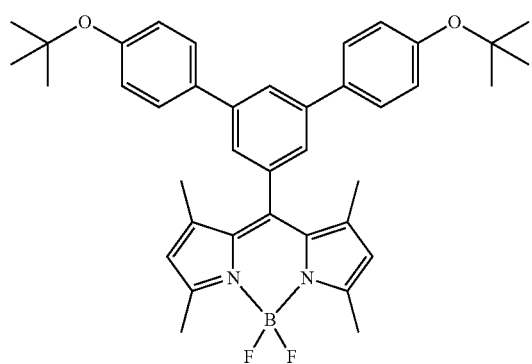
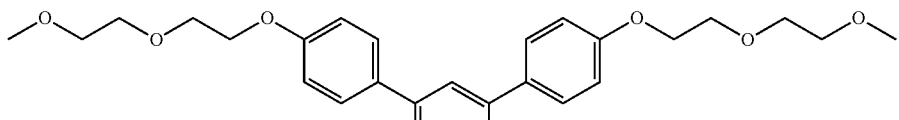
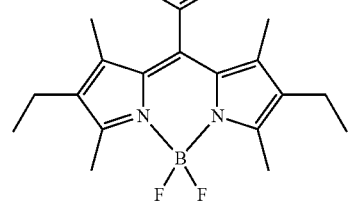
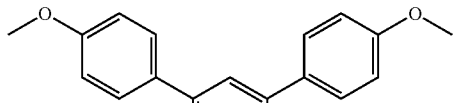
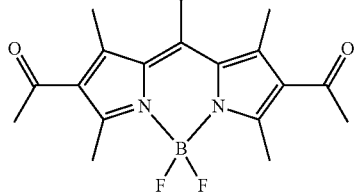

-continued
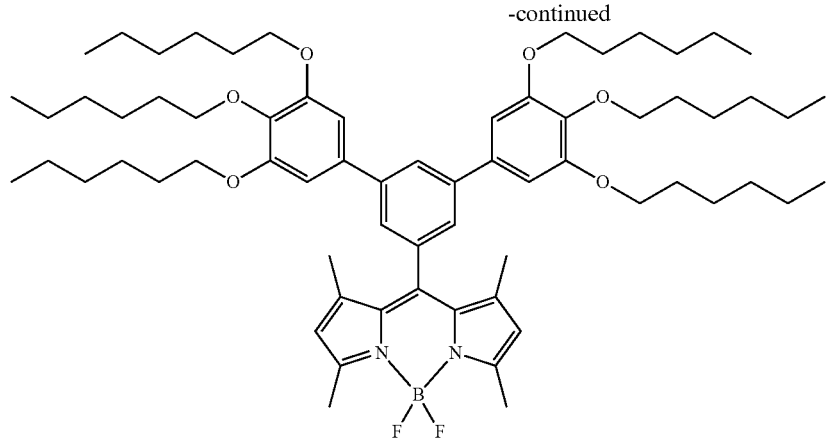
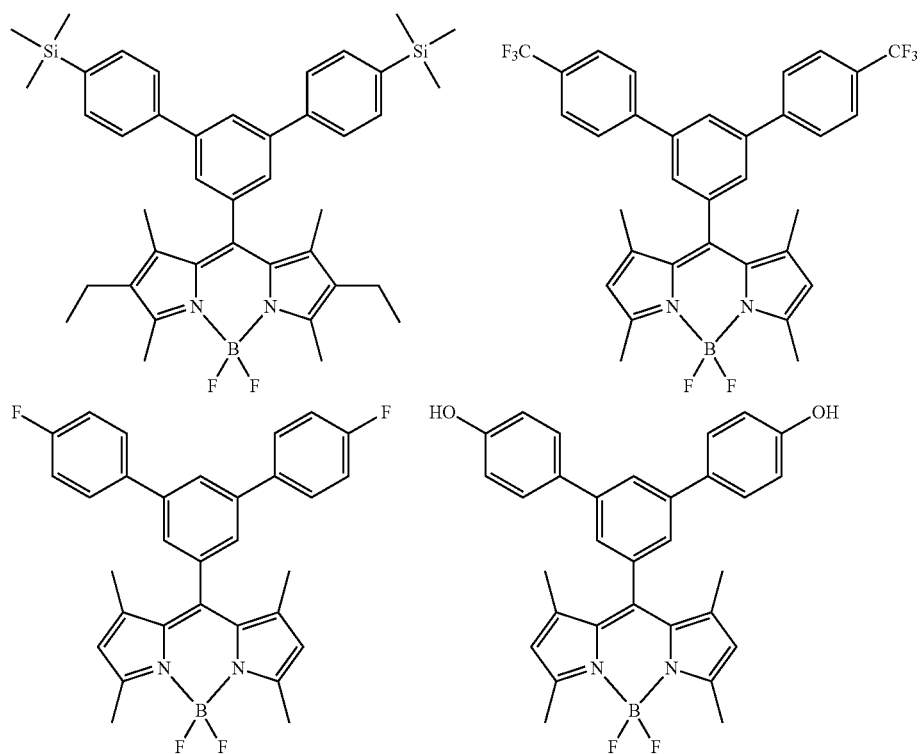
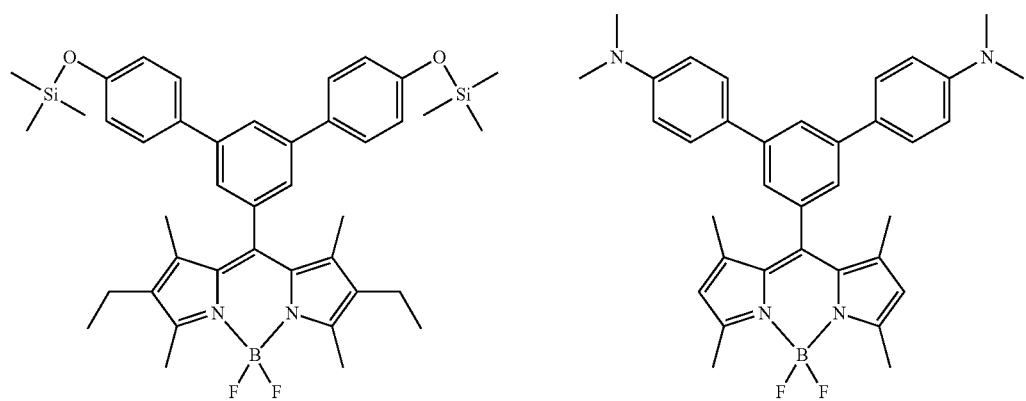

45
46
-continued
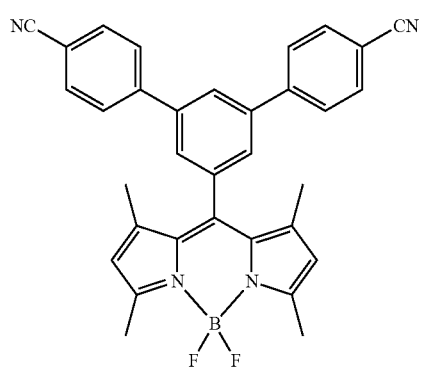
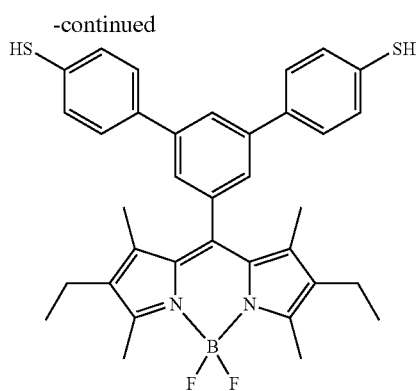
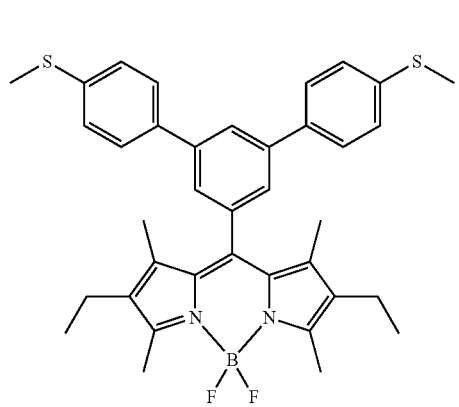
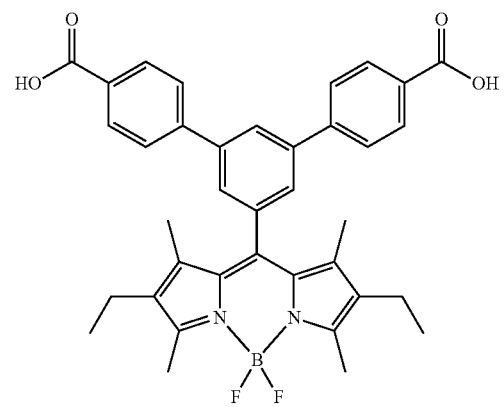
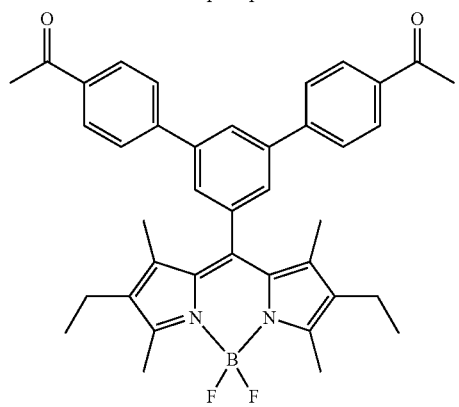
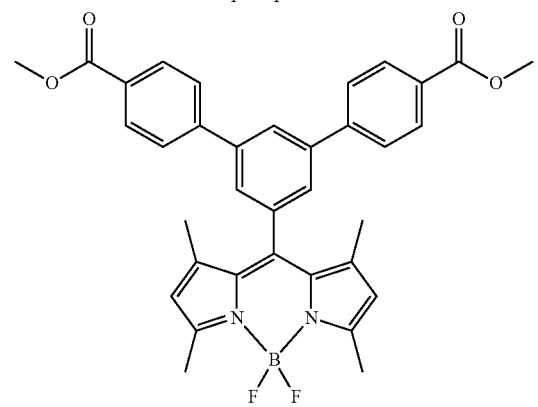
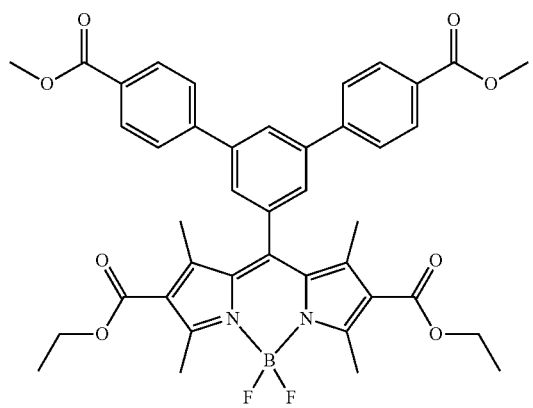
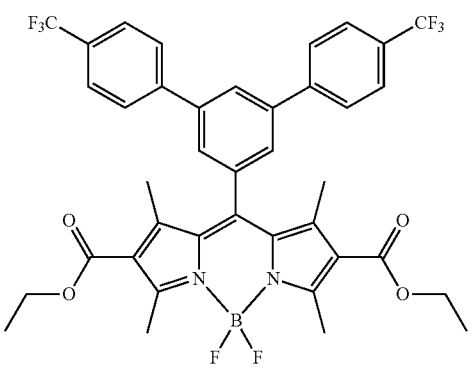

-continued
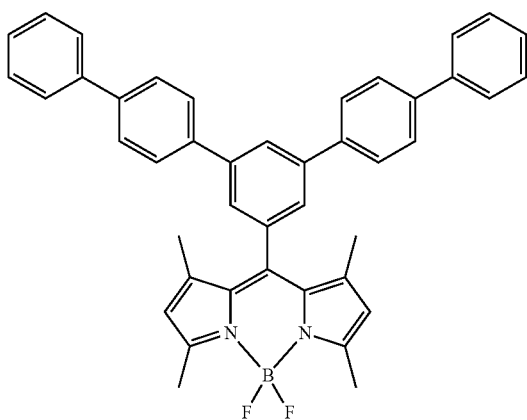
47
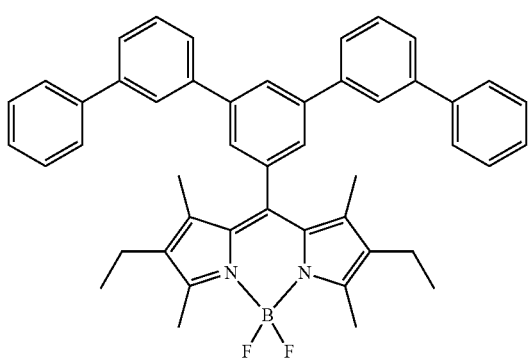
48
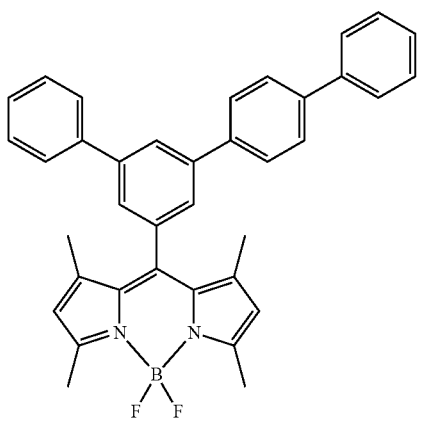
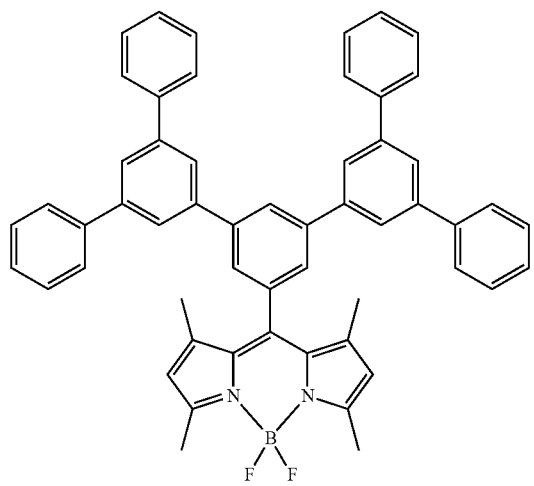
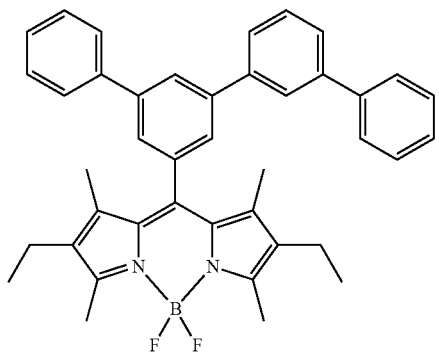
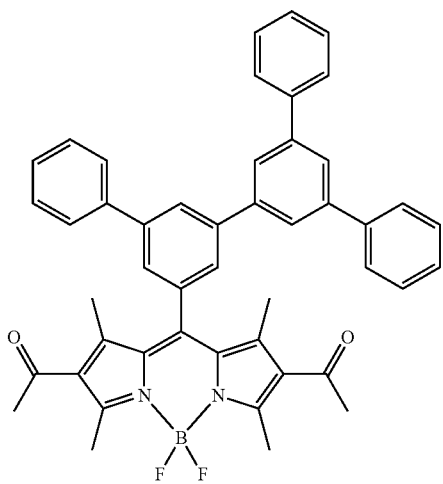

-continued
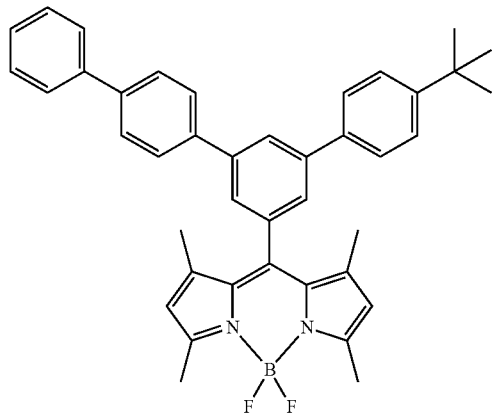
49
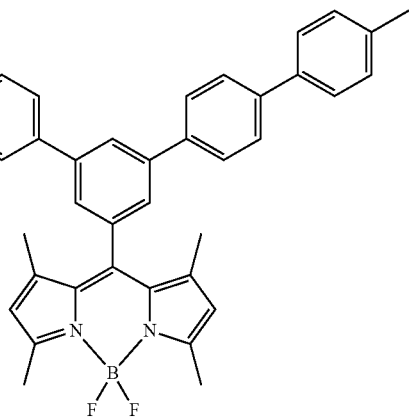
50
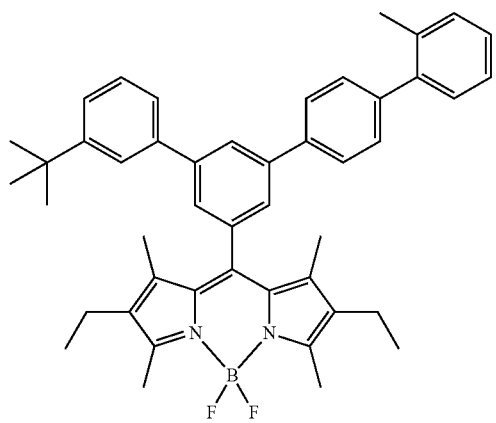
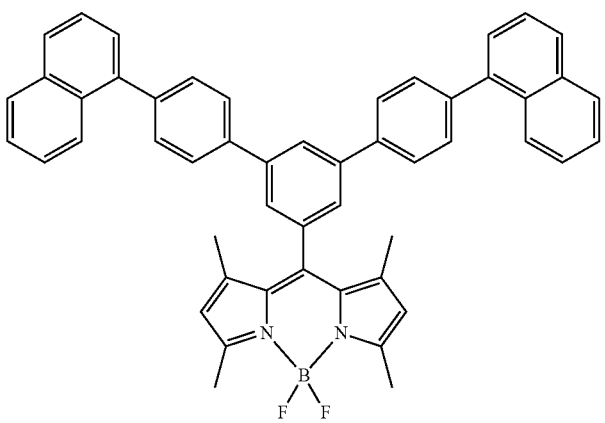
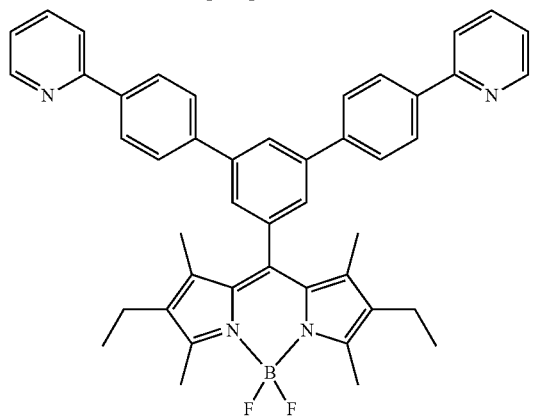
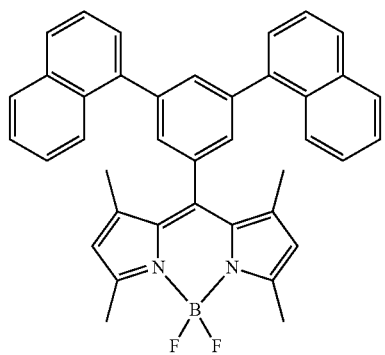
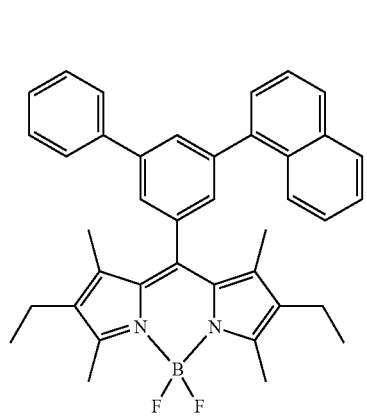
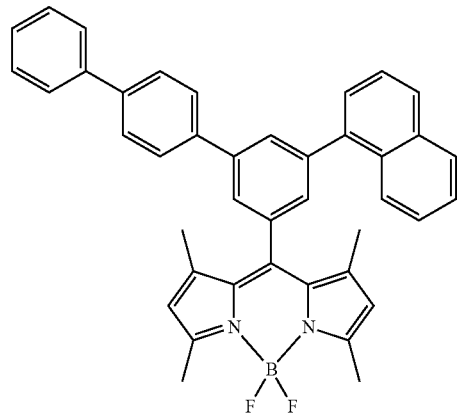

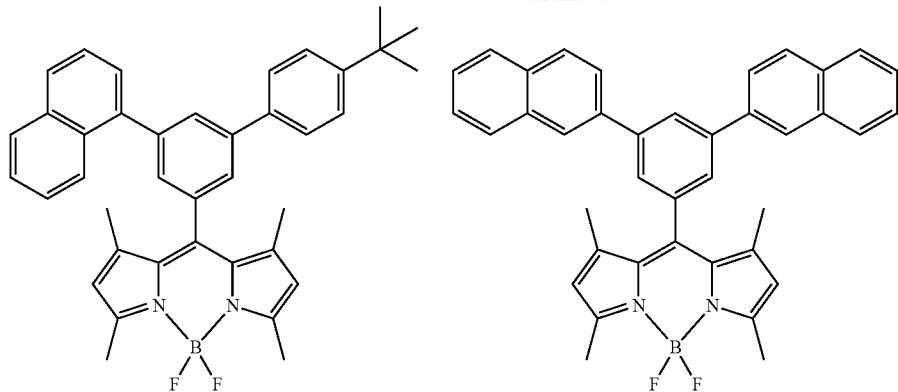
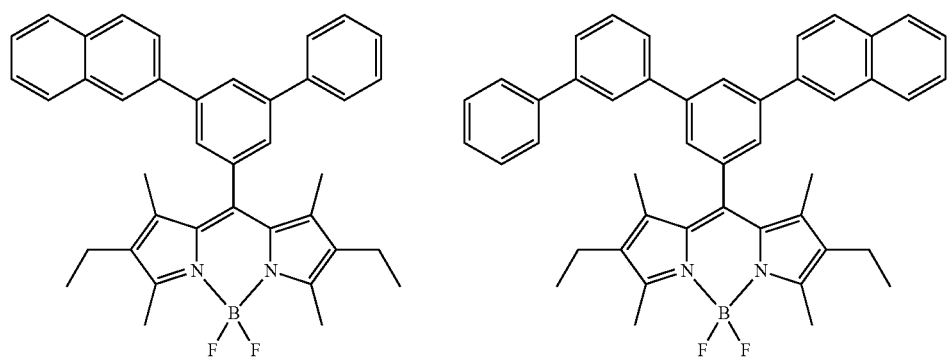
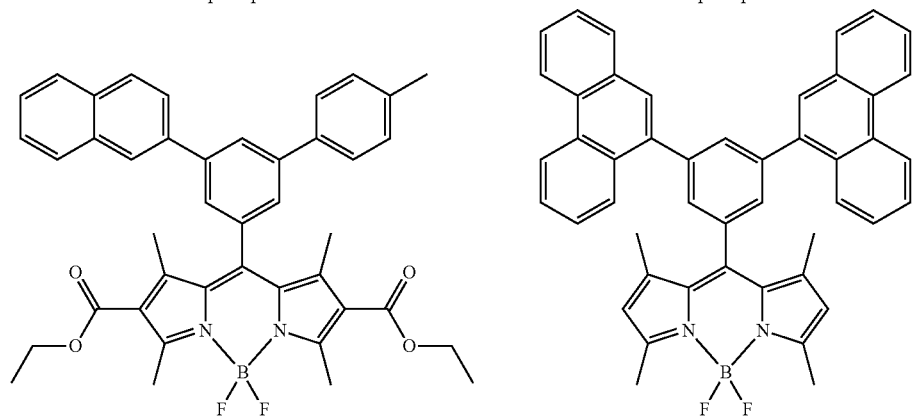
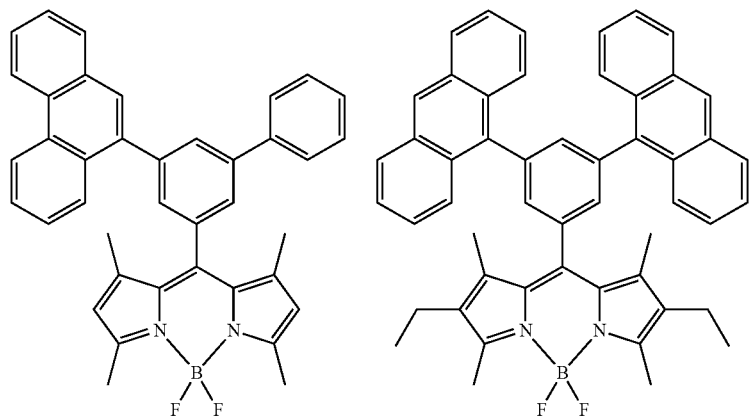

-continued
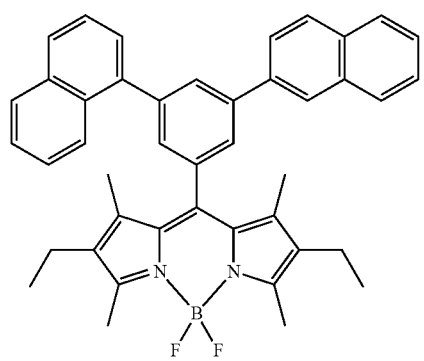
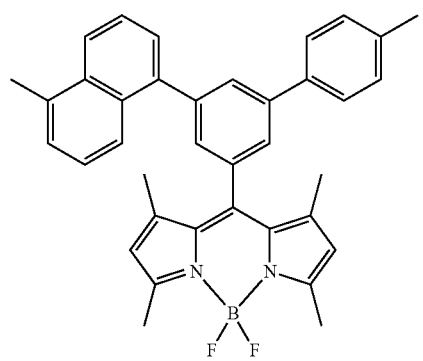
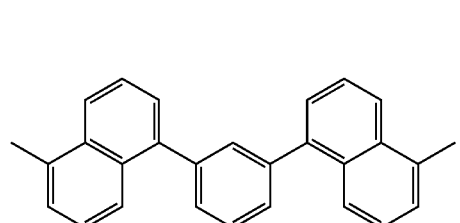
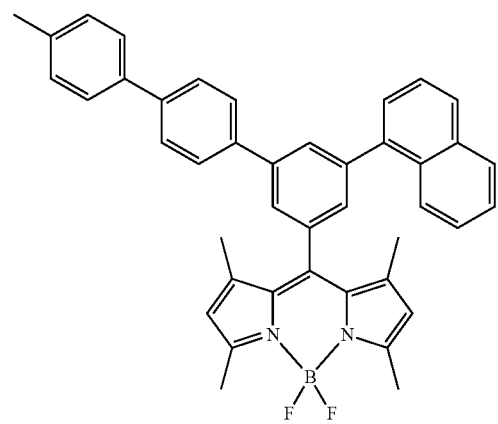
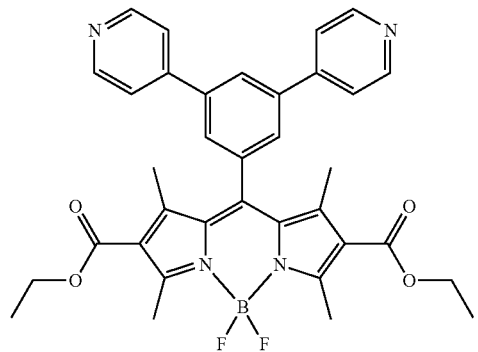
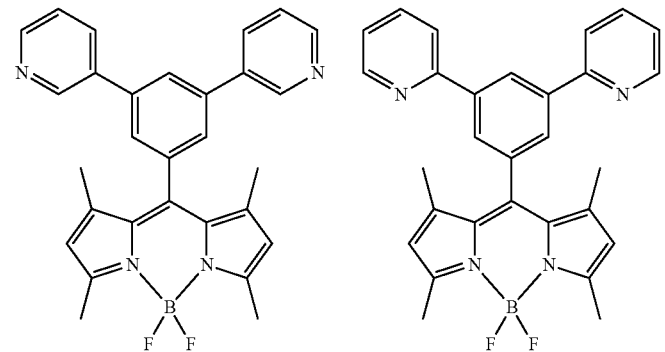
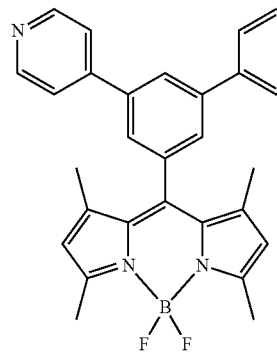
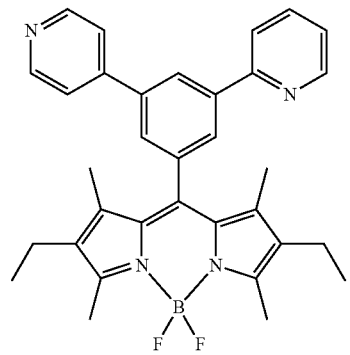
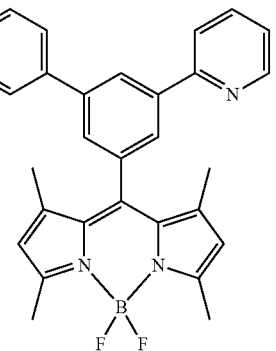

-continued
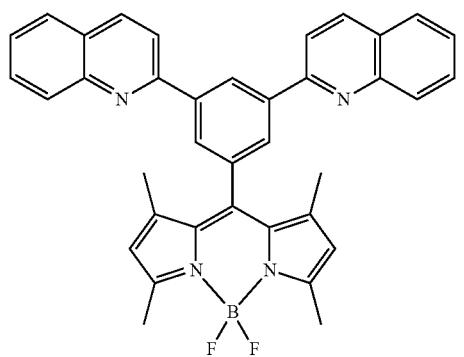
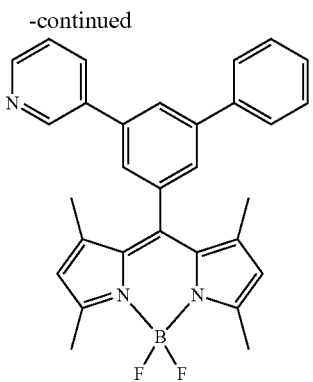
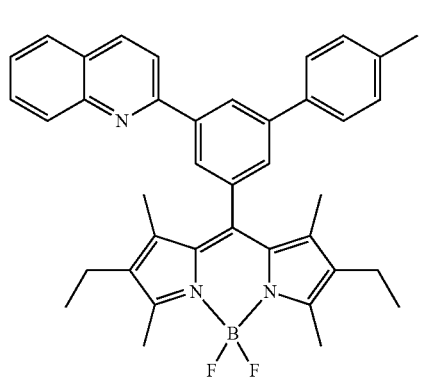
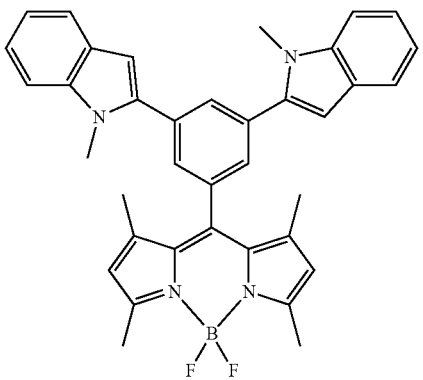
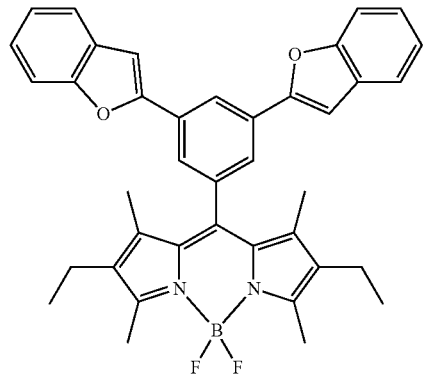
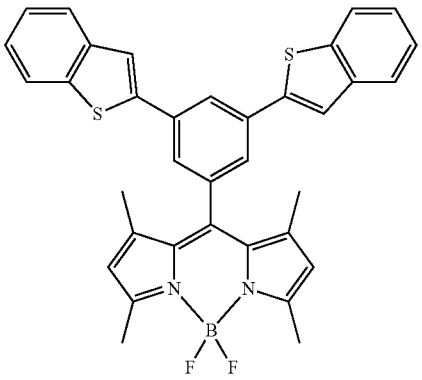
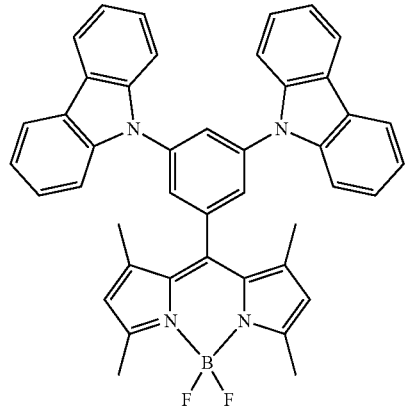
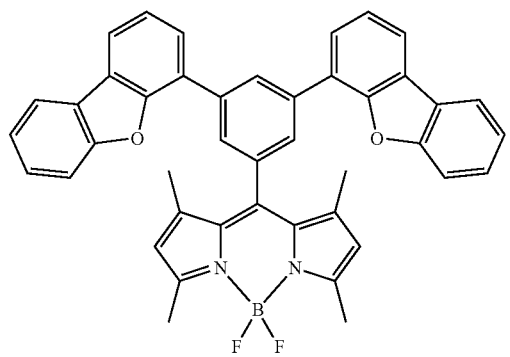

-continued
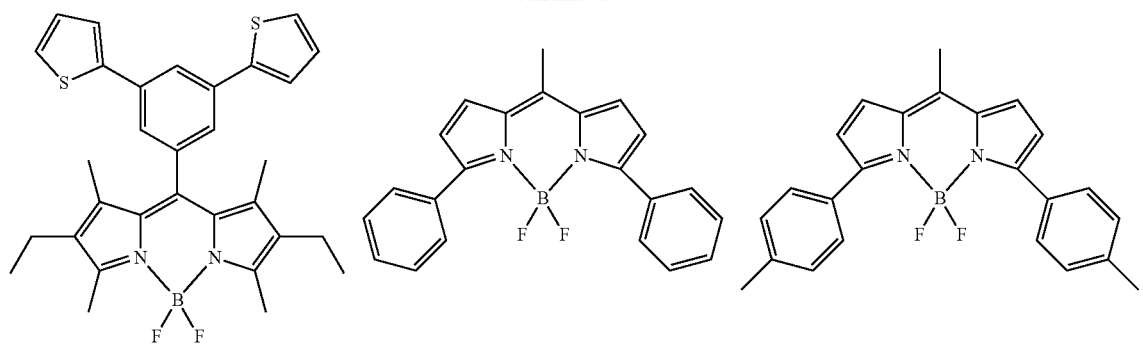
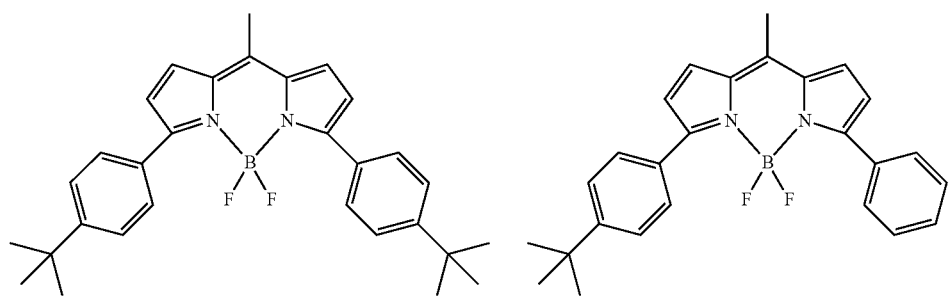
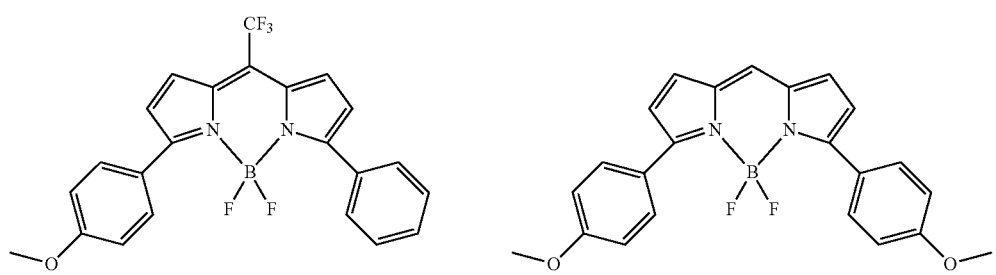
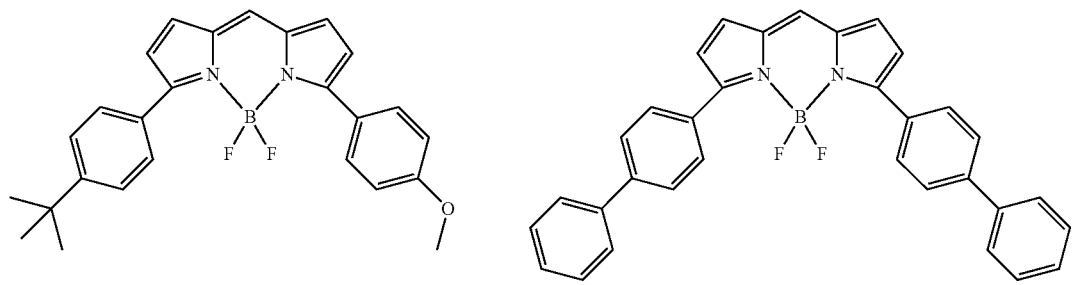
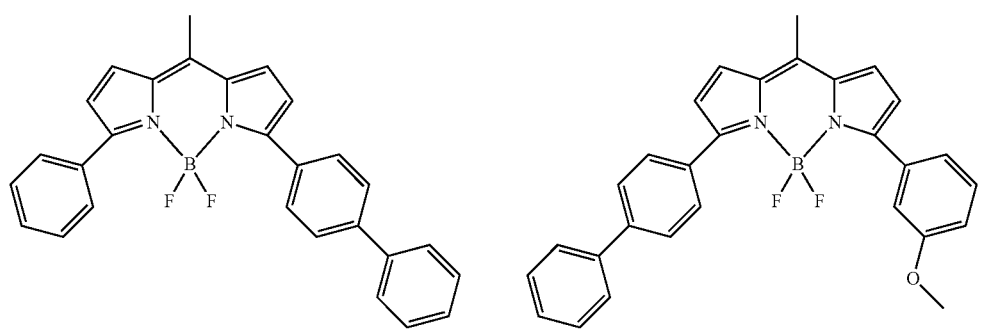

59 60
-continued
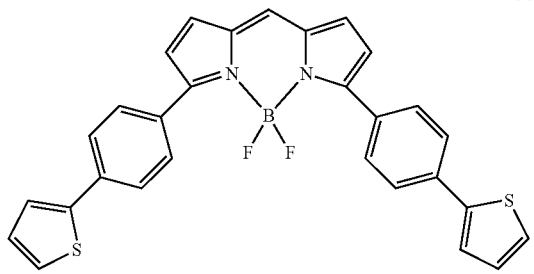 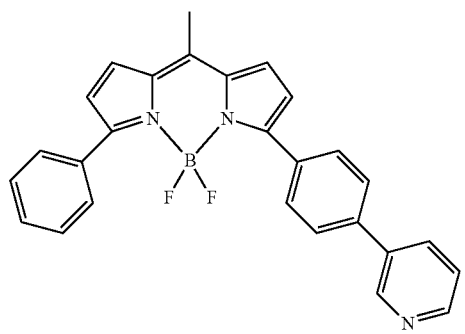
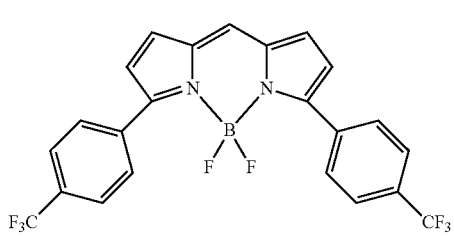 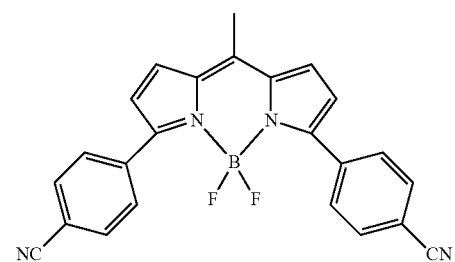
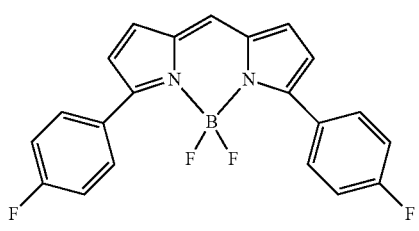 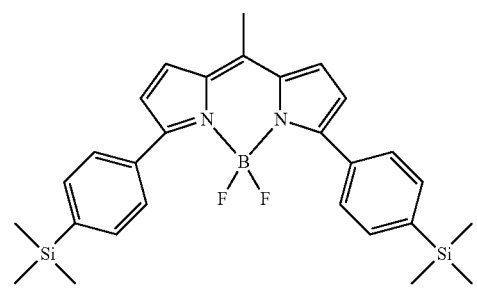
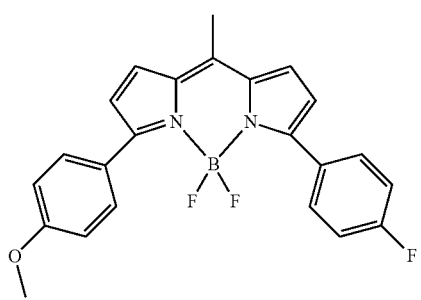 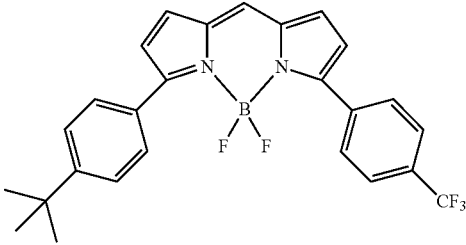
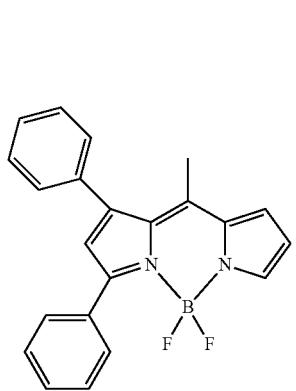 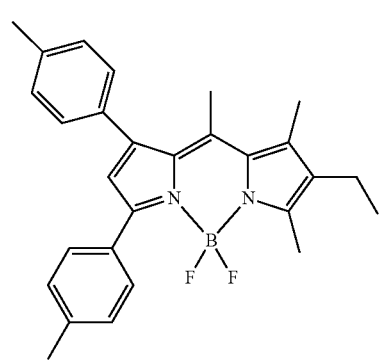 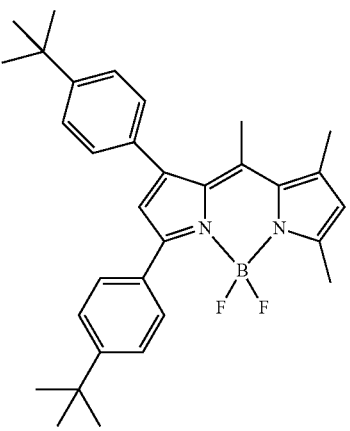

61
-continued
62
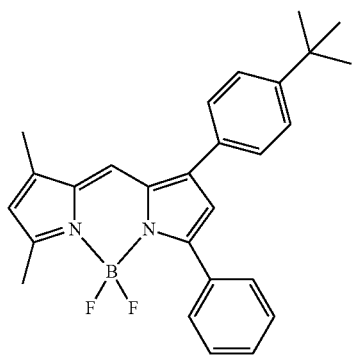
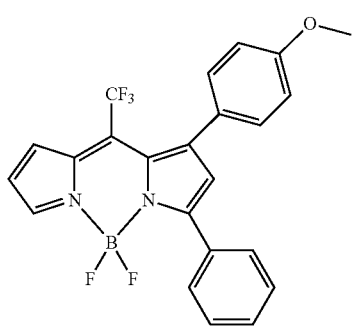
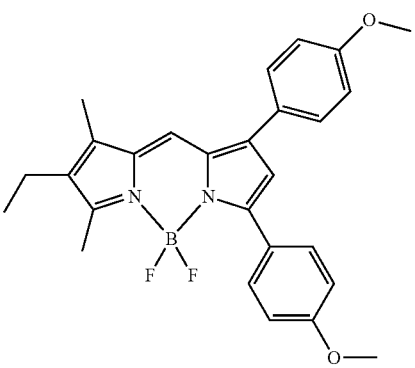
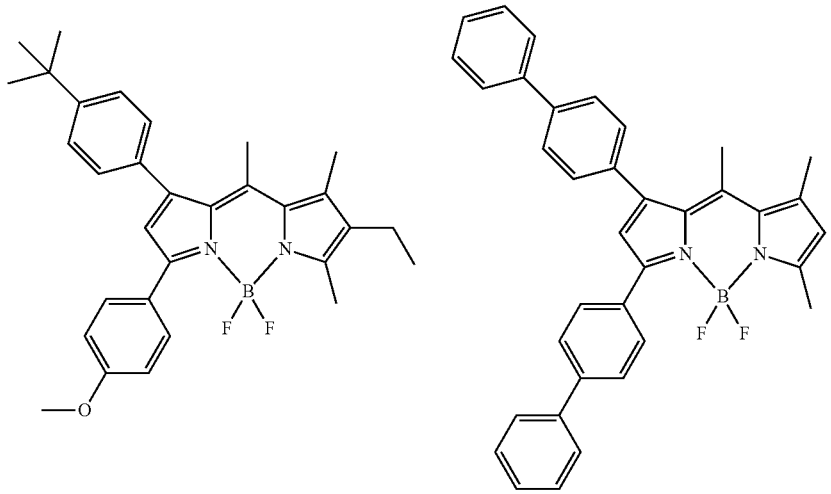
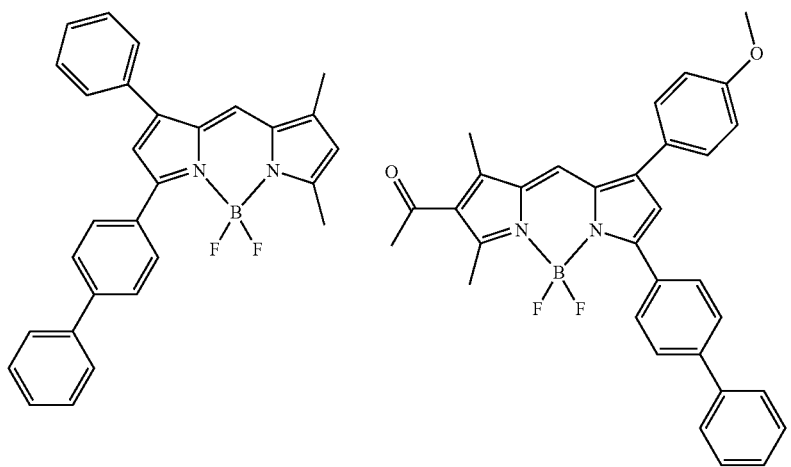

-continued
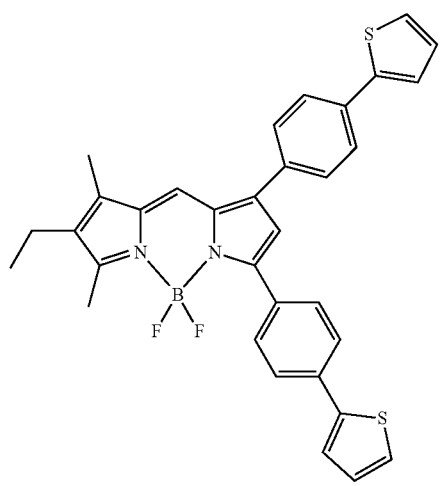
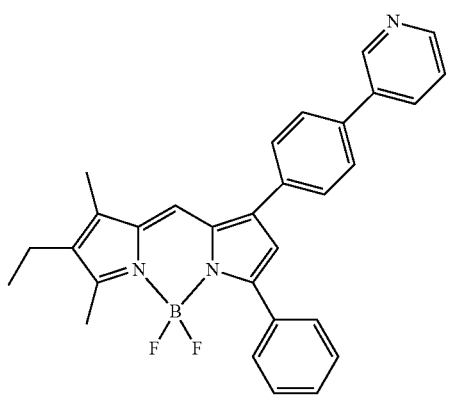
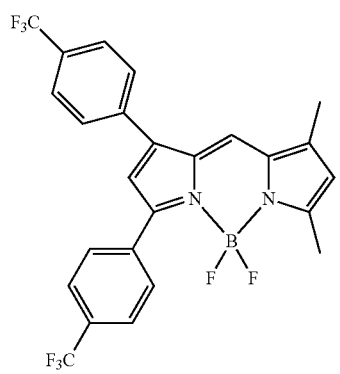
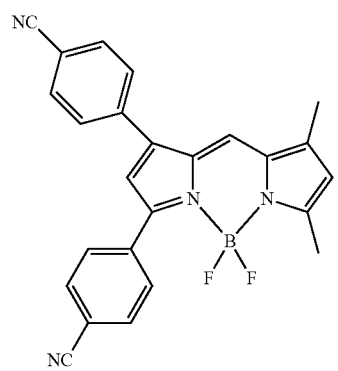
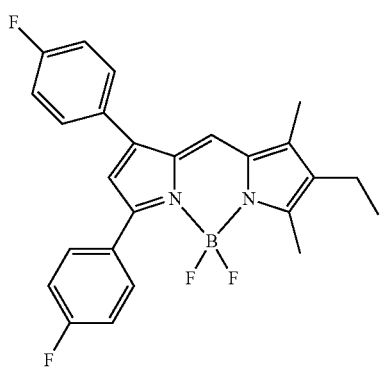
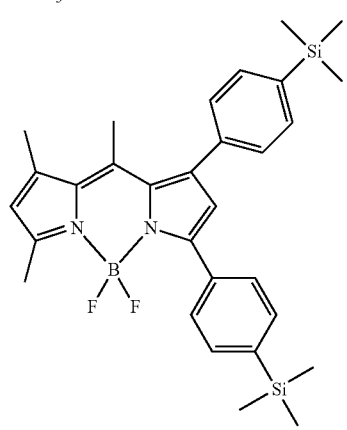
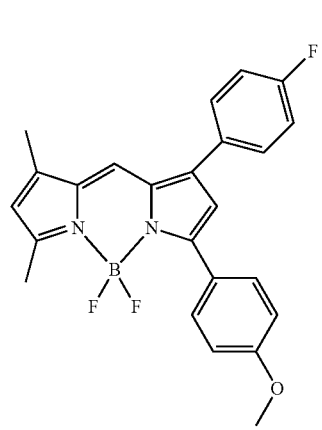
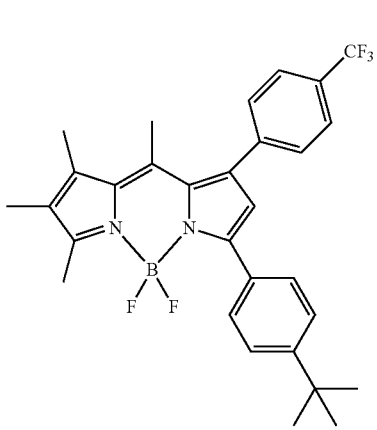
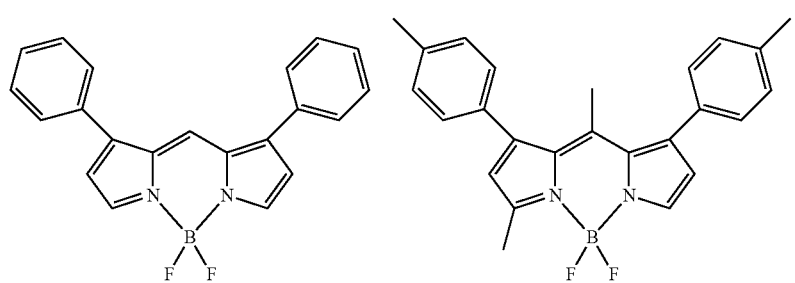

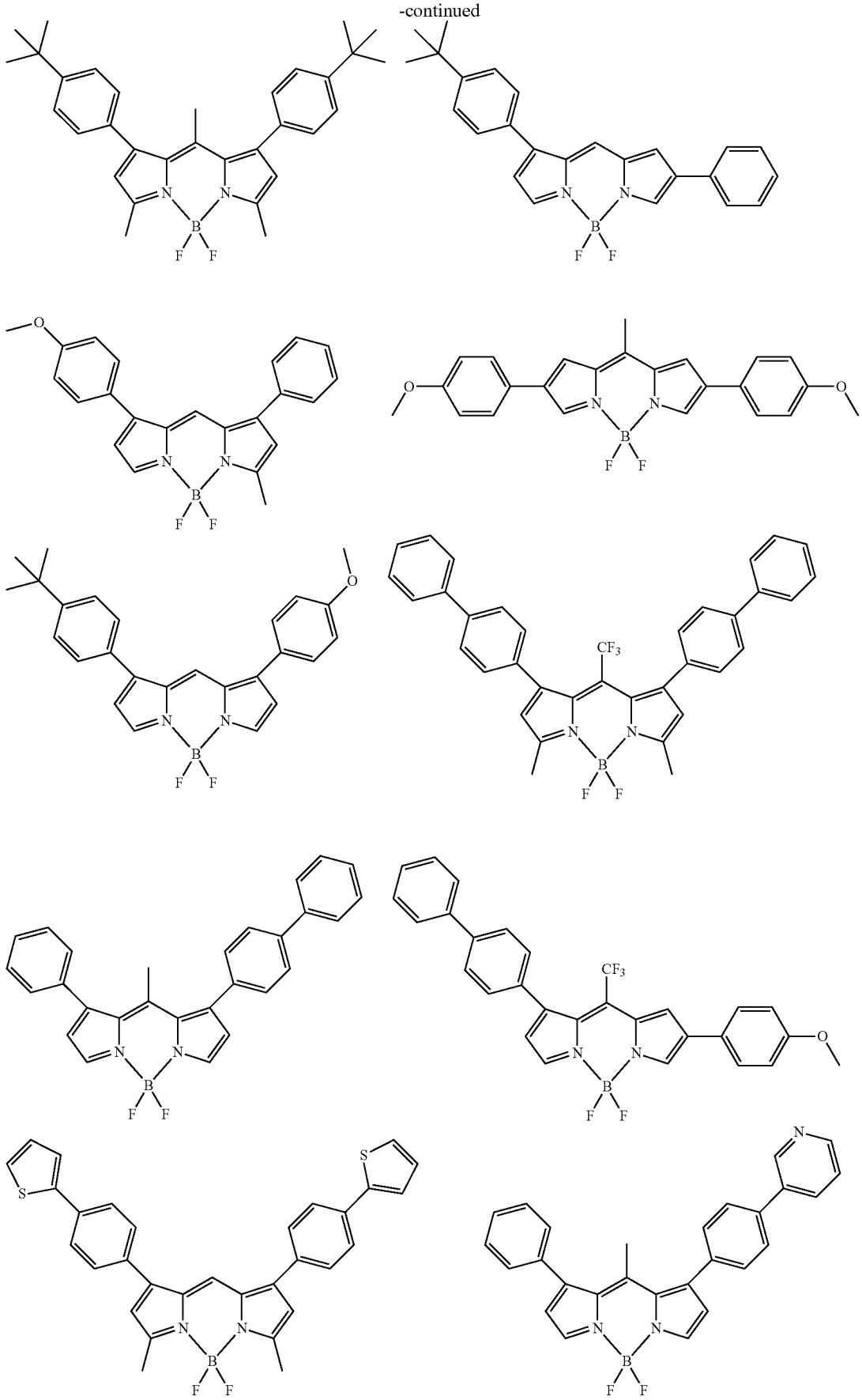

-continued
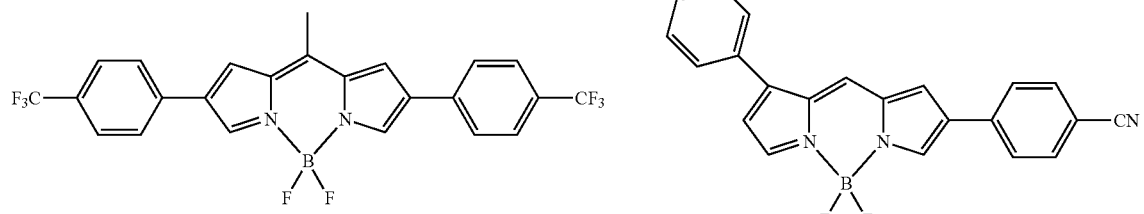
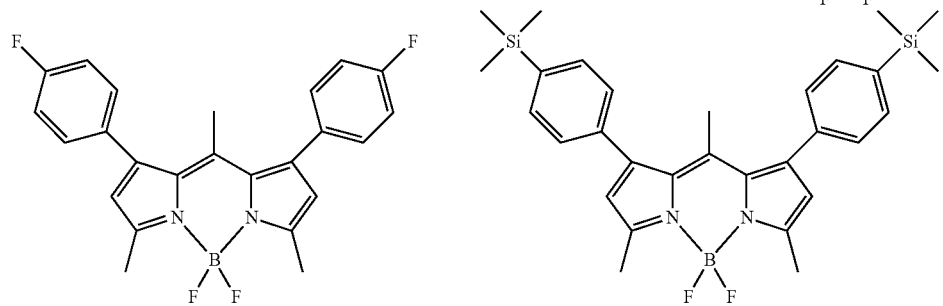
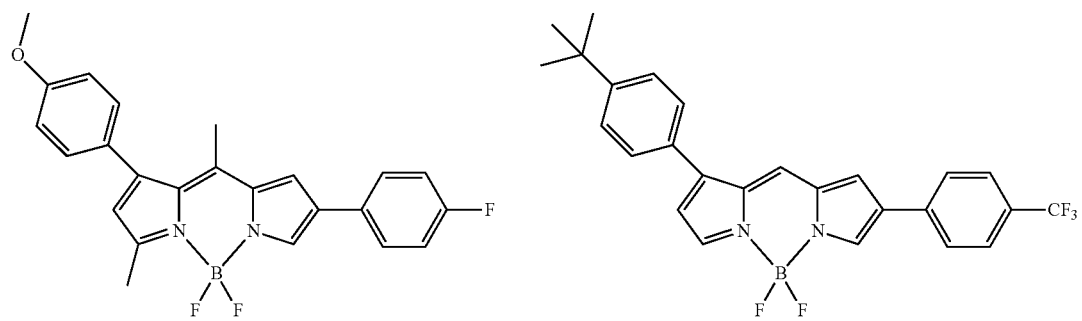
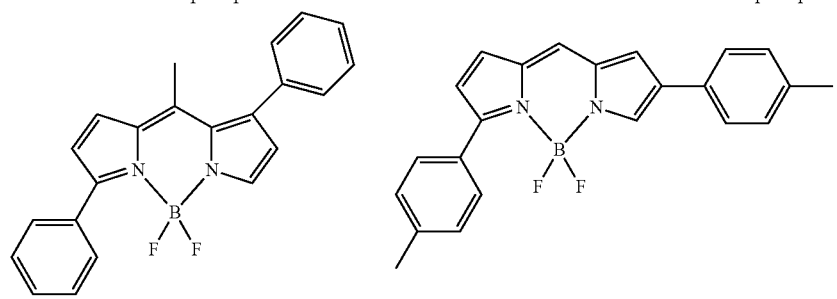
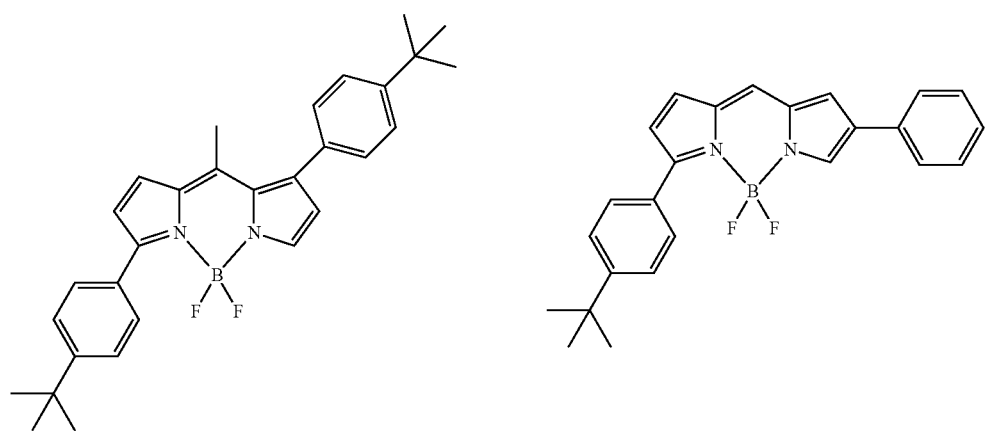

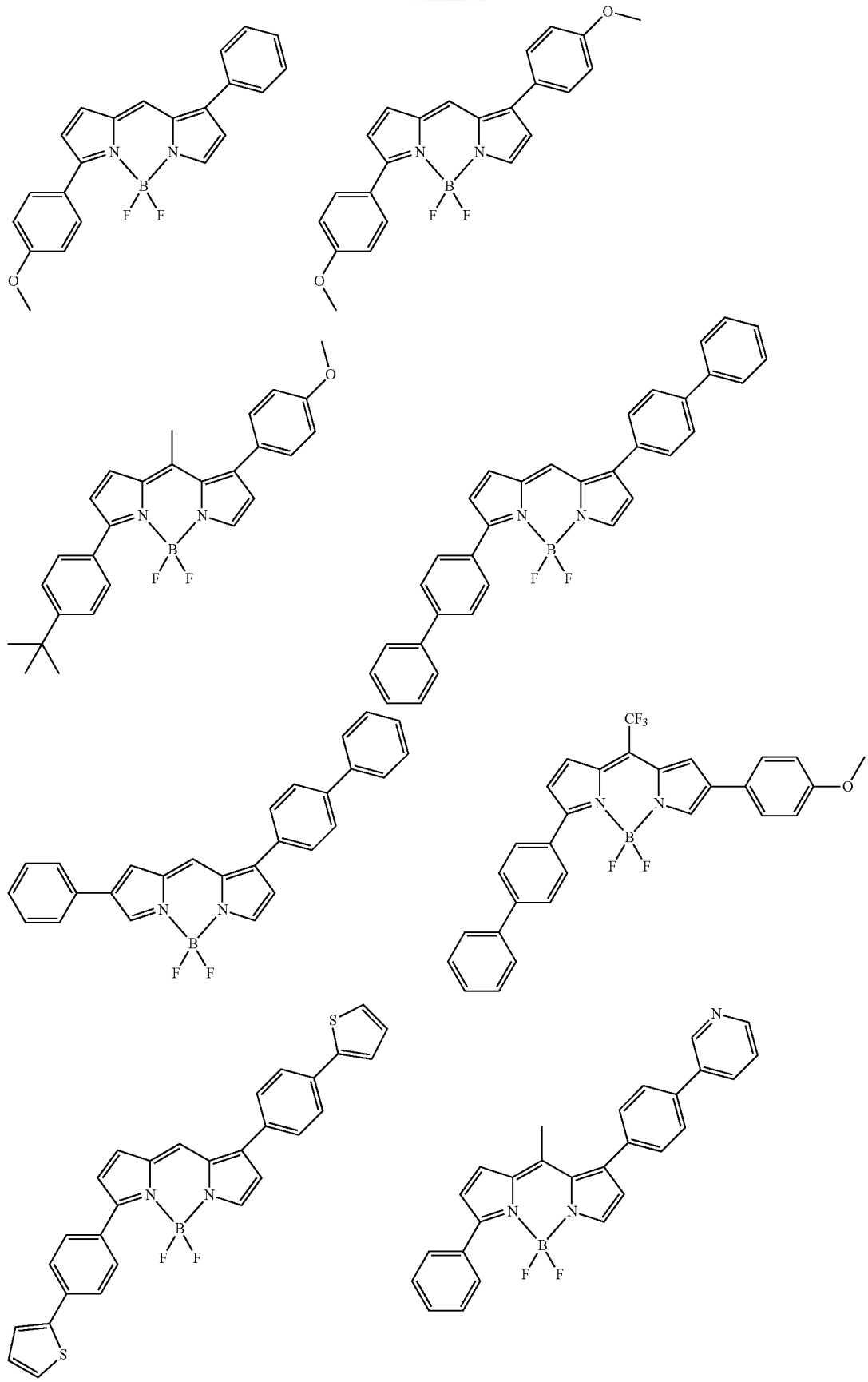

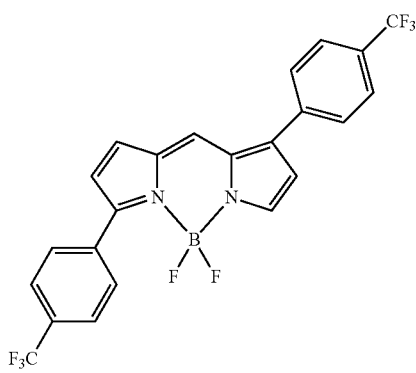
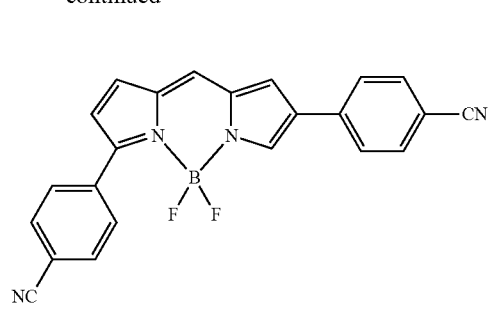
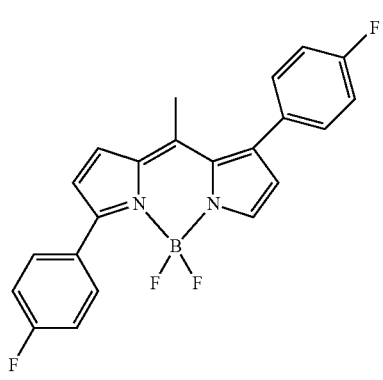
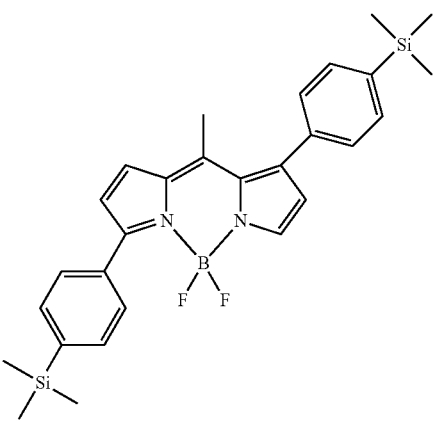
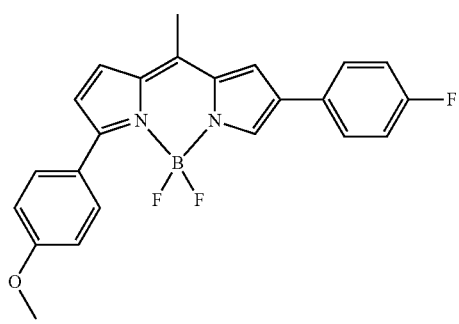
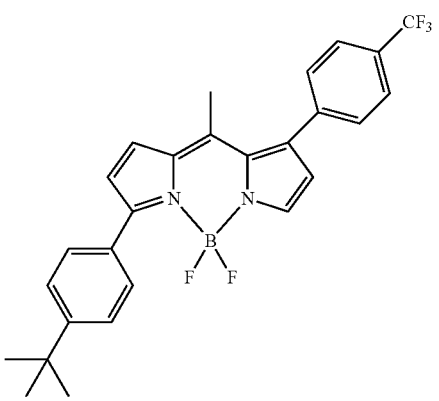
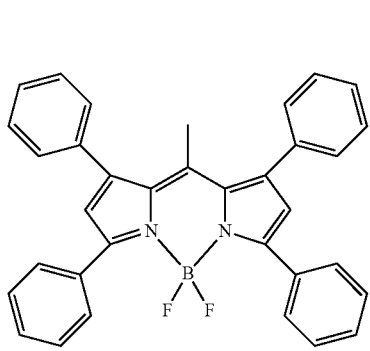
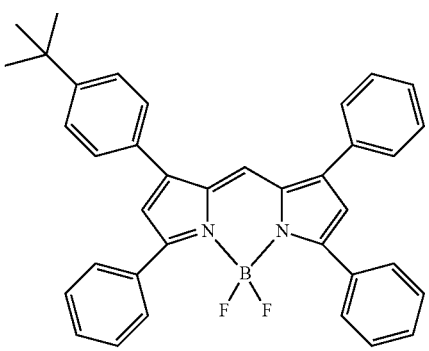

-continued
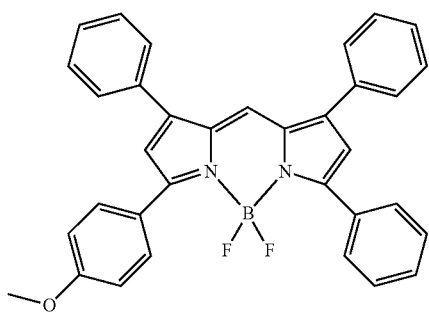
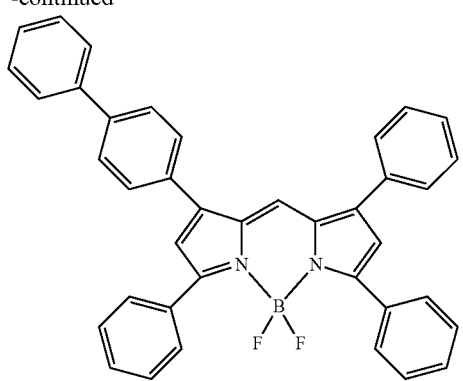
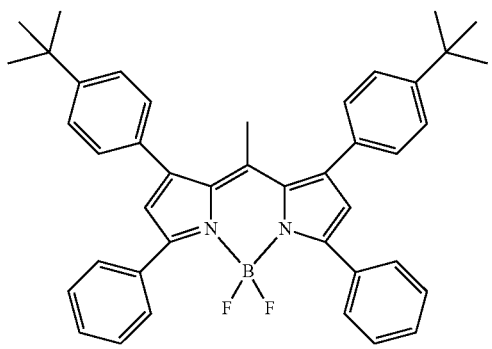
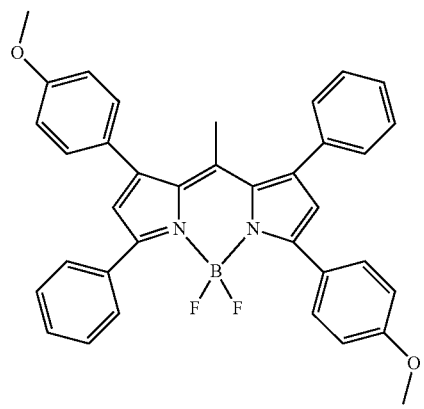
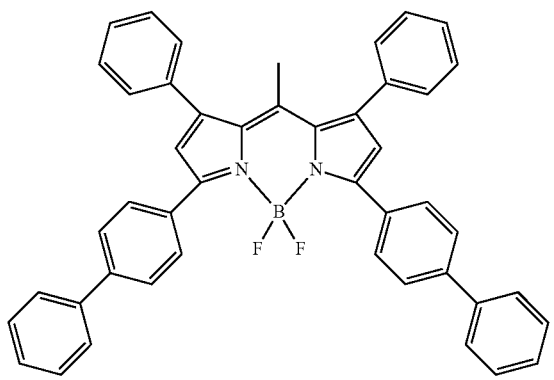
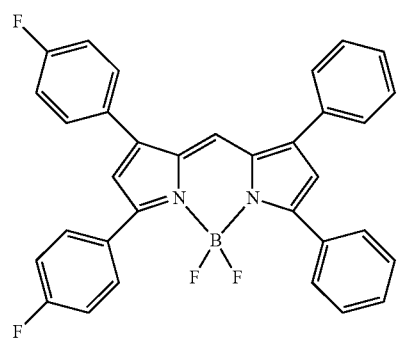
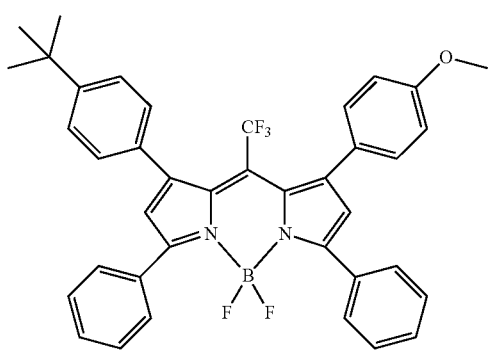
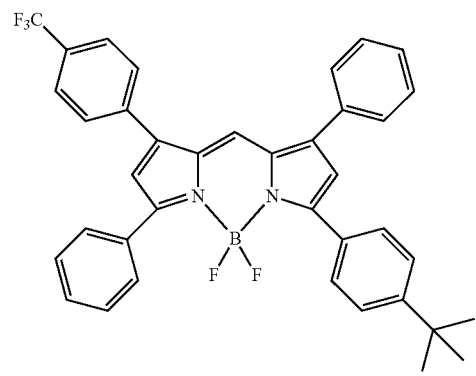

-continued
75
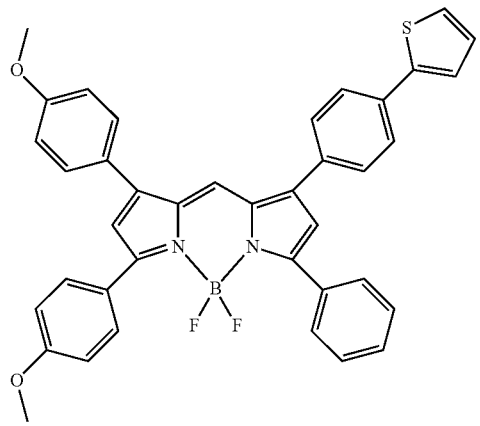
76
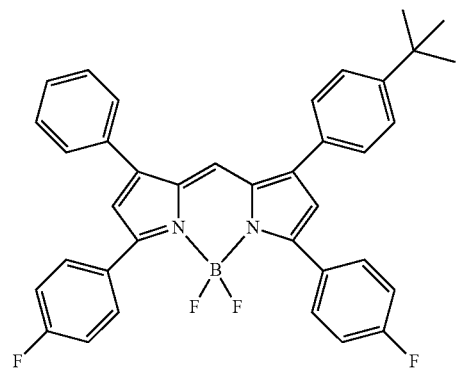
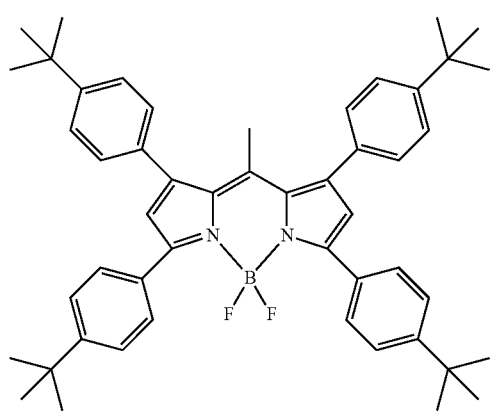
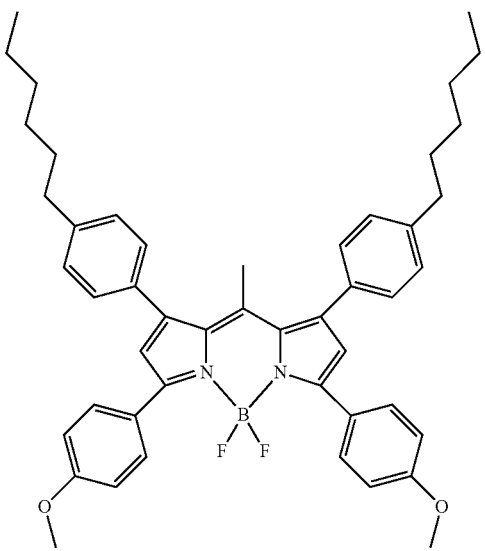
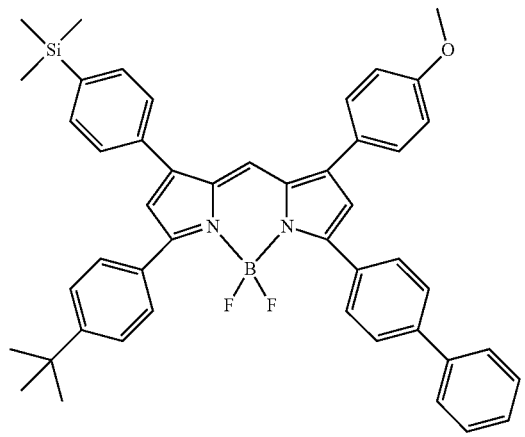
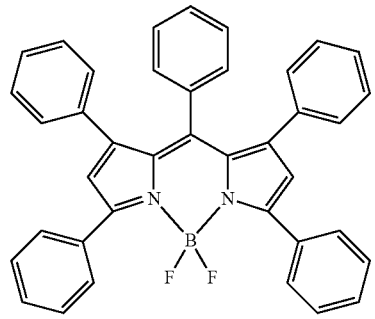

-continued
| 77 | 78 |
|---|---|
| 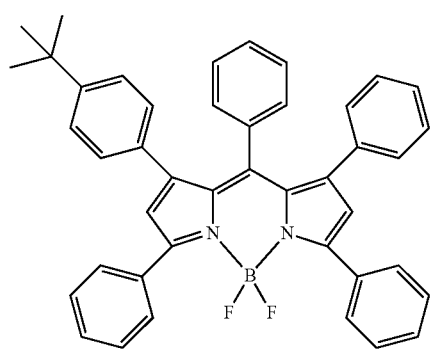 | 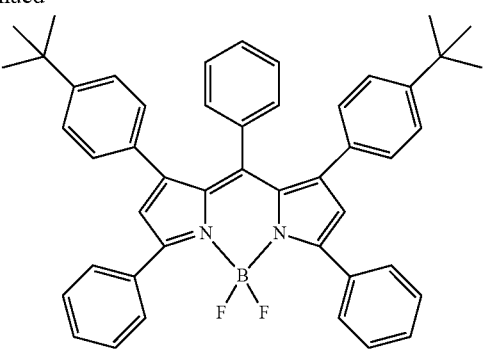 |
| 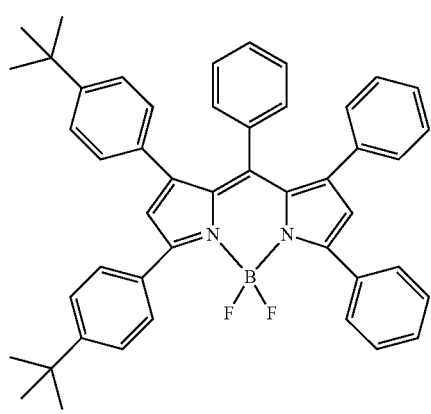 | 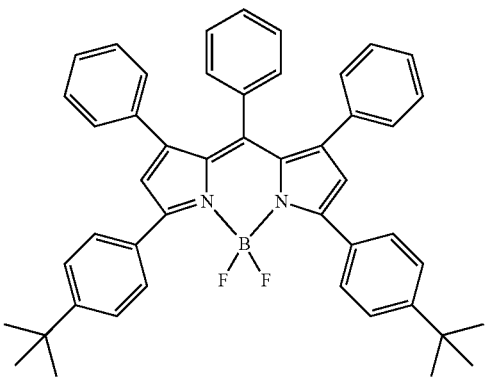 |
| 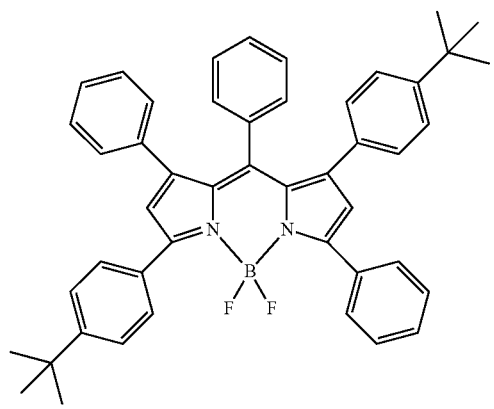 | 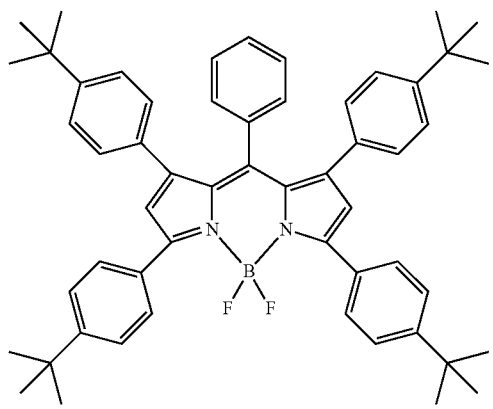 |
| 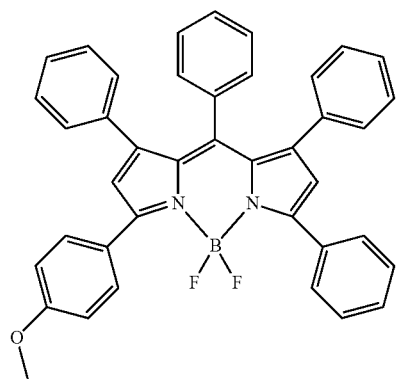 | 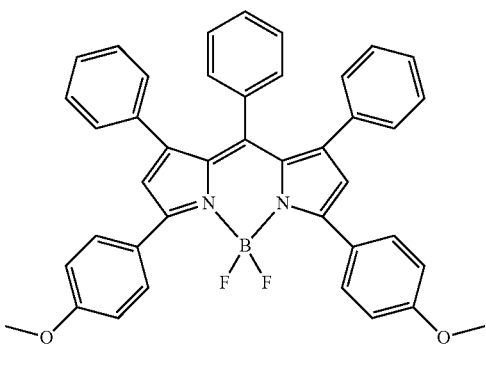 |

-continued
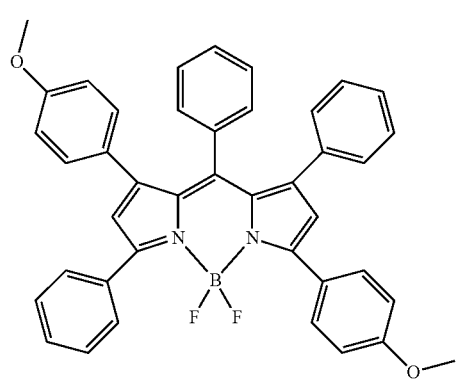
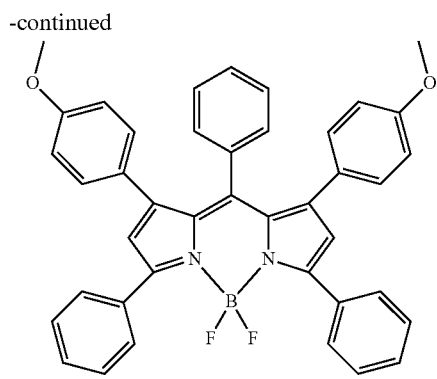
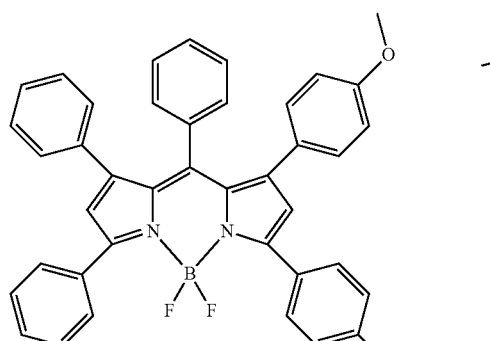
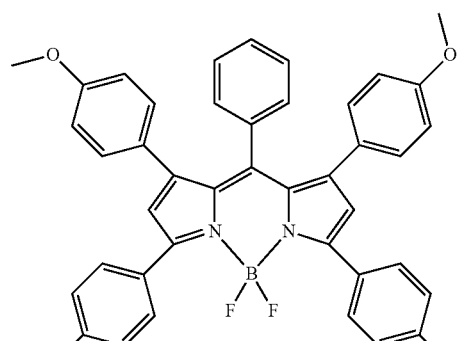
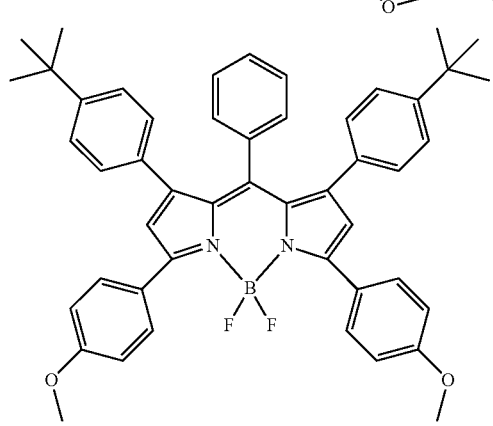
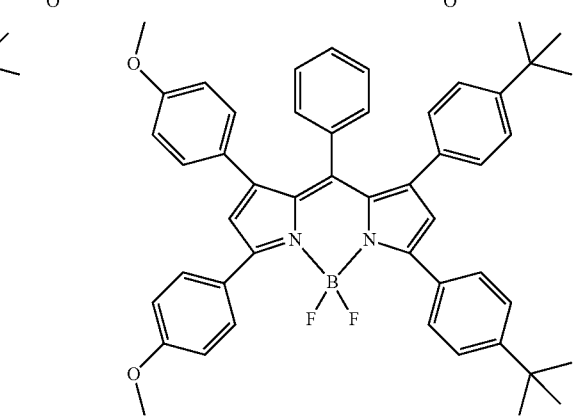
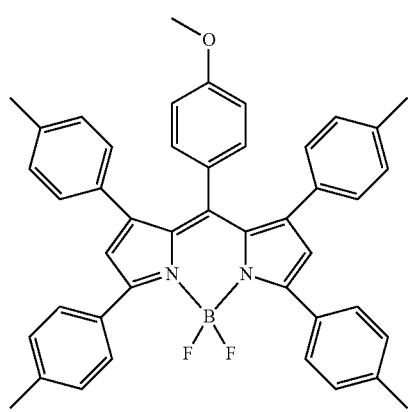
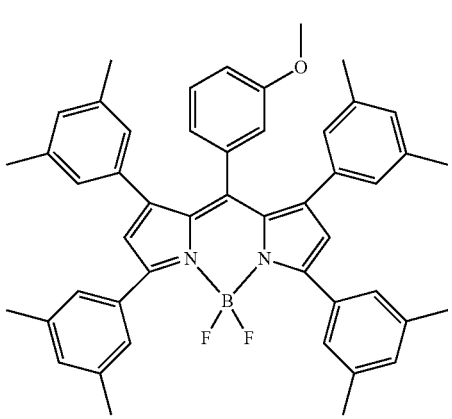

-continued
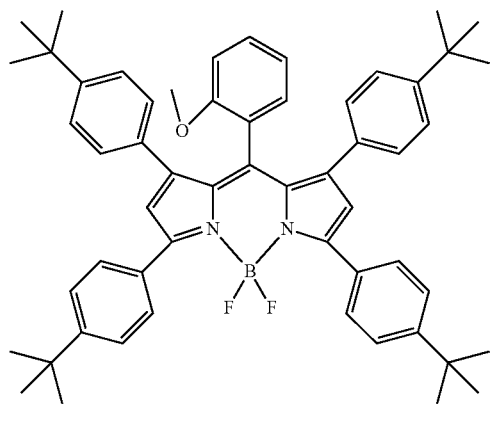
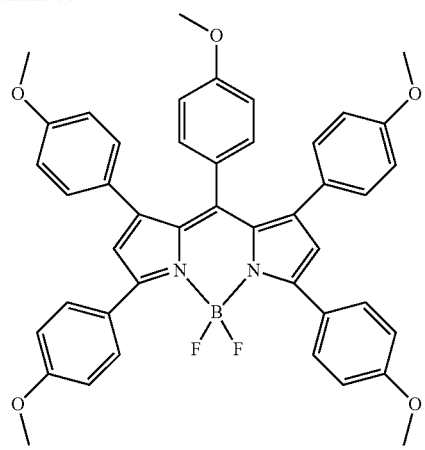
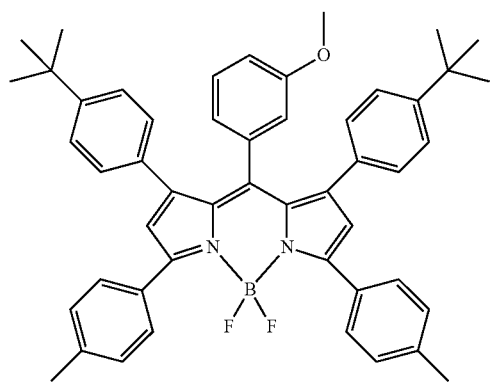
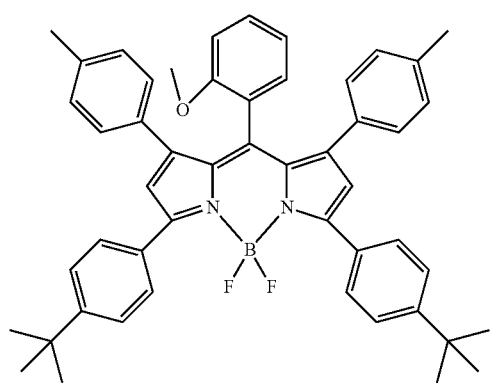
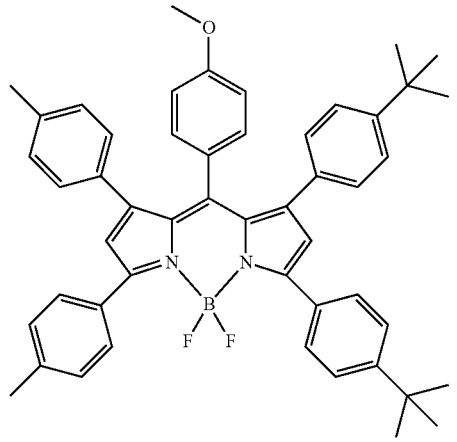
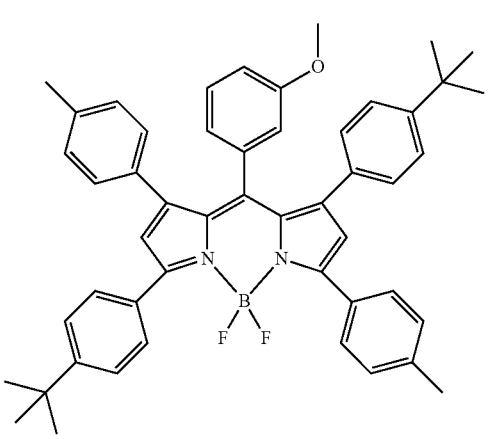
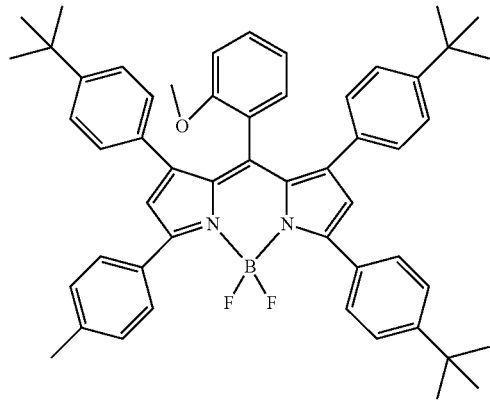
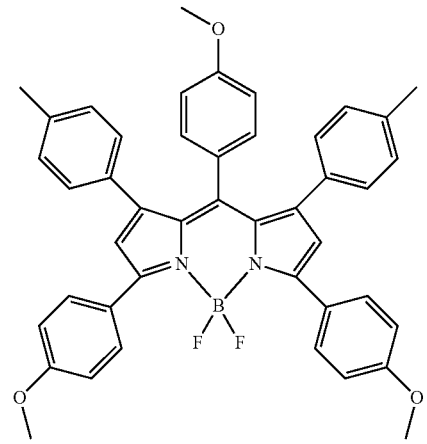

-continued
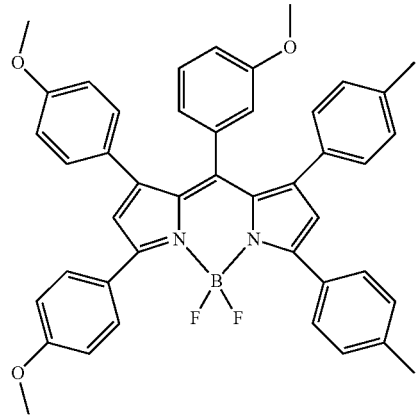
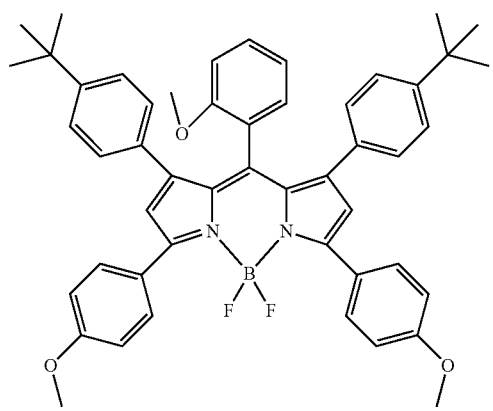
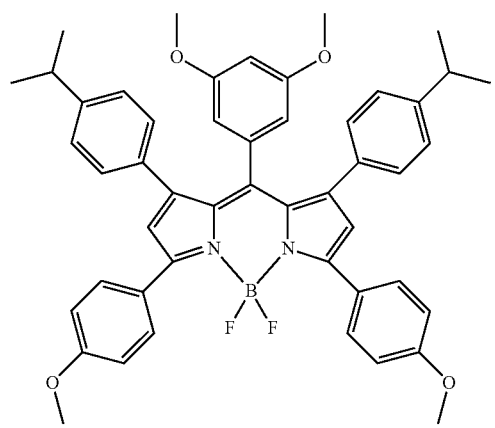
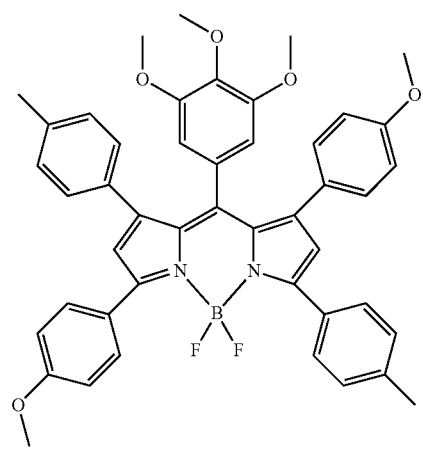
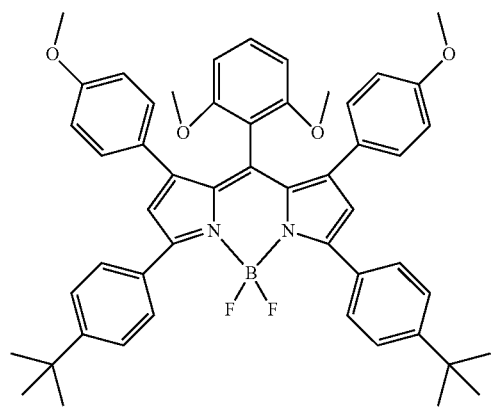
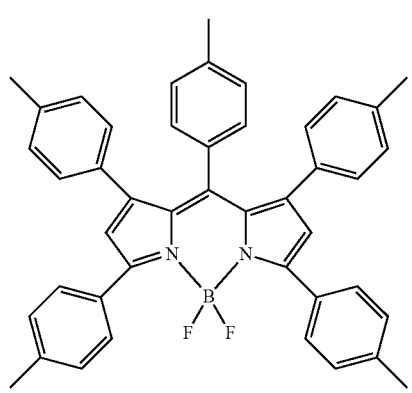

-continued
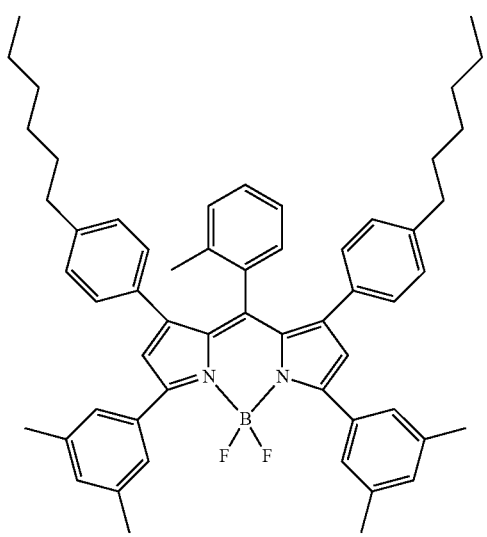
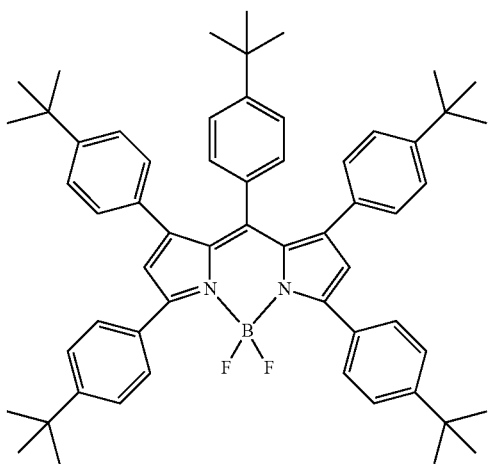
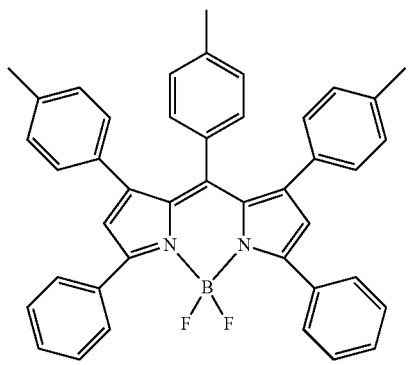
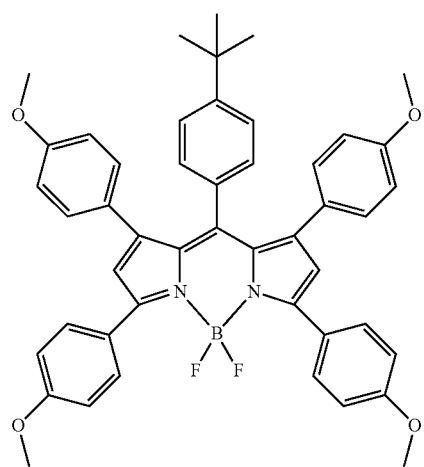
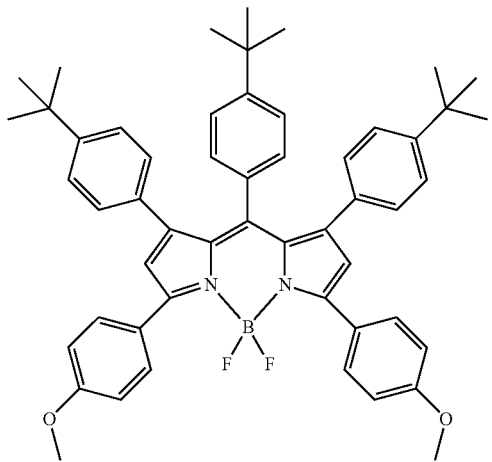
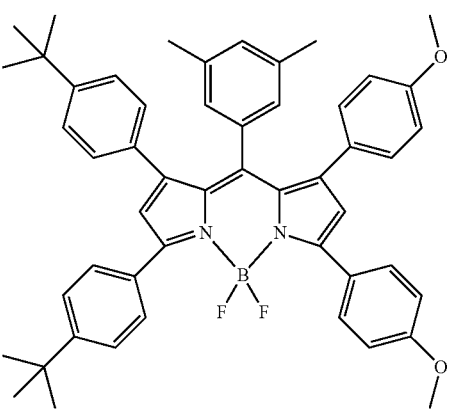

87 88
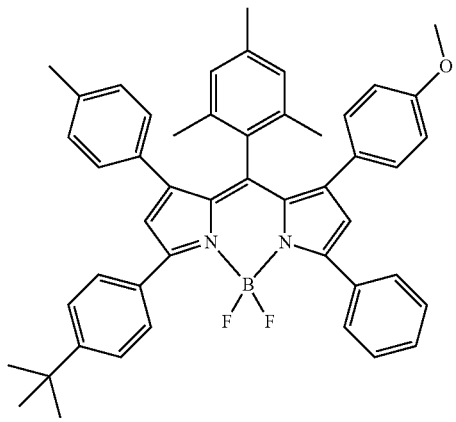 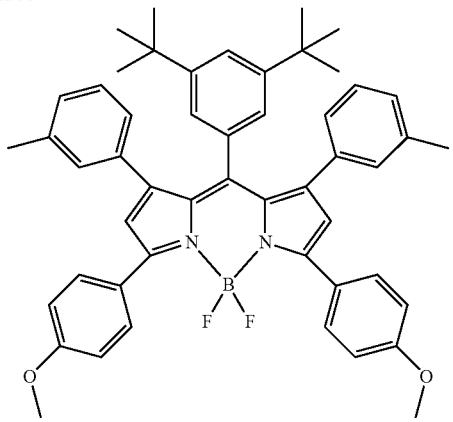
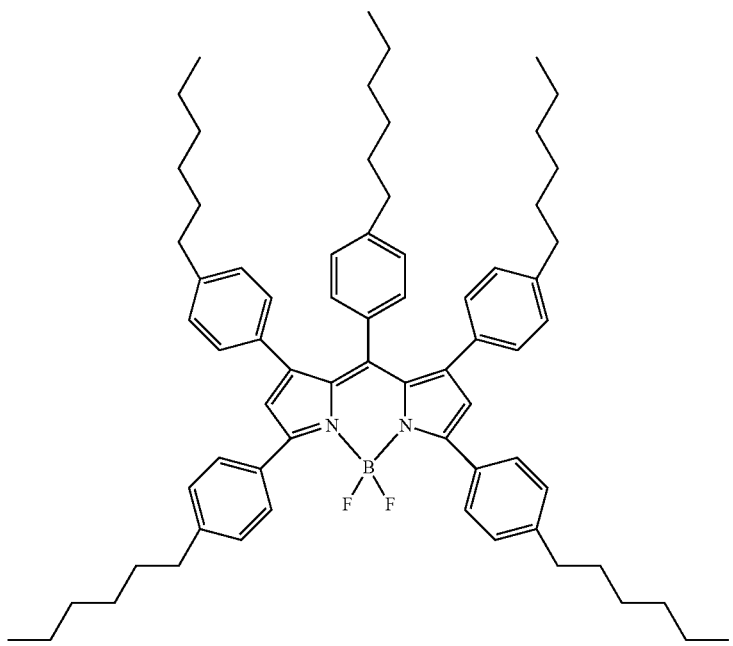
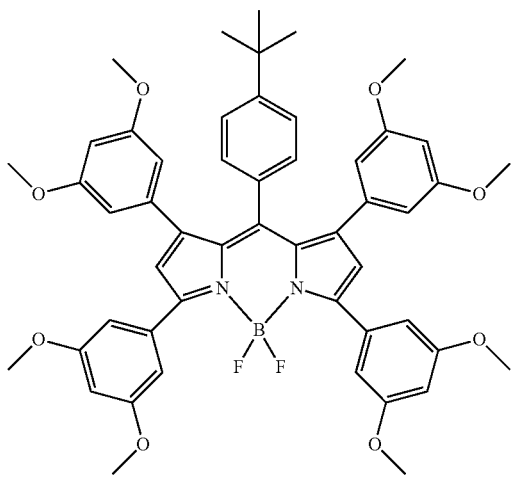 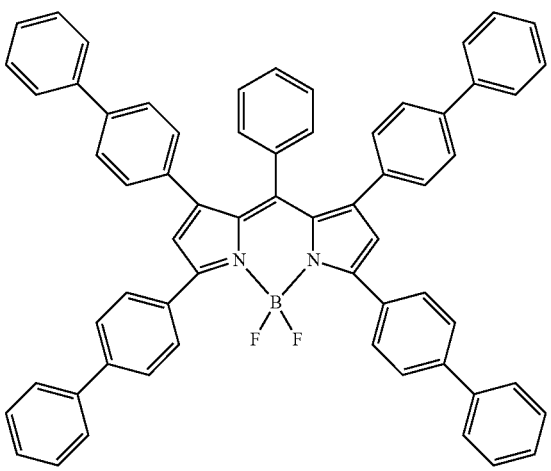

89
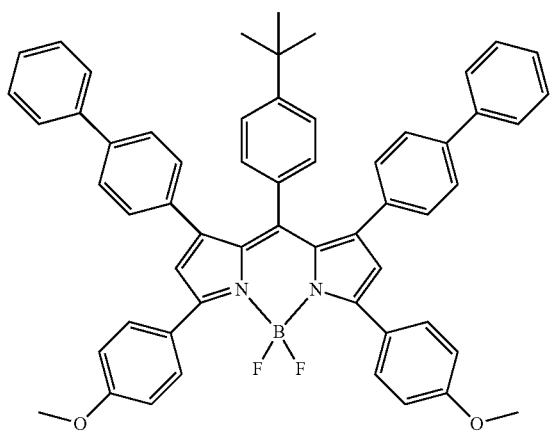
90
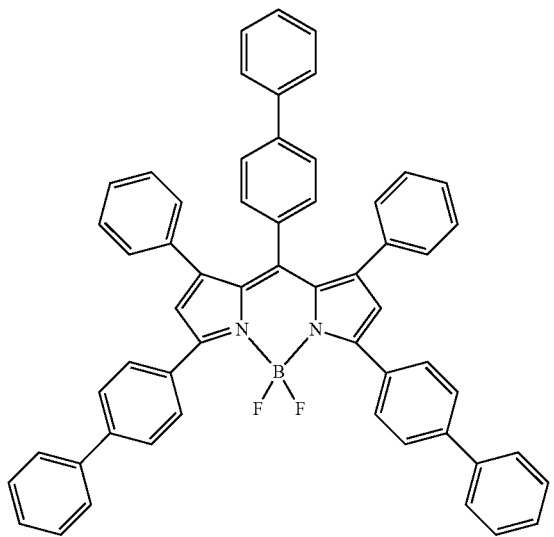
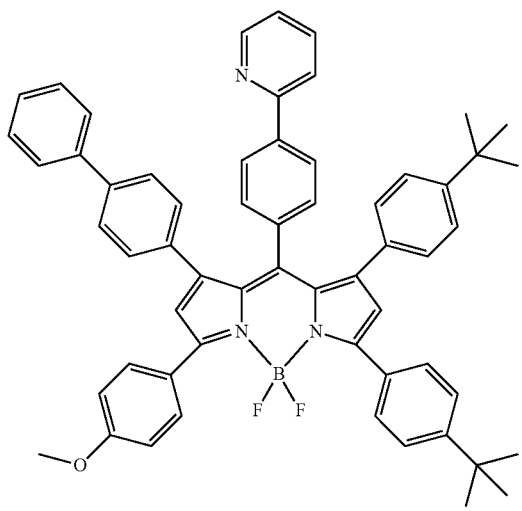
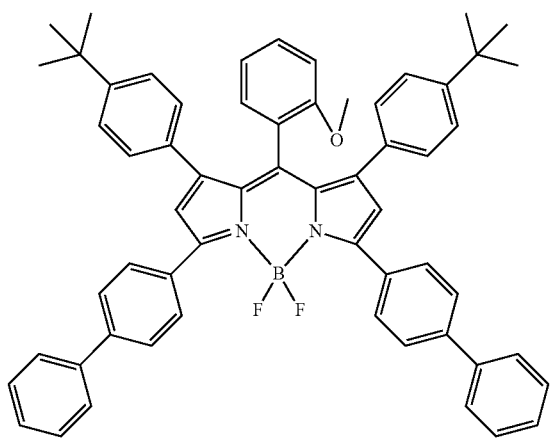
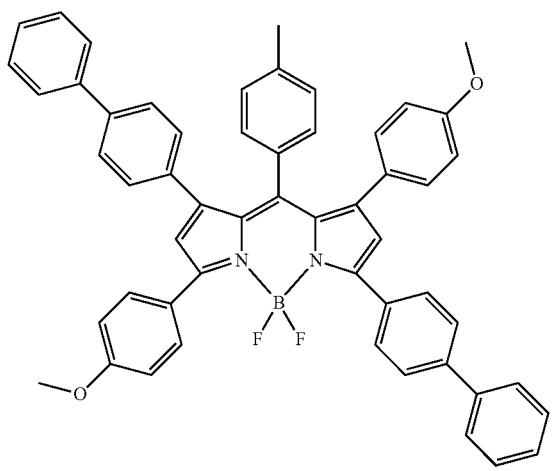

-continued
91
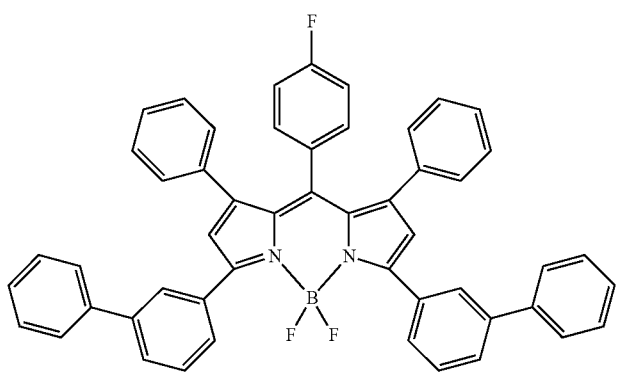
92
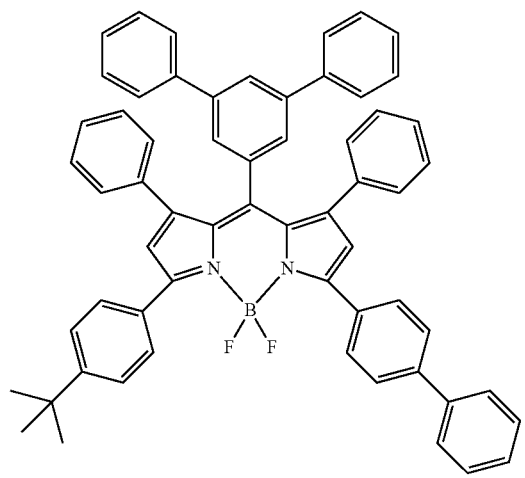
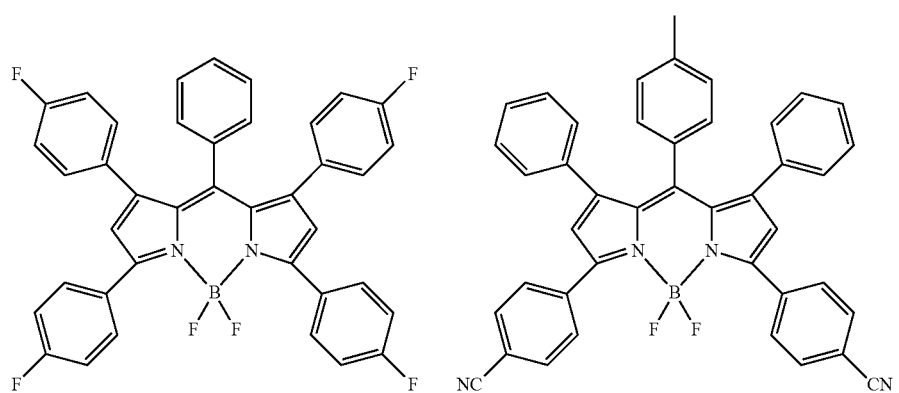
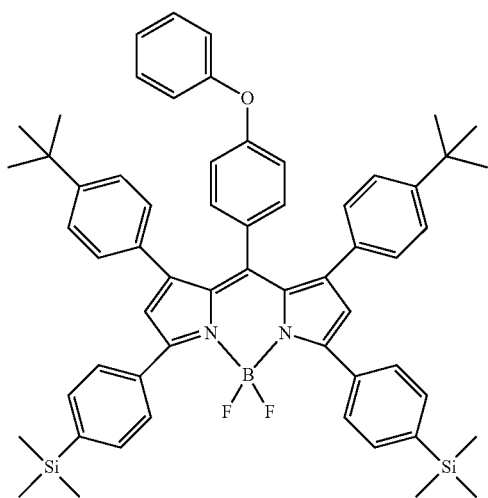
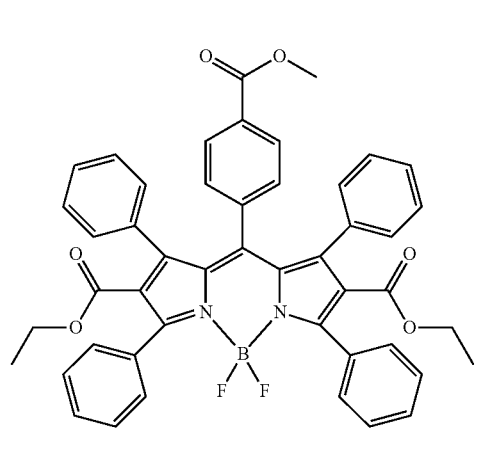

93
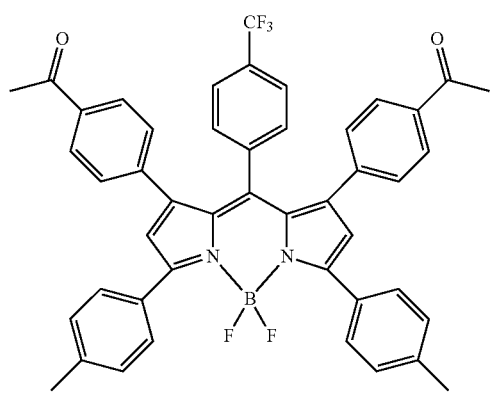
94
-continued
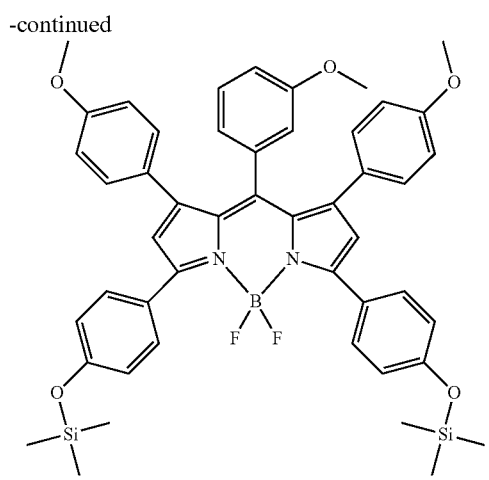
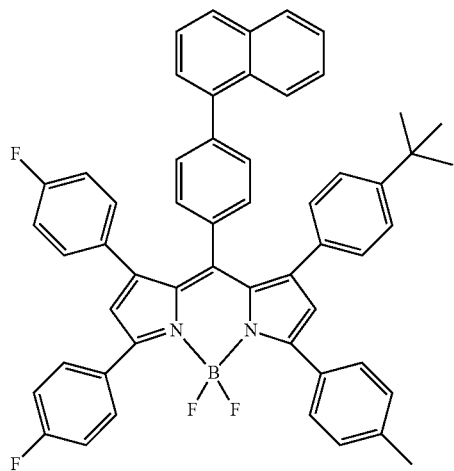
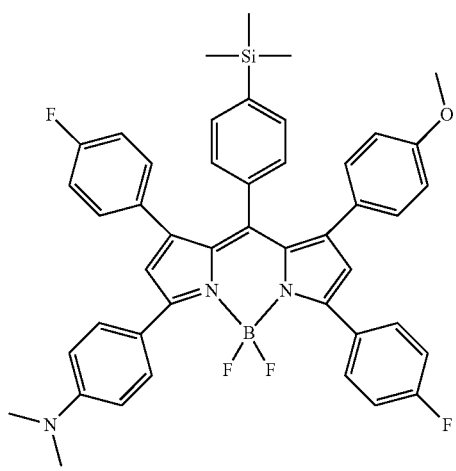
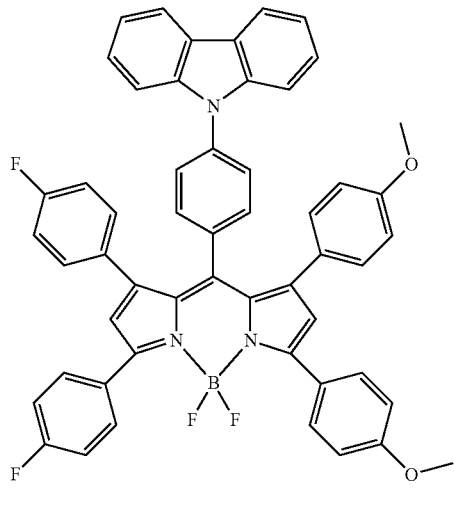
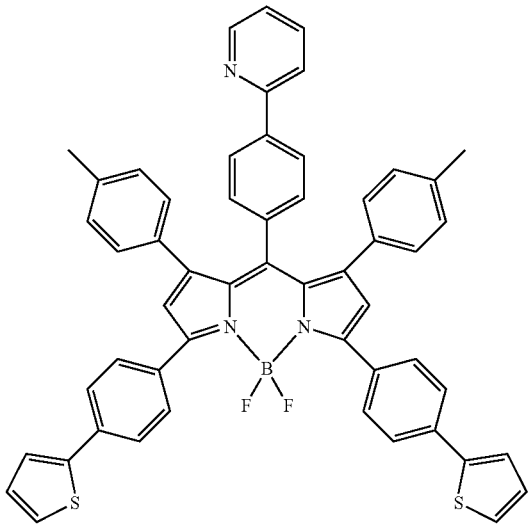

95
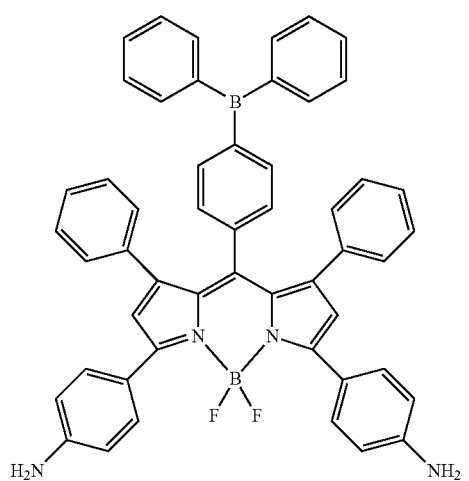
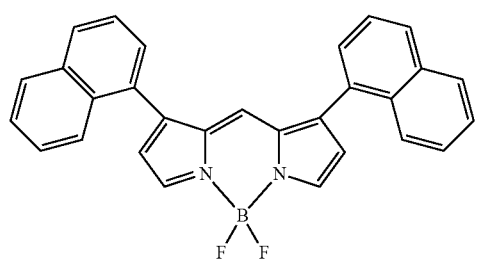
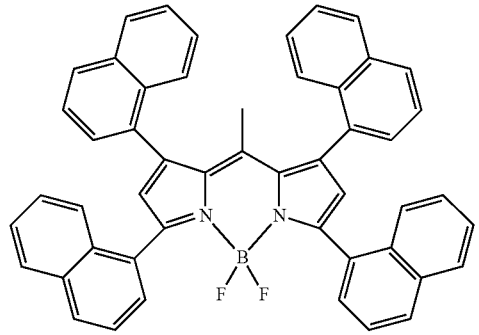
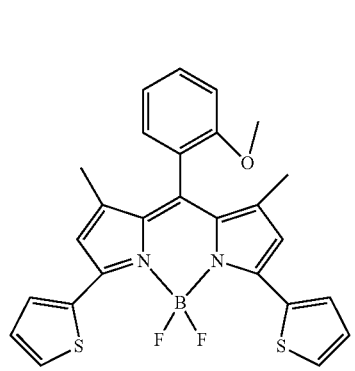
96
-continued
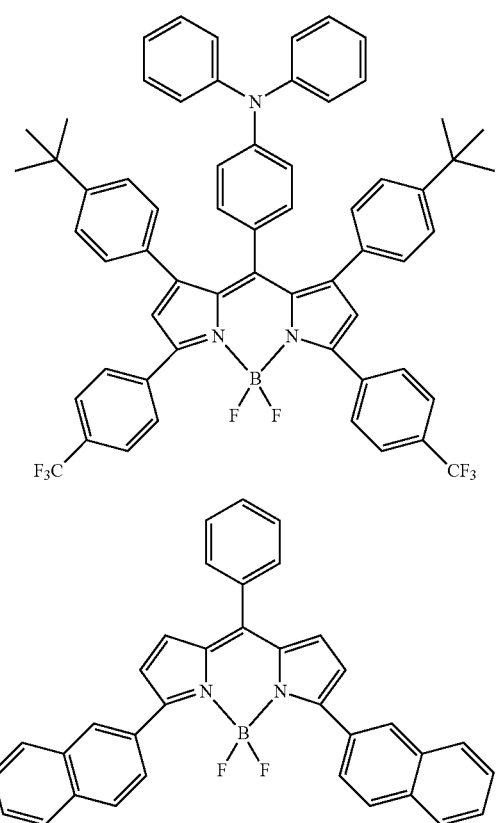
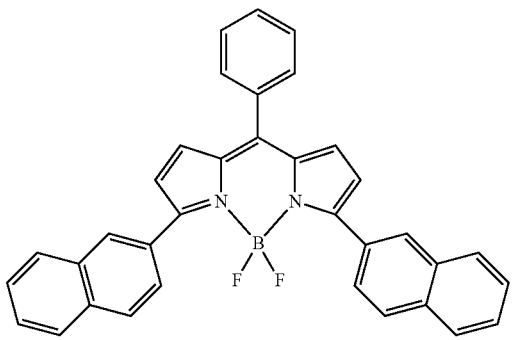
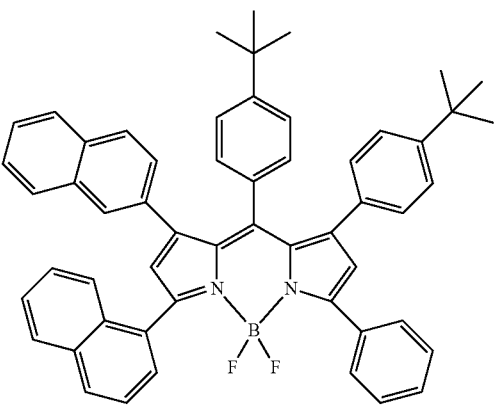
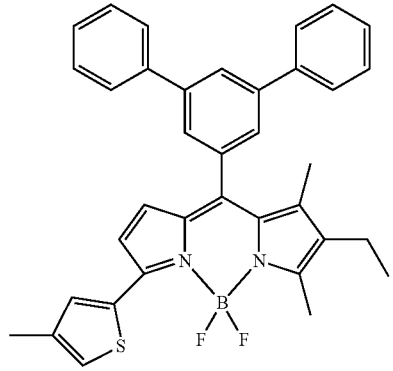
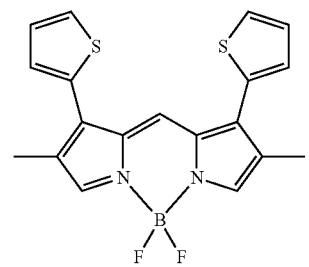

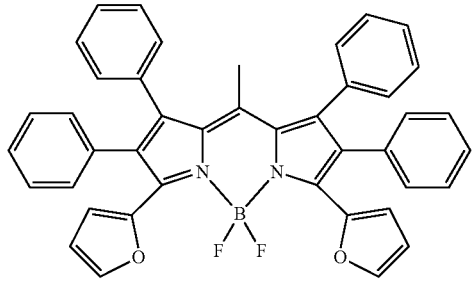
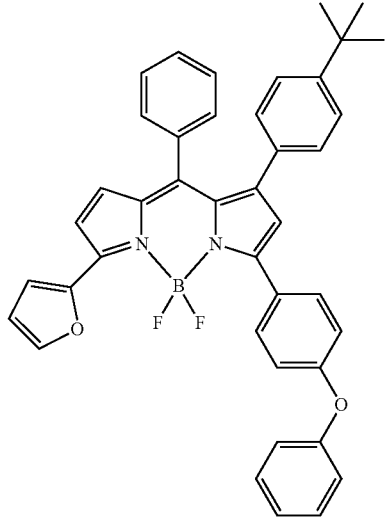
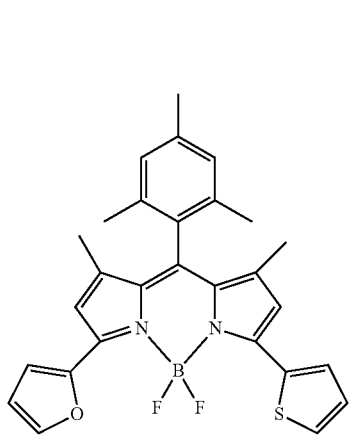
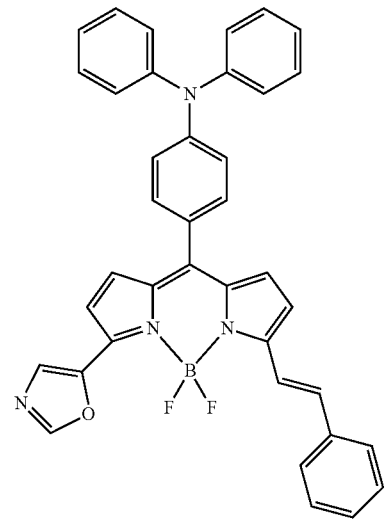
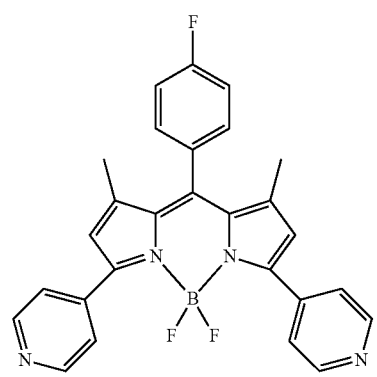
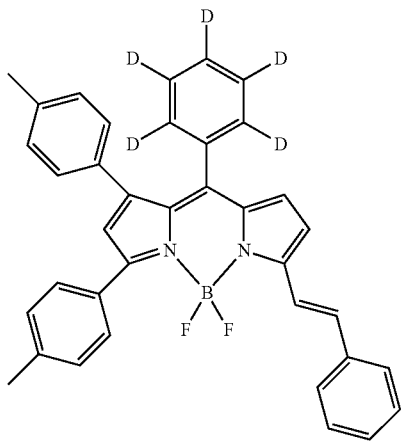
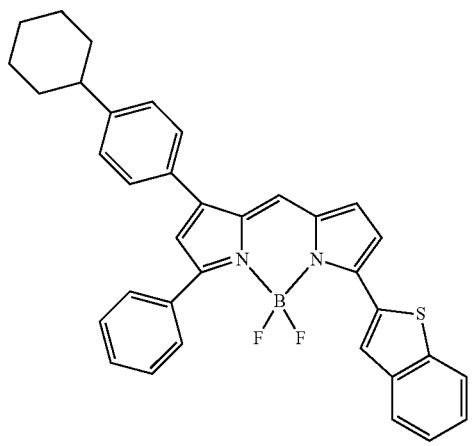

-continued
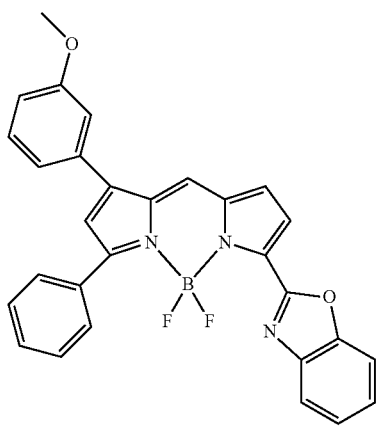
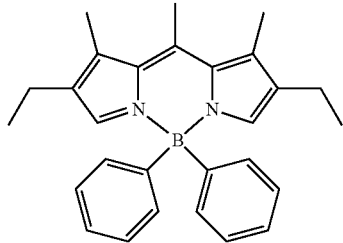
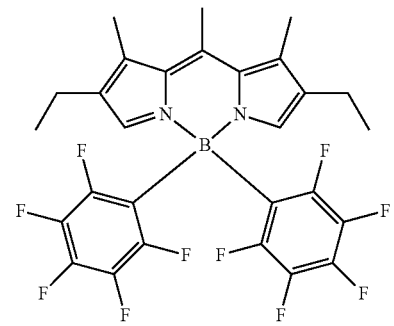
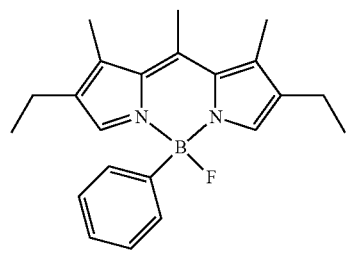
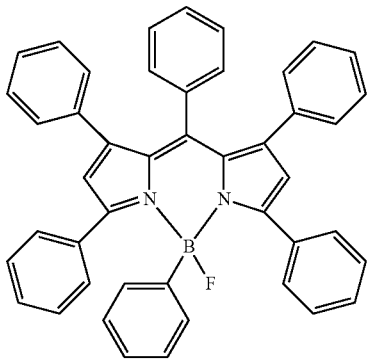
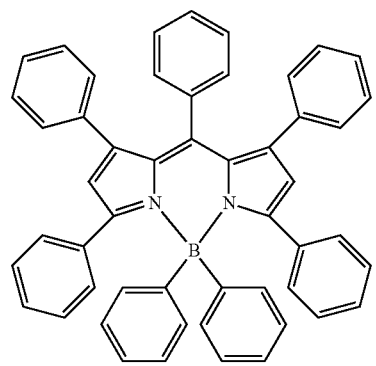
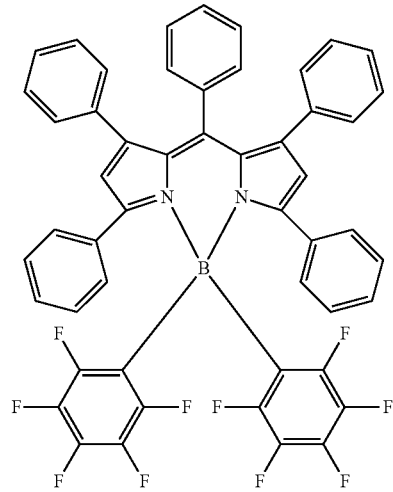
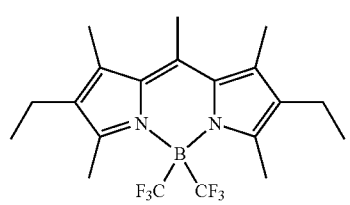
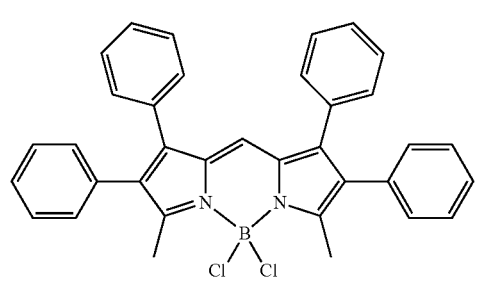
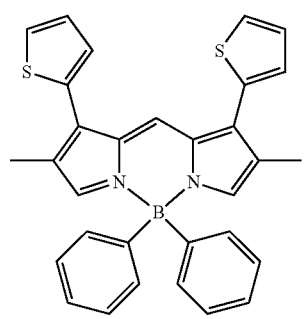

-continued
101
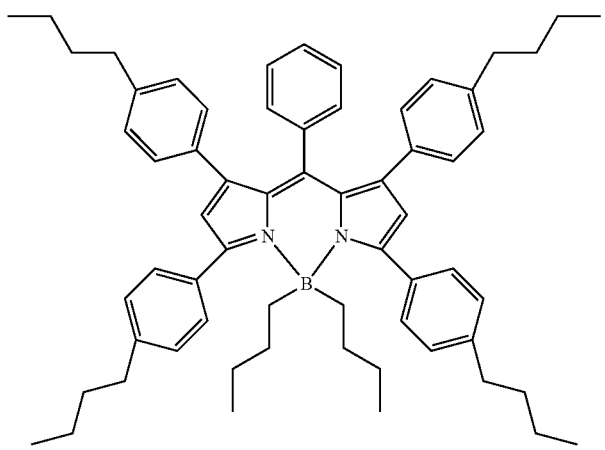
102
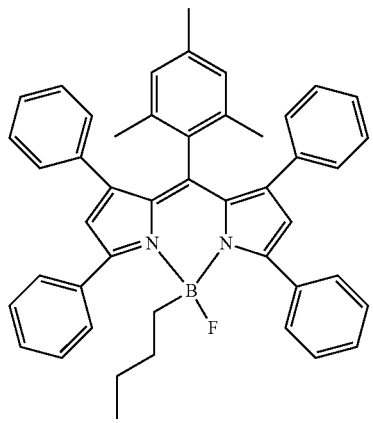
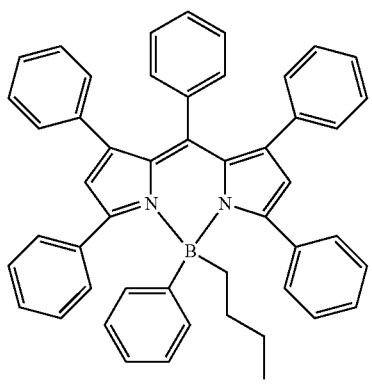
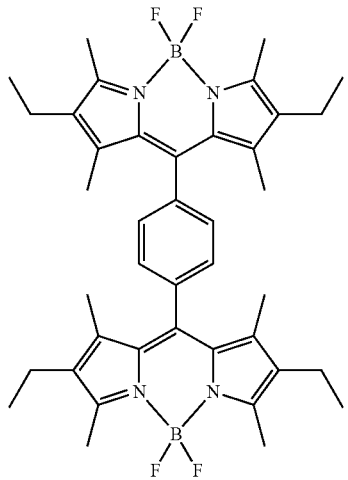
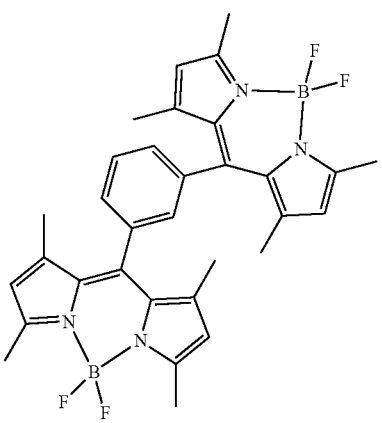
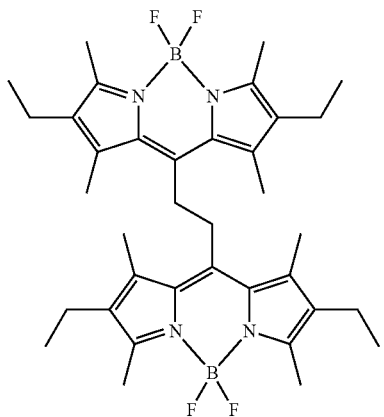
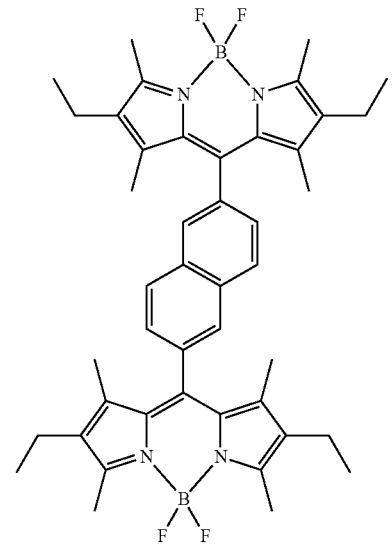

-continued
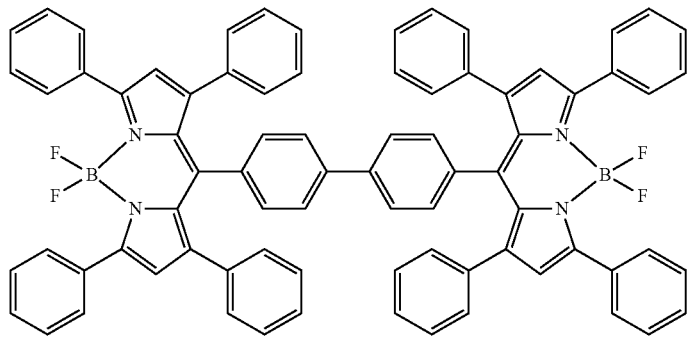
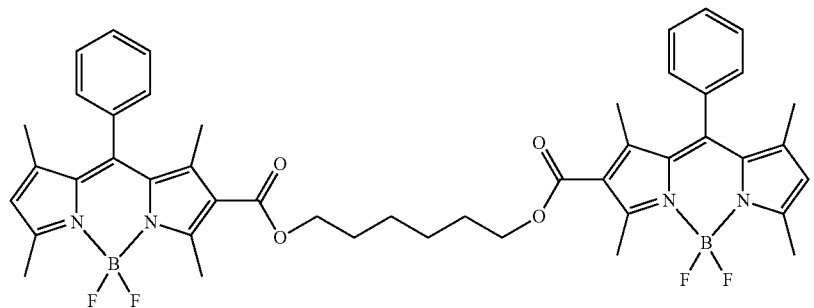
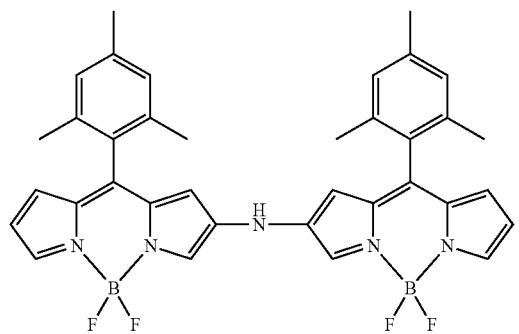
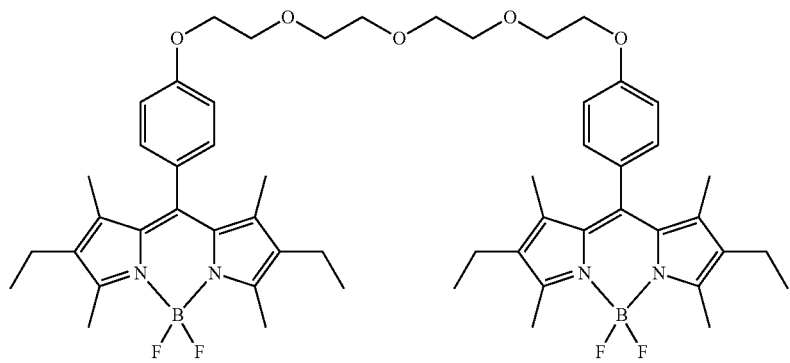

-continued
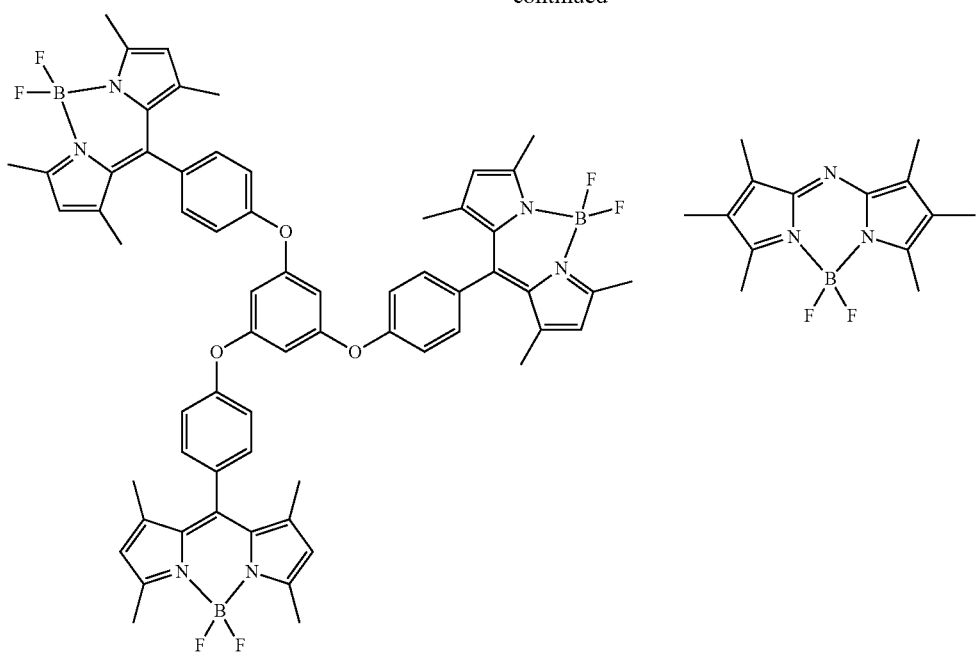
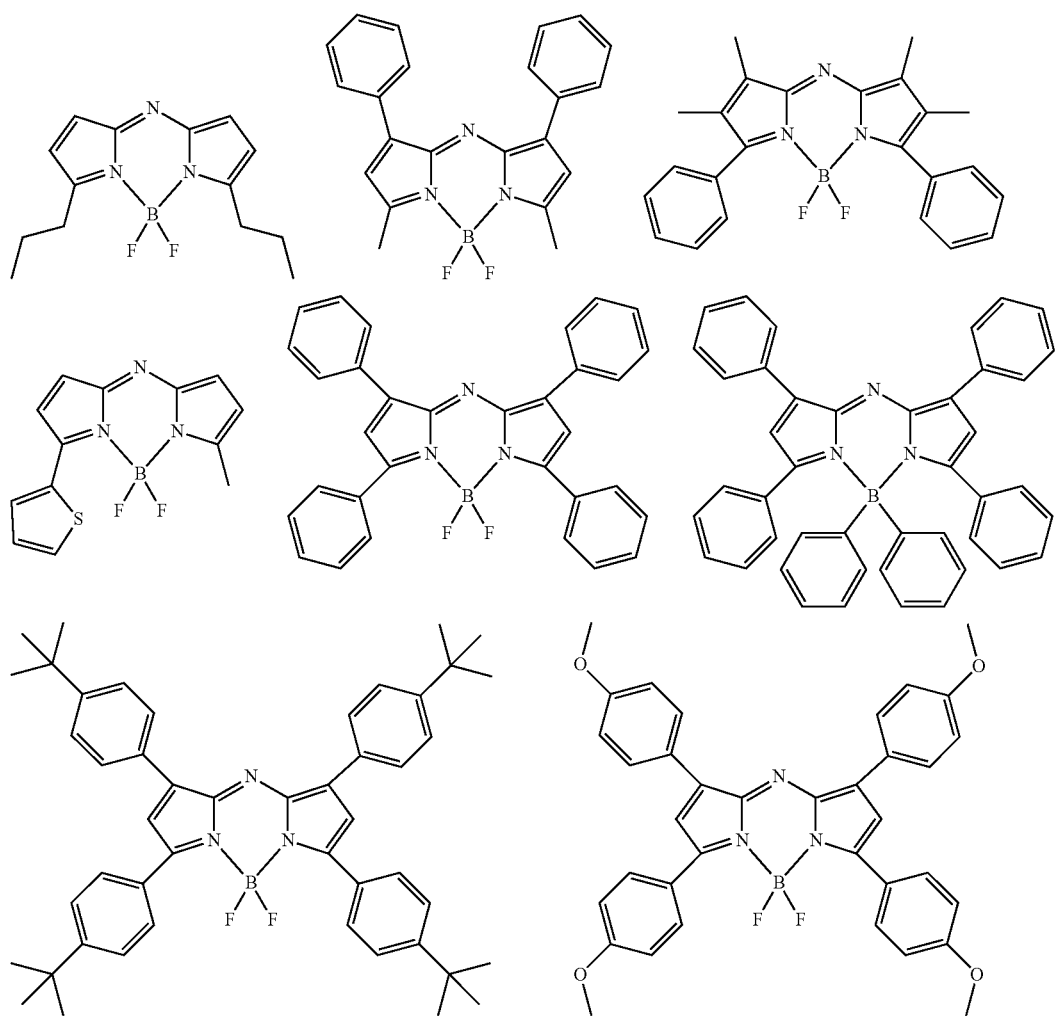

-continued
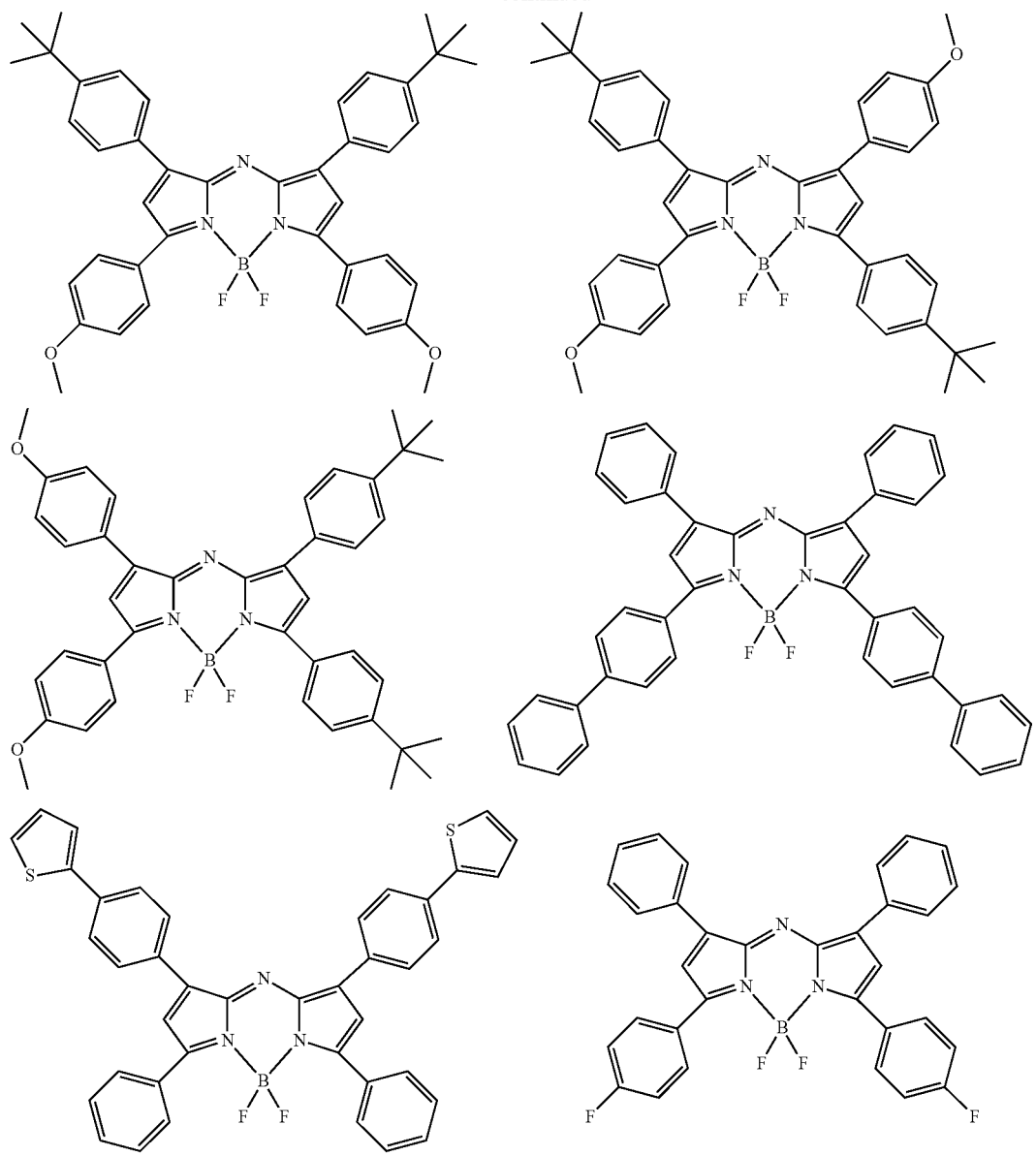
[Formula 30]
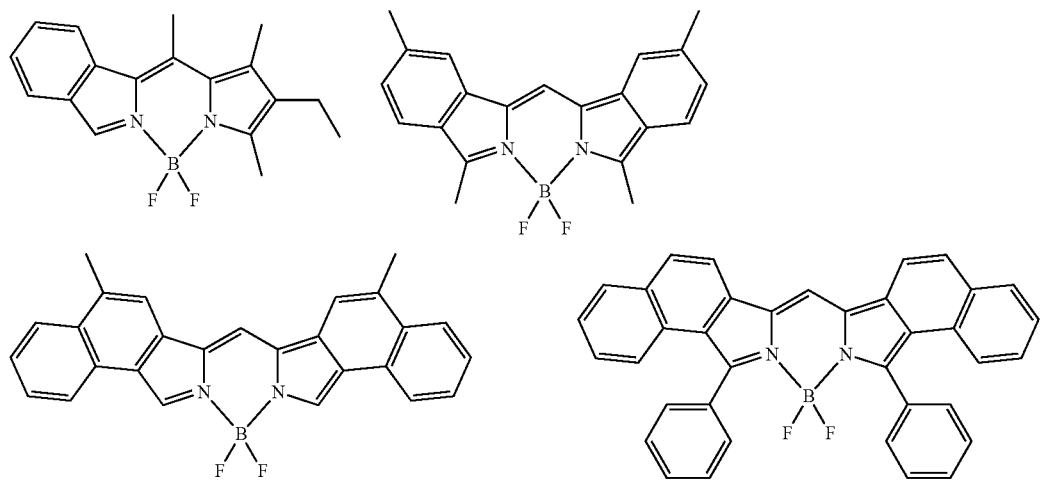

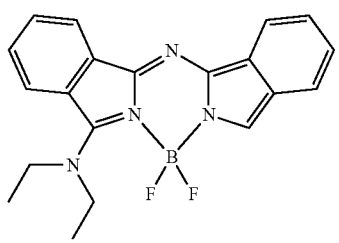

-continued

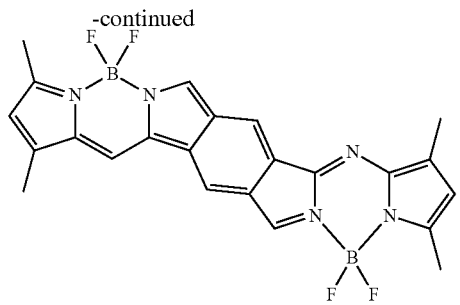

The compound of Formula (1) can be produced, for example, by a method described in Japanese Unexamined Patent Application Publication (Translation of PCT Application) No. H8-509471 or a method described in Japanese Patent Application Laid-open No. 2000-208262. More specifically, a pyrromethene-based metal complex as a target can be obtained by reacting a pyrromethene compound with a metal salt in the co-presence of a base.

As for the synthesis of a pyrromethene-boron fluoride complex, the compound of Formula (1) can be synthesized with reference to, for example, a method described in J. Org. Chem., vol. 64, No. 21, pp. 7813-7819 (1999), or Angew. Chem., Int. Ed. Engl., vol. 36, pp. 1333-1335 (1997). Examples of the method for obtaining the compound of Formula (1) include a method of heating a compound of the following Formula (3) and a compound of the following Formula (4) in 1,2-dichloroethane in the presence of phosphorus oxychloride, and then reacting the resultant mixture with a compound of the following Formula (5) in 1,2-dichloroethane in the presence of triethylamine to obtain the compound of Formula (1). However, the present invention is not limited to the above-described method. Here, $R^1$ to $R^9$ are the same as those described above. J refers to halogen.

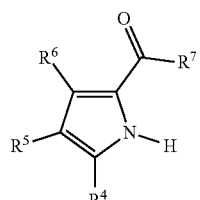

(3)

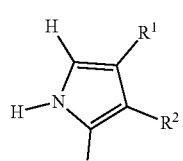

(4)

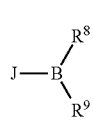

(5)

Furthermore, for introducing an aryl group or a heteroaryl group, a method of producing a carbon-carbon bond by making use of a coupling reaction between a halogenated derivative and a boronic acid or a boronic ester derivative can be mentioned, but the present invention is not limited to this method. Similarly, for introducing an amino group or a carbazolyl group, a method of producing a carbon-nitrogen bond by making use of a coupling reaction between a halogenated derivative and an amine or a carbazole derivative in the presence of a metal catalyst such as palladium can be mentioned, but the present invention is not limited to this method.

The color conversion composition of the present invention may include another compound, as needed, other than the compound of Formula (1). For example, the color conversion composition may include an assist dopant, such as rubrene, in order to further enhance the efficiency of energy transfer from excitation light to the compound of Formula (1). When a luminescent color other than a luminescent color of the compound of Formula (1) is intended to be added, a desired organic luminescent material, such as a coumarin-based dye or a rhodamine-based dye, may be added. Besides the above-mentioned organic luminescent materials, other known luminescent materials, such as inorganic fluorescent materials, fluorescent pigments, fluorescent dyes, and quantum dots, can be added in combination. Among these materials, inorganic fluorescent materials are more preferred because of their narrow full width at half maximum and durability.

Examples of the inorganic fluorescent materials include a fluorescent material that emits green light, a fluorescent material that emits blue light, a fluorescent material that emits yellow light, and a fluorescent material that emits red light. Among the inorganic fluorescent materials preferably used for the color conversion composition according to the embodiment of the present invention, examples of the fluorescent material that emits green light include $SrAl_2O_4$:Eu, $Y_2SiO_5$:Ce,Tb, $MgAl_{11}O_{19}$:Ce,Tb, $Sr_7Al_{12}O_{25}$:Eu, (at least one of Mg, Ca, Sr, and Ba)$Ga_2S_4$:Eu, and a β-sialon fluorescent material.

The β-sialon fluorescent material is a solid solution of β-silicon nitride, in which aluminum (Al) is substituted and dissolved at the position of silicon (Si) of a β-silicon nitride crystal, and oxygen (O) is substituted and dissolved at the position of nitrogen (N) of the crystal. Since there are two formula weights of atoms per unit cell (unit lattice) of β-sialon, $Si_{6-z}Al_zO_zN_{8-z}$ is used as a formula representing the β-sialon. Here, the composition z is 0 to 4.2, the solid solubility range is very wide, and the molar ratio of (Si, Al)/(N, O) needs to be kept at 3/4.

Among the above-mentioned inorganic fluorescent materials, examples of the fluorescent material that emits blue light include $Sr_5(PO_4)_3Cl$:Eu, $(SrCaBa)_5(PO_4)_3Cl$:Eu, $(BaCa)_5(PO_4)_3Cl$:Eu, (at least one of Mg, Ca, Sr, and Ba)$_2B_5O_9Cl$:Eu,Mn, and (at least one of Mg, Ca, Sr, and Ba)$(PO_4)_6Cl_2$:Eu,Mn.

Among the above-mentioned inorganic fluorescent materials, examples of the fluorescent materials that emit green to yellow light include a YAG-based fluorescent material.

Examples of the YAG-based fluorescent material include an yttrium-aluminum oxide fluorescent material activated by at least cerium, an yttrium-gadolinium-aluminum oxide fluorescent material activated at least by cerium, an yttrium-aluminum-garnet oxide fluorescent material activated by at least cerium, and an yttrium-gallium-aluminum oxide fluorescent material activated by at least cerium. Specifically, as the YAG-based fluorescent material, $Ln_3M_5O_{12}$:R and $(Y_{1-x}Ga_x)_3(Al_{1-y}Ga_y)_5O_{12}$:R may be used. In $Ln_3M_5O_{12}$:R, Ln is at least one selected from Y, Gd, and La. M includes at least one of Al and Ca. R is lanthanoid-based. In $(Y_{1-x}Ga_x)_3(Al_{1-y}Ga_y)_5O_{12}$:R, R is at least one selected from Ce, Tb, Pr, Sm, Eu, Dy, and Ho. The compositions x and y satisfy $0<x<0.5$ and $0<y<0.5$, respectively.

Among the above-mentioned inorganic fluorescent materials, examples of the fluorescent material that emits red light include $Y_2O_2S$:Eu, $La_2O_2S$:Eu, $Y_2O_3$:Eu, $Gd_2O_2S$:Eu, and $A_2MF_6$:Mn. In this fluorescent material, A is one or more of alkali metals that are selected from the group consisting of Li, Na, K, Rb, and Cs, and include at least one of Na and K. M is one or more of tetravalent elements selected from the group consisting of Si, Ti, Zr, Hf, Ge, and Sn.

Examples of the inorganic fluorescent materials that emit light in response to the blue LED, which is presently mainstream, include YAG-based fluorescent materials, such as $Y_3(Al, Ga)_5O_{12}$:Ce, $(Y, Gd)_3Al_5O_{12}$:Ce, $Lu_3Al_5O_{12}$:Ce, and $Y_3Al_5O_{12}$:Ce; TAG-based fluorescent materials, such as $Tb_3Al_5O_{12}$:Ce; silicate-based fluorescent materials, such as $(Ba, Sr)_2SiO_4$:Eu based fluorescent materials, $Ca_3Sc_2Si_3O_{12}$:Ce based fluorescent materials, and $(Sr, Ba, Mg)_2SiO_4$:Eu; nitride-based fluorescent materials, such as $(Ca, Sr)_2Si_5N_8$:Eu, $(Ca, Sr)AlSiN_3$:Eu, and $CaSiAlN_3$:Eu; oxynitride-based fluorescent materials, such as $Ca_x(Si, Al)_{12}(O, N)_{16}$:Eu; $(Ba, Sr, Ca)Si_2O_2N_2$:Eu based fluorescent materials; $Ca_8MgSi_4O_{16}Cl_2$:Eu based fluorescent materials; Mn-activated fluoride complex fluorescent materials (KSF fluorescent materials) such as $SrAl_2O_4$:Eu, $Sr_4Al_{14}O_{25}$:Eu, and $K_2SiF_6$:Mn.

Among these fluorescent materials, YAG-based fluorescent materials, TAG-based fluorescent materials, silicate-based fluorescent materials, and KSF fluorescent materials are preferably used from the viewpoints of light emission efficiency and luminance. Besides the above-mentioned fluorescent materials, known fluorescent materials may be used in accordance with applications and target luminescent colors.

The shape of the emission spectrum of an organic luminescent material is not particularly limited, but is preferably a single peak because such a shape allows the efficient use of excitation energy and leads to higher color purity. Here, the single peak indicates a state in which, other than a peak having the highest intensity, there is no peak having an intensity 5% or higher than the intensity of the highest-intensity peak in a wavelength region capable of peak formation.

Although it depends on the molar extinction coefficient, luminescence quantum yield, and absorption intensity at an excitation wavelength of the compound, and the thickness and transmittance of a color conversion sheet to be produced, the content of the organic luminescent material (A) in the color conversion composition according to the embodiment of the present invention is usually $1.0 \times 10^{-4}$ part by weight to 30 parts by weight with respect to 100 parts by weight of the resin (B). The content of the organic luminescent material (A) is more preferably $1.0 \times 10^{-3}$ part by weight to 10 parts by weight, and particularly preferably $1.0 \times 10^{-2}$ part by weight to 5 parts by weight with respect to 100 parts by weight of the resin (B).

When the color conversion composition includes both the organic luminescent material (A) exhibiting green light emission and the organic luminescent material (E) exhibiting red light emission, a part of green light emission is converted into red light emission. Hence, the content $w_a$ of the organic luminescent material (A) and the content $w_e$ of the organic luminescent material (E) in the color conversion composition preferably satisfy a relation of $w_a \geq w_e$. Furthermore, the content ratio ($w_a:w_e$) of the organic luminescent material (A) to the organic luminescent material (E) is preferably 1,000:1 to 1:1, more preferably 500:1 to 2:1, and particularly preferably 200:1 to 3:1. Note that the content $w_a$ and the content $w_e$ are each a weight percentage with respect to the weight of the resin (B).

<Resin>

(Resin with Alicyclic Structure)

The color conversion composition according to the embodiment of the present invention includes at least the organic luminescent material (A) and the resin (B) described above. The resin (B) is a resin having an alicyclic structure. The ratio of a repeating unit having the alicyclic structure in the resin (B) included in the color conversion composition is 50% by weight or higher with respect to the total amount of the resin (B). The above-described organic luminescent material (A) is easily subjected to radical oxidation due to a radical originating from a resin functional group or hygroscopic moisture, and accordingly is sometimes decomposed and deteriorates. Hence, a component of the color conversion composition including the organic luminescent material (A) preferably has fewer organic functional groups and is less hygroscopic. As described above, the resin (B) included in the color conversion composition has an alicyclic structure, and is configured such that the ratio of a repeating unit having the alicyclic structure in the resin (B) is 50% by weight or higher with respect to the total amount of the resin (B), whereby the resin (B) has a stiff resin structure and a smaller free volume. Thus, when the resin (B) in the color conversion composition is less hygroscopic, the durability of the organic luminescent material (A) can be enhanced. The ratio of a repeating unit having the alicyclic structure in the resin (B) is 50% by weight or higher, more preferably 70% by weight or higher, and particularly preferably 90% by weight or higher with respect to the total amount of the resin (B). The use of, as the resin (B), a resin in which the ratio of a repeating unit having the alicyclic structure is 50% by weight or higher allows the color conversion composition to have higher durability.

The resin (B) having the alicyclic structure is a polymer having an alicyclic structure in at least a part of a main chain and a side chain. Examples of the alicyclic structure include a saturated cyclic hydrocarbon (cycloolefin) structure and an unsaturated cyclic hydrocarbon (cycloalkene) structure. Among these structures, a cycloolefin structure is preferred from the viewpoint of durability.

Among these resins each having an alicyclic structure, the resin having a cycloolefin structure in at least a part of a main chain and a side chain is preferred. Hereinafter, such a resin is referred to as a cycloolefin resin.

The alicyclic structure may be in a main chain of the resin (B) or may be in a side chain of the resin (B), but, from the viewpoint of achieving less hygroscopicity, the resin (B) preferably has an alicyclic structure in the main chain thereof. The number of carbon atoms constituting an alicyclic structure is not particularly limited, but is usually 4 to 30, preferably 5 to 20, and more preferably 5 to 15. When the number of carbon atoms constituting an alicyclic structure is within these ranges, the color conversion composition has high durability while the compatibility between the resin (B) and the organic luminescent material (A) is retained.

The lower limit of the weight-average molecular weight (Mw) of the resin (B) having an alicyclic structure is, for example, 5,000 or higher, preferably 15,000 or higher, and more preferably 20,000 or higher. The upper limit of this weight-average molecular weight is, for example, 500,000 or lower, preferably 100,000 or lower, and more preferably 50,000 or lower. When this weight-average molecular weight is within the above-mentioned range, the color conversion composition having good compatibility between the resin (B) and the organic luminescent material (A) and having higher durability can be obtained.

The weight average molecular weight in the present invention is a value measured by gel permeation chromatography (GPC). Specifically, the weight average molecular weight in the present invention is a value determined in terms of polystyrene by using a GPC device (HLC-82A, manufactured by Tosoh Corporation) under predetermined conditions (developing solvent: cyclohexane, developing rate: 1.0 mL/min, column: TSKgelG2000HXL, manufactured by Tosoh Corporation) after the filtration of a sample with a membrane filter having a pore diameter of 0.45 µm.

The glass transition temperature (Tg) of the resin (B) having the alicyclic structure is preferably 50° C. or higher and 200° C. or lower, more preferably 80° C. or higher and 130° C. or lower, and still more preferably 100° C. or higher and 125° C. or lower. When the glass transition temperature of the resin (B) is within the above-described range, the color conversion sheet formed from the color conversion composition including the resin (B), for example, can exhibit higher durability. The glass transition temperature is a value determined by measurements using a differential scanning calorimeter at a temperature rise rate of 0.5° C./min. Specific examples of the measuring device include a differential scanning calorimeter manufactured by Seiko Instruments Inc. (trade name: DSC 6220).

Specific examples of the resin (B) having the alicyclic structure include (1) a norbornene resin, (2) a monocyclic cycloolefin resin, (3) a cyclic conjugated diene resin, and (4) a vinyl alicyclic hydrocarbon resin. Among these resins, a norbornene resin and a monocyclic cycloolefin resin are preferred from the viewpoint of durability. In particular, more preferred is a cycloolefin resin having at least one of a norbornene resin and a monocyclic cycloolefin resin in at least a part of a main chain or a side chain of the resin structure. Note that, in the present invention, these resins include not only polymerization reaction products, but also hydrides thereof.

(Norbornene Resin)

Norbornene resin is a polymer of a norbornene-based monomer or a hydride thereof. Examples of the norbornene resin include a ring-opening polymer of a norbornene-based monomer, a ring-opening polymer of a norbornene-based monomer and a ring-opening copolymerizable monomer, hydrides of these ring-opening polymers, an addition polymer of a norbornene-based monomer, an addition polymer of a norbornene-based monomer and an addition copolymerizable monomer. Among these polymers and hydrides, a hydride of a ring-opening polymer of a norbornene-based monomer is preferred from the viewpoint of durability. The above-mentioned ring-opening copolymerizable monomer is a monomer (other monomers) different from a norbornene-based monomer, and is capable of ring-opening polymerization with the norbornene-based monomer. The above-mentioned addition copolymerizable monomer is a monomer different from a norbornene-based monomer, and is capable of addition copolymerization with the norbornene-based monomer.

Examples of the norbornene-based monomer include bicyclo[2.2.1]hept-2-ene (common name: norbornene) and derivatives thereof (having a substituent in a ring), tricyclo[4.3.01,6.12,5]deca-3,7-diene (common name: dicyclopentadiene) and derivatives thereof, 7,8-benzotricyclo[4.3.0.12,5]deca-3-ene (common name: methanotetrahydrofluorene (also referred to as 1,4-methano-1,4,4a,9a-tetrahydrofluorene)) and derivatives thereof, and tetracyclo[4.4.0.12,5.17,10]dodec-3-ene (common name: tetracyclododecene) and derivatives thereof. Examples of the substituent include an alkyl group, an alkylene group, a vinyl group, an alkoxycarbonyl group, and an alkylidene group.

Examples of the norbornene-based monomer having the substituent include 8-methoxycarbonyl-tetracyclo[4.4.0.12,5.17,10]dodec-3-ene, 8-methyl-8-methoxycarbonyl-tetracyclo[4.4.0.12,5.17,10]dodec-3-ene, and 8-ethylidene-tetracyclo[4.4.0.12,5.17,10]dodec-3-ene.

These norbornene-based monomers may be used alone or in combination of two or more of them. Examples of the other monomers (the above-mentioned ring-opening copolymerizable monomer) capable of ring-opening copolymerization with the norbornene-based monomer include a monocyclic cycloolefin-based monomer. Examples of the monocyclic cycloolefin-based monomer include cyclohexene, cycloheptene, and cyclooctene.

Examples of the other monomers capable of addition copolymerization with the norbornene-based monomer (the above-mentioned addition copolymerizable monomer) include a $C_{2-20}$ α-olefin and derivatives thereof, cycloolefin and derivatives thereof, and a non-conjugated diene. Examples of the $C_{2-20}$ α-olefin include ethylene, propylene, 1-butene, 1-pentene, and 1-hexene. Examples of the cycloolefin include cyclobutene, cyclopentene, cyclohexene, cyclooctene, and 3a,5,6,7a-tetrahydro-4,7-methano-1H-indene. Examples of the non-conjugated diene include 1,4-hexadiene, 4-methyl-1,4-hexadiene, 5-methyl-1,4-hexadiene, and 1,7-octadiene. Among them, the α-olefin is preferred, and in particular, ethylene is more preferred.

The ring-opening polymer of the norbornene-based monomer or the ring-opening polymer of the norbornene-based monomer and the ring-opening copolymerizable monomer can be synthesized by polymerizing monomer components in the presence of a known ring-opening polymerization catalyst. Examples of the ring-opening polymerization catalyst include a catalyst comprising a halide of metal such as ruthenium or osmium, nitrate or an acetylacetone compound, and a reducing agent; or a catalyst comprising a halide of metal such as titanium, zirconium, tungsten, or molybdenum, or an acetylacetone compound, and an organoaluminum compound. The ring-opening polymer hydride of the norbornene-based monomer can be usually produced by adding a known hydrogenation catalyst containing a transition metal such as nickel or palladium to a polymerization solution of the above-mentioned ring-opening polymer to hydrogenate a carbon-carbon unsaturated bond.

The addition polymer of the norbornene-based monomer or the addition polymer of the norbornene-based monomer and the addition copolymerizable monomer can be synthesized by polymerizing monomer components in the presence of a known addition polymerization catalyst. Examples of the addition polymerization catalyst include, but are not limited to, a catalyst comprising titanium, zirconium or a vanadium compound, and an organoaluminum compound.

(Monocyclic Cycloolefin Resin)

Examples of the monocyclic cycloolefin resin include addition polymers of monocyclic cycloolefin-based monomers, such as cyclohexene, cycloheptene, and cyclooctene. Methods for synthesizing these addition polymers are not particularly limited, and known methods may be appropriately used.

(Cyclic Conjugated Diene Resin)

Examples of the cyclic conjugated diene resin include polymers obtained by 1,2-addition polymerization or 1,4-addition polymerization of cyclic conjugated diene-based monomers, such as cyclopentadiene and cyclohexadiene, and hydrides of the polymers. Methods for synthesizing these addition polymers are not particularly limited, but, known methods may be appropriately used.

(Vinyl Alicyclic Hydrocarbon Resin)

Examples of the vinyl alicyclic hydrocarbon resin include a polymer of a vinyl alicyclic hydrocarbon-based monomer and a hydride thereof, and a hydride of an aromatic ring moiety of a polymer of a vinyl aromatic-based monomer. Examples of the vinyl alicyclic hydrocarbon-based monomer include vinylcyclohexene and vinylcyclohexane. Examples of the vinyl aromatic-based monomer include styrene and α-methylstyrene. The vinyl alicyclic hydrocarbon resin may be a copolymer of a vinyl alicyclic hydrocarbon monomer or a vinyl aromatic monomer and another monomer copolymerizable with these monomers. Examples of such a copolymer include a random copolymer and a block copolymer.

Methods for synthesizing these resins are not particularly limited, but, known methods may be appropriately used. Furthermore, a commercially available resin may be used as the resin (B) having the alicyclic structure. Examples of the commercially available resin include APEL (registered trademark) manufactured by Mitsui Chemicals, Inc., ARTON (registered trademark) manufactured by JSR Corporation, and TOPAS (registered trademark) manufactured by Polyplastics Co., Ltd. Examples of APEL (registered trademark) manufactured by Mitsui Chemicals, Inc., include APL5014DP, APL6011T, APL6013T, APL6015T, APL5514ML, and APL6013T. Examples of ARTON (registered trademark) manufactured by JSR Corporation include D5450, D4540, D4531, D4531F, D4532, D4520, F5023, F4520, G7810, RH5200, and FX4727. Examples of TOPAS (registered trademark) manufactured by Polyplastics Co., Ltd. include TOPAS6017S, TOPAS6015S, TOPAS6013S, TOPAS6013F, TOPAS6013M, TOPAS5013S, TOPAS5013F, TOPAS8007F, TOPAS8007S, TOPAS8007X, TOPAS9506F, and TOPAS9903D. However, the present invention is not limited to these commercially available resins.

(Thermoplastic Resin)

The color conversion composition according to the embodiment of the present invention preferably further includes a thermoplastic resin (C) different from the resin (B). Specific examples of the thermoplastic resin (C) include known resins, such as photocurable-type resist materials having a reactive vinyl group, such as acrylic, methacrylic, polyvinyl cinnamate-based, polyimide-based, and cyclized rubber-based materials; an epoxy resin, a silicone resin (including organopolysiloxane cured products (crosslinked products) such as silicone rubber and silicone gel), a urea resin, a fluororesin, a polycarbonate resin, an acrylic resin, a methacrylic resin, a polyimide resin, a polyethylene terephthalate resin, a polypropylene resin, a polystyrene resin, a urethane resin, a melamine resin, a polyvinyl resin, a polyamide resin, a phenol resin, a polyvinyl alcohol resin, a cellulose resin, an aliphatic ester resin, an aromatic ester resin, an aliphatic polyolefin resin, and an aromatic polyolefin resin. In addition, as the thermoplastic resin (C), copolymer resins of these thermoplastic resins (C) may be used, or a mixture of two or more of these thermoplastic resins (C) may be used. Among these resins, the acrylic resin may be preferably used from the viewpoints of transparency and heat resistance, or the like.

The content of the thermoplastic resin (C) is preferably 1 part by weight or higher and 2,000 parts by weight or lower, more preferably 5 parts by weight or higher and 500 parts by weight or lower, and particularly preferably 10 parts by weight or higher and 50 parts by weight or lower with respect to 100 parts by weight of the resin (B). When the content of the thermoplastic resin (C) is within the above-mentioned range, the color reproducibility of the color conversion composition can be further enhanced by controlling at least one of the peak wavelength and the full width at half maximum of emission of the organic luminescent material (A).

<Tertiary Amine, Catechol Derivative, Nickel Compound>

In addition to the above-described organic luminescent material (A) and resin (B), the color conversion composition according to the embodiment of the present invention preferably further includes at least one of a specific tertiary amine, a catechol derivative, and a nickel compound. When the color conversion composition includes these compounds, the deterioration of the organic luminescent material (A) included in the color conversion composition can be prevented. As a result, the durability of the organic luminescent material (A) (furthermore the durability of the color conversion composition) can be further enhanced. These compounds have a role as a light stabilizer, in particular, a singlet oxygen quencher.

The singlet oxygen quencher is a material trapping and inactivating singlet oxygen resulting from activation of an oxygen molecule by light energy. The co-presence of the organic luminescent material (A) and a singlet oxygen quencher in the color conversion composition allows the organic luminescent material (A) to be prevented from deterioration due to singlet oxygen.

Singlet oxygen is known to result from the occurrence of exchange of electron and energy between a dye such as Rose Bengal and methylene blue in a triplet excited state, and an oxygen molecule in the ground state. The color conversion composition according to the embodiment of the present invention is configured such that the organic luminescent material (A) included in the color conversion composition is excited by excitation light and emits light having a wavelength different from that of excitation light to perform color conversion of the light. Since the cycle of excitation-light emission is repeated, the probability of generating singlet oxygen resulting from interaction between a generated excited species and oxygen included in the color conversion composition increases. Thus, the probability of the organic luminescent material (A) colliding with singlet oxygen increases, and consequently, the deterioration of the organic luminescent material (A) easily proceeds.

Therefore, the color conversion composition includes at least one of a specific tertiary amine, a catechol derivative, and a nickel compound, which have a role as a singlet oxygen quencher, and generated singlet oxygen is promptly deactivated by this singlet oxygen quencher, whereby the durability of the organic luminescent material (A) can be enhanced.

In order not to hinder light from a light source and the light emission of the organic luminescent material (A), the specific tertiary amine, the catechol derivative, and the nickel compound preferably have smaller extinction coefficients in the visible range. Specifically, the specific tertiary amine, the catechol derivative, and the nickel compound have a molar extinction coefficient ε of preferably 1,000 [L/(mol·cm)] or smaller, and more preferably 500 [L/(mol·cm)] or smaller, in the entire wavelength region of 400 nm or longer and 800 nm or shorter. Furthermore, the molar extinction coefficient s is still more preferably 200 [L/(mol·cm)] or smaller, and particularly preferably 100 [L/(mol·cm)] or smaller.

The tertiary amine indicates a compound having a structure in which all N—H bonds of ammonia are replaced by N—C bonds. A substituent on the nitrogen atom is selected from an alkyl group, a cycloalkyl group, a heterocyclic group, an alkenyl group, a cycloalkenyl group, an alkynyl group, an aryl group, a heteroaryl group, an aldehyde group, a carbonyl group, a carboxy group, an oxycarbonyl group, a carbamoyl group, and a condensed ring and an aliphatic ring each formed between adjacent substituents. The substituent may be further substituted with the above-described substituents.

From the viewpoint of light stability, the substituent on the nitrogen atom of the above-described tertiary amine is preferably a substituted or unsubstituted alkyl group, a substituted or unsubstituted cycloalkyl group, a substituted or unsubstituted aryl group, or a substituted or unsubstituted heteroaryl group, and more preferably a substituted or unsubstituted alkyl group, a substituted or unsubstituted cycloalkyl group, or a substituted or unsubstituted aryl group.

In this case, the aryl group is preferably a phenyl group or a naphthyl group, and more preferably a phenyl group, because phenyl and naphthyl groups do not hinder light from a light source or light emission by the organic luminescent material (A). When the number of aryl groups on the nitrogen atom is larger, absorption in the visible region may be possibly higher, and therefore, the number of aryl groups out of three substituents on the nitrogen atom is preferably two or smaller, and more preferably one or smaller. Out of three substituents on the nitrogen atom, at least one is preferably a substituted or unsubstituted alkyl group because the substituted or unsubstituted alkyl group allows singlet oxygen to be more efficiently trapped. In particular, two or more of three substituents are preferably a substituted or unsubstituted alkyl group.

Preferred examples of the tertiary amine include, but are not particularly limited to, triethylamine, 1,4-diazabicyclo[2.2.2]octane, tri-n-butylamine, N,N-diethylaniline, and 2,2,6,6-tetramethylpiperidine.

The catechol derivative indicates a compound having two or more hydroxy groups on a benzene ring, including an isomer such as resorcinol and hydroquinone. This compound can more efficiently trap singlet oxygen, compared with a phenol derivative having one hydroxy group on a benzene ring.

Besides a hydroxy group, a substituent on the benzene ring of the catechol derivative is selected from hydrogen, an alkyl group, a cycloalkyl group, a heterocyclic group, an alkenyl group, a cycloalkenyl group, an alkynyl group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring each formed between adjacent substituents. This substituent may be further substituted with the above-described substituents.

Among these substituents, a substituted or unsubstituted alkyl group, a substituted or unsubstituted cycloalkyl group, a substituted or unsubstituted aryl group, a substituted or unsubstituted heteroaryl group, and halogen are preferred from the viewpoint of light stability. A substituted or unsubstituted alkyl group, a substituted or unsubstituted cycloalkyl group, a substituted or unsubstituted aryl group, and halogen are more preferred. Furthermore, a substituted or unsubstituted alkyl group, a substituted or unsubstituted cycloalkyl group, and halogen are still more preferred because these groups show less discoloration after reaction with a singlet oxygen quencher. A substituted or unsubstituted alkyl group is particularly preferred.

Hydroxy groups on a benzene ring of the catechol derivative are preferably located such that at least two hydroxy groups are preferably adjacent to each other. This is because the derivative having such an arrangement is more resistant to photooxidation than resorcinol (1,3-substituted) and hydroquinone (1,4-substituted). In addition, even after oxidization, light absorption in the visible region is small, and thus, discoloration of the color conversion composition can be prevented.

Preferable examples of the catechol derivative include, but are not particularly limited to, 4-tert-butylbenzene-1,2-diol, 3,5-di-tert-butylbenzene-1,2-diol.

The nickel compound is a compound containing nickel. Examples of the nickel compound include, but are not particularly limited to, an inorganic salt such as nickel chloride, a complex such as bis(acetylacetonate)nickel, and an organic acid salt such as nickel carbamate. The organic acid used herein indicates an organic compound having a carboxy group, a sulfonyl group, a phenolic hydroxy group, or a thiol group. Among them, a complex and an organic acid salt are preferred as the nickel compound from the viewpoint of being uniformly dispersed in the color conversion composition.

Examples of a nickel complex and a nickel salt of an organic acid which are capable of being preferably used as a singlet oxygen quencher include, but are not limited to, an acetylacetonate-based nickel complex, a bisdithio-α-diketone-based nickel complex, a dithiolate-based nickel complex, an aminothiolate-based nickel complex, a thiocatechol-based nickel complex, a salicylaldehydeoxime-based nickel complex, a thiobisphenolate-based nickel complex, an indoaniline-based nickel compound, a carboxylic acid-based nickel salt, a sulfonic acid-based nickel salt, a phenol-based nickel salt, a carbamic acid-based nickel salt, and a dithiocarbamic acid-based nickel salt. From the viewpoints of the ease of synthesis and low cost, a nickel salt of an organic acid is particularly preferred.

Furthermore, a sulfonic acid-based nickel salt is preferred because the sulfonic acid-based nickel salt has a small molar extinction coefficient in the visible region and does not absorb light emitted from a light source or the organic luminescent material (A). A nickel salt of an arylsulfonic acid is more preferred from the viewpoint of exhibiting higher singlet oxygen quenching effect. A nickel salt of an alkylsulfonic acid is preferred from the viewpoint of solubility in a wide range of solvents. An aryl group of the arylsulfonic acid is preferably a substituted or unsubstituted phenyl group, and from the viewpoint of solubility and dispersibility in a solvent, a phenyl group substituted with an alkyl group is more preferred.

The amount of the tertiary amine, the catechol derivative, and the nickel compound added, each being capable of being used for the color conversion composition according to the embodiment of the present invention, is usually $1.0 \times 10^{-3}$ part by weight or larger and 30 parts by weight or smaller with respect to 100 parts by weight of the resin (B), depending on the molar extinction coefficient, luminescence quantum yield, and absorption intensity at an excitation wavelength of the compound, and the thickness and transmittance of the color conversion sheet to be produced. The amount of the tertiary amine, the catechol derivative, and the nickel compound added is more preferably $1.0 \times 10^{-2}$ part by weight or larger and 15 parts by weight or smaller, and particularly preferably $1.0 \times 10^{-1}$ part by weight or larger and 10 parts by weight or smaller.

In the case where the nickel compound is added to the color conversion composition, when the amount of the nickel compound added is excessively large, the added nickel compound could adversely affect, for example, strength or thermal stability at the time of processing and molding from the color conversion composition into the color conversion sheet. Therefore, the amount of the nickel compound added is preferably $1.0 \times 10^{-3}$ part by weight or larger and 15 parts by weight or smaller, more preferably $1.0 \times 10^{-2}$ part by weight or larger and 10 parts by weight or smaller, and particularly preferably $1.0 \times 10^{-1}$ part by weight or larger and 10 parts by weight or smaller, with respect to 100 parts by weight of the resin (B).

<Solvent>

The color conversion composition according to the embodiment of the present invention may include a solvent. This solvent is not particularly limited as long as the solvent is capable of adjusting the viscosity of a resin (for example, the resin (B)) in a flowing state and does not excessively affect light emission from an organic luminescent material (for example, the organic luminescent material (A)) and the durability thereof. Examples of the solvent includes methanol, ethanol, 1-propanol, 2-propanol, 1-butanol, 2-butanol, isobutyl alcohol, isopentyl alcohol, toluene, methyl ethyl ketone, methyl isobutyl ketone, benzyl alcohol, p-cresol, cyclohexanone, methylcyclohexane, hexane, acetone, terpineol, texanol, methyl cellosolve, butyl carbitol, butyl carbitol acetate, ethylene glycol, diethylene glycol, triethylene glycol, glycerol, propylene glycol, 2-methoxyethanol, diethyl ether, diisopropyl ether, 1,2-dimethoxyethane, diethylene glycol monomethyl ether, diethylene glycol dimethyl ether, propylene glycol monomethyl ether, propylene glycol monomethyl ether acetate, tetrahydrofuran, 1,4-dioxane, anisole, furfural, ethyl methyl ketone, and γ-butyllactone.

A mixture of two or more of the above-mentioned solvents may be used for the color conversion composition. Among these solvents, toluene is preferably used because toluene is capable of dissolving both the organic luminescent material (A) and the resin (B), does not affect deterioration of the organic luminescent material (A), and leaves less residual solvent after drying.

<Other Additives>

Additives may be added to the color conversion composition according to the embodiment of the present invention to the extent of not impairing the effects of the present invention. Specific examples of the additives to be added to the color conversion composition include a weather-resistance improving agent, a dispersion stabilizing agent, a leveling agent, an antioxidant, a plasticizer, a flame retardant, a defoaming agent, a silane coupling agent, an ultraviolet absorber, a cross-linking agent, a curing agent, and an adhesion improving agent.

For the purpose of enhancing the efficiency of extracting light from a color conversion layer, including the color conversion composition, (for example, a color conversion layer including the organic luminescent material (A)), inorganic particles may be added to the color conversion composition. Specific examples of the inorganic particles include fine particles made of, for example, glass, titania, silica, alumina, silicone, zirconia, seria, aluminum nitride, silicon carbide, silicon nitride, or barium titanate. These particles may be used alone or in combination of two or more of them. From the viewpoint of availability, the inorganic particles are preferably silica particles, alumina particles, or silicone particles. Furthermore, the inorganic particles are particularly preferably alumina particles from the viewpoint of more easily controlling a refractive index and a particle diameter.

<Ion Content>

The ion content of thecolor conversion composition according to the embodiment of the present invention is adjusted to an appropriate range. Specifically, the total amount of halide ions, sodium ions, potassium ions, and ammonium ions contained in the color conversion composition is preferably 15 ppm or smaller, more preferably 10 ppm or smaller, and particularly preferably 5 ppm or smaller.

The content of these ions is measured using ion chromatography. Specifically, 30 mL of toluene is added to 10 g of the color conversion composition, and the resulting solution is shaken using a shaker for 1 hour, and subsequently treated through a membrane filter (PVDF, 0.45 μm in pore size, manufactured by Merck) and a cartridge for solid phase extraction (InertSep SlimJ PLS-3, manufactured by GL Sciences Inc.). To the obtained toluene solution, 30 mL of ultrapure water is added, and the resulting solution is shaken by a shaker for 1 hour, and subsequently, an aqueous phase of the solution is treated through a reversed phase cartridge (TSKgel ODS-120H, manufactured by Tosoh Corporation), and the obtained aqueous solution is analyzed under conditions described below. As a result, a measured value of the ion content of the color conversion composition is acquired.

For example, when anions are target ions for measurement, conditions for the measurement of the ion content are such that: ICS-3000, manufactured by Dionex, is employed as a measuring apparatus; the amount of a sample introduced is 100 μL; a KOH gradient is used as an eluent; IonPac AS23 (2 mm×250 mm) is employed as an isolating column; and an electric conductivity meter is employed as a detector. When cations are target ions for measurement, conditions for the measurement of the ion content are such that: DX-500, manufactured by Dionex, is employed as a measuring apparatus; the amount of a sample introduced is 100 μL; 10 mM of methanesulfonic acid is used as an eluent; IonPac CS14 (2 mmφ×250 mm) is employed as an isolating column; and an electric conductivity meter is employed as a detector.

<Moisture Content>

The moisture content of the color conversion composition according to the embodiment of the present invention is adjusted to an appropriate range. In the present embodiment, the moisture content of the color conversion composition is preferably 0.001% by weight or higher and 0.05% by weight or lower, more preferably 0.001% by weight or higher and 0.03% by weight or lower, and particularly preferably 0.001% by weight or higher and 0.01% by weight or lower. When the moisture content of the color conversion composition is within the above-mentioned range, decomposition of an organic luminescent material (for example, the organic luminescent material (A)) included in the color conversion composition and generation of radicals leading to deterioration can be prevented, whereby results in the color conversion composition have higher durability.

Note that the above-mentioned moisture content is a value measured by the Karl Fischer method. Specifically, the above-mentioned moisture content is obtained by putting 1 g of the color conversion composition into a Karl Fischer moisture meter 852 Titrando (coulometric KF moisture meter), manufactured by Metrohm, and performing a measurement.

<Method for Producing Color Conversion Composition>

Hereinafter, an example of a method for producing the color conversion composition according to the embodiment of the present invention will be described. In this production method, the organic luminescent material (A), the resin (B), the solvent, and other ingredients that are all above-mentioned are mixed in their respective predetermined amounts. These components are mixed to achieve a predetermined composition, and subsequently, are homogeneously mixed and dispersed using a stirring-kneading machine such as a homogenizer, a rotating-revolving stirrer, a three-roller, a ball mill, a planetary ball mill, or a bead mill, whereby the color conversion composition is obtained. Defoaming under a vacuum or reduced pressure condition is preferably performed after or during the mixing and dispersing process. A specific component may be previously mixed in, or treatment such as aging may be carried out. The solvent may be removed using an evaporator to achieve a desired solid content concentration. Note that the above-mentioned production method is merely an example of the method for producing the color conversion composition, and the present invention is not limited to this method.

<Method for Producing Color Conversion Sheet>

Hereinafter, an example of a method for producing the color conversion sheet according to the embodiment of the present invention will be described. The above-described color conversion composition may be processed into a sheet and used. More specifically, in this method for producing a color conversion sheet, the color conversion composition produced by the above-described method is applied onto a base material and dried to obtain the target color conversion sheet. Here, the color conversion composition corresponds to a color conversion layer of the color conversion sheet. The color conversion sheet may include only the color conversion layer, or may include other layers in addition to the color conversion layer.

Application of the color conversion composition onto the base material can be carried out, for example, by a reverse roll coater, a blade coater, a lip die coater, a slit die coater, a direct gravure coater, an offset gravure coater, a kiss coater, a screen process printing, a natural roll coater, an air knife coater, a roll blade coater, a reverse roll blade coater, a two stream coater, a rod coater, a wire bar coater, an applicator, a dip coater, a curtain coater, a spin coater, or a knife coater. In order to obtain uniformity in the film thickness of the color conversion layer, the application is preferably performed using a slit die coater out of the above-mentioned coaters. Note that the above-mentioned application methods are merely examples in the method for producing the color conversion sheet, and the present invention is not limited to the application methods.

Drying of the color conversion layer can be carried out using a common heating device such as a hot air dryer or an infrared dryer. In this case, heating and curing for drying are performed under conditions of usually 40° C. to 200° C. for 1 minute to 3 hours, and preferably 80° C. to 150° C. for 2 minutes to 1 hour. The configuration of the color conversion sheet is not particularly limited as long as the color conversion sheet includes a color conversion layer obtained by curing the color conversion composition.

From the viewpoint of enhancing heat resistance, the thickness of the color conversion layer is preferably 500 µm or smaller, more preferably 300 µm or smaller, and still more preferably 200 µm or smaller. In the present invention, the film thickness of the color conversion sheet refers to a film thickness (an average film thickness) measured based on the method A for measuring a thickness by mechanical scanning in "Plastics-Film and sheeting-Determination of thickness" of JIS K 7130 (1999).

<Base Material>

A base material to be used for the color conversion sheet according to the embodiment of the present invention is not particularly limited, and as the base material, for example, a known metal, film, glass, ceramic, or paper may be used. Specific examples of the base material include a metal plate, foil, a plastic film, plastic-laminated paper, plastic-coated paper, metal-laminated or -deposited paper, and a metal-laminated or -deposited plastic film. Examples of the above-mentioned metal, metal plate, and foil include aluminum (including aluminum alloy), zinc, copper, and iron. Examples of the above-mentioned plastics include cellulose acetate, polyethylene terephthalate (PET), polyethylene, polyester, polyamide, polyimide, polyphenylene sulfide, polystyrene, polypropylene, polycarbonate, polyvinyl acetal, aramid, silicone, polyolefin, a thermoplastic fluorocarbon resin, and a copolymer of tetrafluoroethylene and ethylene (ETFE). Examples of the above-mentioned plastic films include an α-polyolefin resin, a polycaprolactone resin, an acrylic resin, a silicone resin, and copolymer resins of these resins with ethylene. When the base material is a metal plate, the surface of the metal plate may be subjected to chromium-based or nickel-based plating treatment or ceramic treatment.

Among the above-mentioned base materials, glass or a resin film is preferably used from the viewpoint of the ease of producing or shaping the color conversion sheet. Furthermore, a film preferably has high strength so that, when a film-shaped base material is handled, breakage or other troubles may not occur. From the viewpoints of prescribed properties and economic efficiency, resin films are preferred. Among the resin films, a plastic film selected from the group consisting of PET, polyphenylene sulfide, polycarbonate, and polypropylene is preferred from the viewpoints of economic efficiency and the ease of handling. The color conversion sheet may be formed by thermocompression using an extruder at a high temperature of 200° C. or higher. In this case, a polyimide film is preferred in view of heat resistance. To peel off the color conversion sheet more easily, a surface of the base material may be previously subjected to releasing treatment.

The thickness of the base material is not particularly limited, but the lower limit of the thickness is preferably 25 µm or larger, and more preferably 38 µm or larger. The upper limit of the thickness of the base material is preferably 5,000 µm or smaller, and more preferably 3,000 µm or smaller.

<Barrier Layer>

The color conversion sheet according to the embodiment of the present invention preferably includes a barrier layer in order to offer a gas barrier property to the color conversion sheet and enhance the durability of the color conversion layer included in the sheet. Examples of the barrier layer include a metal oxide thin film made of silicon oxide, aluminum oxide, tin oxide, indium oxide, yttrium oxide, magnesium oxide, mixtures thereof, and any of the above-mentioned oxides to which other elements are added; and films made of various resins, such as polyvinylidene chloride, an acrylic resin, a silicone resin, a melamine resin, a urethane resin, and a fluororesin. Examples of a film having a barrier function against moisture include filths made of various resins, such as polyethylene, polypropylene, nylon, polyvinylidene chloride, a copolymer of vinylidene chloride and vinyl chloride, a copolymer of vinylidene chloride and acrylonitrile, and a fluororesin. Note that the barrier layer in the present invention is not limited to the above-mentioned films.

Depending on a function required for the color conversion sheet, the color conversion sheet may further include, as another layer, an auxiliary layer having an antireflection function, an antiglare function, an antireflection antiglare function, a hard coat function (a friction resistance function), an antistatic function, an antifouling function, an electromagnetic wave shielding function, an infrared ray cutting function, an ultraviolet ray cutting function, a polarizing function, or a toning function.

<Color Conversion Layer>

The color conversion sheet according to the embodiment of the present invention includes at least a color conversion layer (X) including the above-described color conversion composition. In the present embodiment, in addition to the color conversion layer (X), the color conversion sheet preferably further includes a color conversion layer (Y) different from the color conversion layer (X). The color conversion layer (X) includes the above-described organic luminescent material (A) and the above-described resin (B), in which the wavelength of a peak indicating the maximum radiant intensity is observed in a region of 500 nm or longer and 580 nm or shorter by use of excitation light having a wavelength in a range of 400 nm or longer and 500 nm or shorter. The color conversion layer (Y) includes: an organic luminescent material (E) configured to exhibit light emission in which the wavelength of a peak is observed in a region of 580 nm or longer and 750 nm or shorter upon being excited by at least one of excitation light having a wavelength in a range of 400 nm or longer and 500 nm or shorter and light emitted from the organic luminescent material (A); and a thermoplastic resin (C) different from the resin (B). Hereinafter, the color conversion layer (X) is simply referred to as "layer (X)", and the color conversion layer (Y) is simply referred to as "layer (Y)", as needed.

In the color conversion sheet, the organic luminescent material (A) and the organic luminescent material (E) are individually included in different color conversion layers, whereby these materials are prevented from interacting each other. Thus, a narrower full width at half maximum can be achieved and light emission with higher color purity can be exhibited, compared with a case in which the organic luminescent material (A) and the organic luminescent material (E) are dispersed in the same color conversion layer. Furthermore, since the organic luminescent material (A) and the organic luminescent material (E) are prevented from interacting each other, these materials independently emit light in their individual color conversion layers, and thus, green and red light emission peak wavelengths and green and red light emission intensities can be easily adjusted. Therefore, in the color conversion sheet, without making wider the full width at half maximum of the organic luminescent material that exhibits light emission with higher color purity, optimal blue, green, and red light emission peak wavelengths and optimal blue, green, and red light emission intensities can be designed, and white light with higher color reproducibility, can be achieved.

<Structural Example of Color Conversion Sheet>

The structure of the color conversion sheet according to the embodiment of the present embodiment is not limited as long as the color conversion sheet includes at least the color conversion layer (X) obtained by curing the above-described color conversion composition. Typical structural examples of the color conversion sheet include the following three structural examples.

FIG. 1 is a schematic sectional view of an example of the color conversion sheet according to the embodiment of the present invention. As illustrated in FIG. 1, a color conversion sheet 1a as an example of the present embodiment includes a base layer 10 and two color conversion layers (a layer (X) 16 and a layer (Y) 18), and is a laminate of these layers. In the structural example of the color conversion sheet 1a, the layer (X) 16 is laminated on the base layer 10, and the layer (Y) 18 is laminated on the layer (X) 16.

Figure 2:
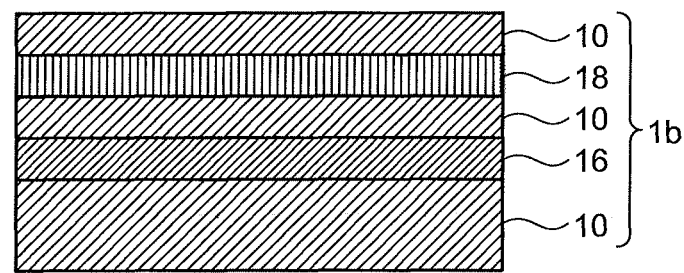
FIG. 2 is a schematic sectional view illustrating another example of the color conversion sheet according to the embodiment of the present invention.

FIG. 2 is a schematic sectional view of another example of the color conversion sheet according to the embodiment of the present invention. As illustrated in FIG. 2, a color conversion sheet 1b as another example of the present embodiment includes a plurality of base layers 10 (three layers in the present embodiment), a layer (X) 16, and a layer (Y) 18, and is a laminate in which the layer (X) 16 and the layer (Y) 18 are sandwiched by the base layers 10. In this structural example of the color conversion sheet 1b, the layer (X) 16 is laminated on a first base layer 10; a second base layer 10 is laminated on the layer (X) 16; the layer (Y) 18 is laminated on the second base layer 10; and a third base layer 10 is laminated on the layer (Y) 18.

Figure 3:
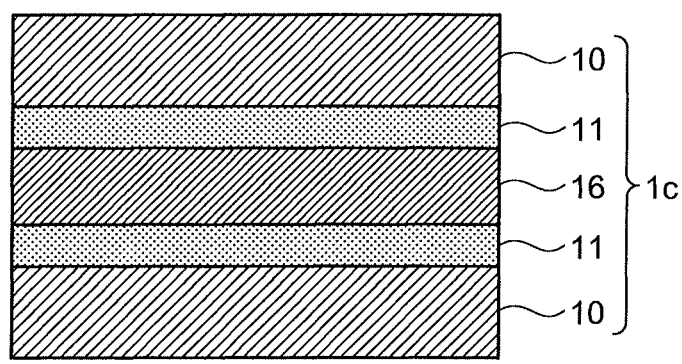
FIG. 3 is a schematic sectional view illustrating still another example of the color conversion sheet according to the embodiment of the present invention.

FIG. 3 is a schematic sectional view of still another example of the color conversion sheet according to the embodiment of the present invention. As illustrated in FIG. 3, a color conversion sheet 1c as still another example of the present embodiment includes a plurality of base layers 10 (two layers in the present embodiment), a layer (X) 16, and a plurality of barrier films 11 (two films in the present embodiment). In this structural example of the color conversion sheet 1c, a laminate is formed in which the layer (X) 16 is sandwiched by these base layers 10 and barrier films 11. Specifically, the layer (X) 16 is sandwiched by the barrier films 11, and a laminate formed of the layer (X) 16 and the barrier films 11 is further sandwiched by the base layers 10. That is, as illustrated in FIG. 3, the color conversion sheet 1c is provided with the barrier films 11 in order to prevent deterioration of the layer (X) 16 due to oxygen, water, or heat.

FIGS. 1 to 3 illustrate, as the color conversion layer, the color conversion sheet 1a or 1b including one layer (X) 16 and one layer (Y) 18, or illustrate, as the color conversion layer, the color conversion sheet 1c including one layer (X) 16, but, a specific structure of the color conversion sheet according to the present invention is not limited to the above-mentioned structures. For example, the color conversion sheet may be provided with a plurality of layers (X) 16 and a plurality of layers (Y) 18. In this case, the compositions and forms of the layers (X) 16 may be the same as or different from each other. Similarly, the compositions and forms of the layers (Y) 18 may be the same as or different from each other. A laminated structure formed of layers (X) 16 and layers (Y) 18 in the color conversion sheet may be a structure in which the layers (X) 16 or the layers (Y) 18 are continuously arranged along a lamination direction, such as layer (Y)/layer (X)/layer (X), layer (Y)/layer (Y)/layer (X), or layer (Y)/layer (Y)/layer (X)/layer (X).

<Solubility Parameter of Resin>

The solubility parameter (hereinafter, referred to as an SP value) of each of the resins contained in the color conversion layers (X) and (Y) of the color conversion sheet according to the embodiment of the present invention will be described. In this color conversion sheet, when the SP value of the resin (B) included in the color conversion layer (X) is $SP_B(cal/cm^3)^{0.5}$ and the SP value of the thermoplastic resin (C) included in the color conversion layer (Y) is $SP_C(cal/cm^3)^{0.5}$, it is preferred that a relationship between $SP_B$ and $SP_C$ is $SP_B \leq SP_C$.

The SP value of a resin in a color conversion layer and the light emission peak wavelength of an organic luminescent material correlate to each other. In a resin having a higher SP value, because of the interaction between this resin and an organic luminescent material, the excited state of the organic luminescent material is stabilized. Therefore, compared with a resin having a lower SP value, the light emission peak wavelength of the organic luminescent material is shifted to the longer wavelength side. Thus, when an organic luminescent material is included in a resin having an optimal SP value, the light emission peak wavelength of the organic luminescent material can be optimized.

When $SP_B(cal/cm^3)^{0.5}$ and $SP_C(cal/cm^3)^{0.5}$ satisfy the above-mentioned relation, the difference between green and red light emission peak wavelengths of the color conversion layers (X) and (Y) is larger, compared with a case in which the organic luminescent material is included in a single resin, and as a result, a larger color gamut is achieved. In particular, it is preferred that $SP_C \geq 10.0$. In this case, the red light emission peak wavelength of the color conversion layer (Y) is still longer, and, as a result, deeper red light can be emitted. From the viewpoint of enhancing such an effect, it is more preferred that $SP_C \geq 10.2$, still more preferred that $SP_C \geq 10.4$, and particularly preferred that $SP_C \geq 10.6$.

The upper limit of $SP_C$ is not particularly limited, but, a resin satisfying $SP_C \leq 15.0$ (specifically, the thermoplastic resin (C)) allows an organic luminescent material to be dispersed well therein, and therefore can be preferably used. From the viewpoint of enhancing such an effect, it is more preferred that $SP_C \leq 14.0$, still more preferred that $SP_C \leq 13.0$, and particularly preferred that $SP_C \leq 12.0$.

Furthermore, it is preferred that $SP_B \leq 10.0$ because the green light emission peak wavelength of the color conversion layer (X) is substantially prevented from being longer, and as a result, the difference between green and red light emission peak wavelengths of the color conversion layers (X) and (Y) is larger. From the viewpoint of enhancing such an effect, it is more preferred that $SP_B \leq 9.8$, still more preferred that $SP_B \leq 9.7$, and particularly preferred that $SP_B \leq 9.6$.

The lower limit of $SP_B$ is not particularly limited, but, a resin satisfying $SP_B \geq 7.0$ (specifically, the resin (B)) allows an organic luminescent material to be dispersed well therein, and therefore can be preferably used. From the viewpoint of enhancing such an effect, it is more preferred that $SP_B \geq 7.4$, still more preferred that $SP_B \geq 7.8$, and particularly preferred that $SP_B \geq 8.0$.

The SP value used herein is a value calculated from the type and ratio of a monomer constituting a resin by using the commonly used Fedors' estimation method described in, for example, Poly. Eng. Sci., vol. 14, No. 2, pp. 147-154 (1974). Also for a mixture of a plurality of resins, the same method can be applied to calculate an SP value. For example, the SP value of polymethyl methacrylate is calculated as $9.5(cal/cm^3)^{0.5}$, the SP value of polyethylene terephthalate (PET) is calculated as $10.7(cal/cm^3)^{0.5}$, and the SP value of a bisphenol A-based epoxy resin is calculated as $10.9(cal/cm^3)^{0.5}$.

Resins included in the color conversion layers (X) and (Y) are not limited to particular resins. Table 2 lists the type of the resin (B) suitably used for the color conversion layer (X) and the types of the thermoplastic resin (C) suitably used for the color conversion layer (Y), and typical SP values of the resins. As resins in the color conversion layer (X) and (Y), for example, an arbitrary combination of resins listed in Table 2 is preferably used.

TABLE 2

| Layer (X) (SP value) | Layer (Y) (SP value) |
|---|---|
| Cycloolefin resin (7.4-8.8) | Acrylic resin (9.1-9.5) |
| | Epoxy resin (10.9) |
| | Polyester resin (10.7) |
| | Urethane resin (10) |
| | Vinyl acetate resin (9.4) |
| | Polyvinyl alcohol (12.6) |
| | Vinylidene chloride resin (12.2) |
| | Polyamide resin (13.6) |
| | Acrylonitrile resin (14.8) |
| | Silicone resin (7.6) |
| | Polystyrene (9.0) |
| | Styrene-butadiene rubber (8.3-8.6) |

<Light-Emitting Body>

A light-emitting body according to the embodiment of the present invention includes a mechanism for emitting light (light source), and a mechanism for performing color conversion of light, and as long as the light-emitting body includes these mechanisms, the light-emitting body is not particularly limited. In the present embodiment, the light-emitting body preferably includes a blue LED as a light source (also referred to as a blue LED light source) and the above-described color conversion composition or color conversion sheet. The light emission peak wavelength of the blue LED is preferably 400 nm or longer and 500 nm or shorter. In the case where the light-emitting body includes the color conversion sheet, the light-emitting body preferably further includes a resin layer between the blue LED and the color conversion sheet in order to enhance light emission properties and reliability.

Preferred examples of the light-emitting body including the color conversion composition according to the embodiment of the present invention include a light-emitting body including a blue LED, a substrate, and a reflector in addition to the color conversion composition, in which the blue LED and the color conversion composition are provided in a recess formed by the reflector on the substrate. Such a light-emitting body can be produced, for example, in such a manner that the blue LED having a light emission peak wavelength in a range of 400 nm to 500 nm is arranged in the recess surrounded by the reflector on the substrate, and furthermore, the color conversion composition is dispensed thereinto to form a color conversion layer. The details of the method for producing the light-emitting body according to the present embodiment will be described later.

Figure 4A:
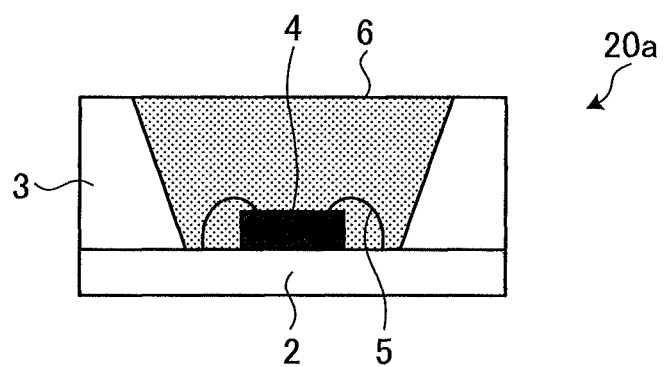
FIG. 4A is a side view illustrating a first example of a light-emitting body including a color conversion composition according to the embodiment of the present invention.

FIGS. 4A to 4E are side views of preferred examples of the light-emitting body according to the embodiment of the present invention, the light-emitting body having a color conversion layer formed by a dispensing method. FIG. 4A is a side view illustrating a first example of the light-emitting body including the color conversion composition according to the embodiment of the present invention. As illustrated in FIG. 4A, a light-emitting body 20a as the first example includes a substrate 2, a reflector 3, an LED element 4, and a color conversion layer 6. The substrate 2 is a circuit board. The LED element 4 is a light source for emitting blue light (a blue LED) and is mounted on the substrate 2. The substrate 2 and the LED element 4 are electrically connected by a metal wire 5. The reflector 3 is provided on the substrate 2 so as to surround the LED element 4. In other words, a recess is formed by the reflector 3 on the substrate 2, and the LED element 4 is arranged inside the recess. Furthermore, the recess is filled with the above-described color conversion composition by a dispensing method, and the dispensed color conversion composition is, for example, heated and cured to form the color conversion layer 6. In the light-emitting body 20a, the color conversion layer 6 has both a color conversion function of color-converting blue light emitted from the LED element 4 into green light or red light and a sealing function of sealing the recess (specifically, the LED element 4 or the like) by the reflector 3 on the substrate 2. That is, this color conversion composition also plays a role as a sealant.

Figure 4B:
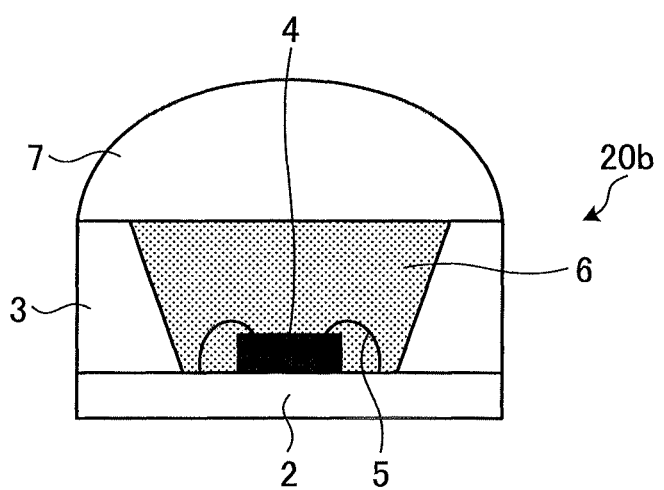
FIG. 4B is a side view illustrating a second example of the light-emitting body including the color conversion composition according to the embodiment of the present invention.

FIG. 4B is a side view illustrating a second example of the light-emitting body including the color conversion composition according to the embodiment of the present invention. As illustrated in FIG. 4B, a light-emitting body 20b as the second example further includes a lens 7 provided on the top of the light-emitting body 20a illustrated in FIG. 4A, specifically, on the upper ends of the reflector 3 and the color conversion layer 6. Other constituents are the same as those of the above-described light-emitting body 20a, and the same constituents as those of light-emitting body 20a are assigned the same reference numerals.

Figure 4C:
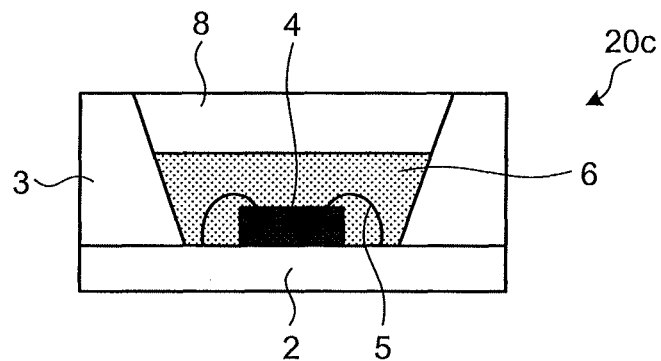
FIG. 4C is a side view illustrating a third example of the light-emitting body including the color conversion composition according to the embodiment of the present invention.

FIG. 4C is a side view illustrating a third example of the light-emitting body including the color conversion composition according to the embodiment of the present invention. As illustrated in FIG. 4C, a light-emitting body 20c as the third example further includes a sealing resin layer 8 on the top of the color conversion layer 6. Other constituents are the same as those of the light-emitting body 20a illustrated in FIG. 4A, and the same constituents as those of light-emitting body 20a are assigned the same reference numerals.

More specifically, in the light-emitting body 20c, the above-described color conversion composition is poured into the recess by a dispensing method to the extent of covering the LED element 4 surrounded by the reflector 3 in the recess, together with the wire 5. The color conversion layer 6 includes this poured color conversion composition, and is formed in a region from the bottom to the middle part of this recess. Furthermore, a resin transparent to visible light (hereinafter, referred to as a transparent resin) is filled on the top of the color conversion layer 6 into the recess. The sealing resin layer 8 includes this poured transparent resin and is configured to seal the recess (specifically, the LED element 4). The color conversion composition and the transparent resin may be separately heated and cured, or may be collectively heated and cured.

Figure 4D:
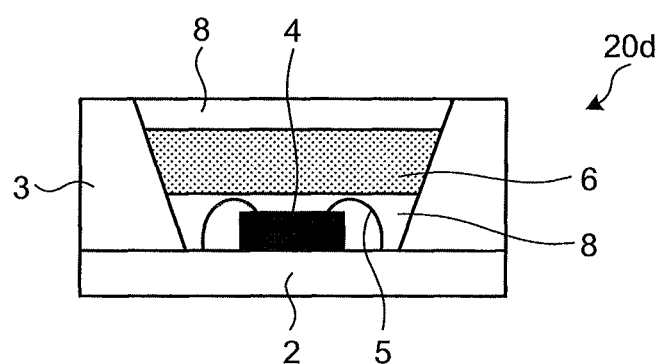
FIG. 4D is a side view illustrating a fourth example of the light-emitting body including the color conversion composition according to the embodiment of the present invention.

FIG. 4D is a side view illustrating a fourth example of the light-emitting body including the color conversion composition according to the embodiment of the present invention. As illustrated in FIG. 4D, a light-emitting body 20d as the fourth example further includes sealing resin layers 8 on both the upper and lower sides of a color conversion layer 6. Other constituents are the same as those of the light-emitting body 20a illustrated in FIG. 4A, and the same constituents as those of light-emitting body 20a are assigned the same reference numerals.

Specifically, in the light-emitting body 20d, the above-described transparent resin is poured into the recess to the extent of covering the LED element 4 surrounded by the reflector 3 in the recess, together with the wire 5. The above-described color conversion composition is poured on the sealing resin layer 8 including the transparent resin to form the color conversion layer 6 including the color conversion composition. Furthermore, the transparent resin is poured on this color conversion layer 6, whereby the sealing resin layer 8 including this transparent resin is formed to seal the LED element 4 and the color conversion layer 6 inside the recess. The color conversion composition and the transparent resin may be separately heated and cured, or may be collectively heated and cured. Thus, a laminate is formed inside the above-mentioned recess, the laminate having a laminated structure in which the color conversion layer 6 is sandwiched by the sealing resin layers 8 from both sides (both the upper and lower sides) along a thickness direction.

Figure 4E:
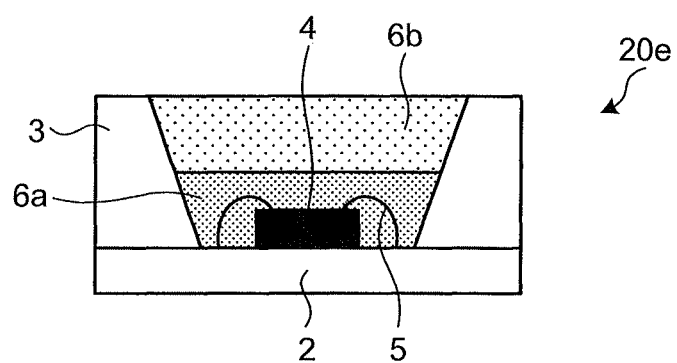
FIG. 4E is a side view illustrating a fifth example of the light-emitting body including the color conversion composition according to the embodiment of the present invention.

FIG. 4E is a side view illustrating a fifth example of the light-emitting body including the color conversion composition according to the embodiment of the present invention. As illustrated in FIG. 4E, a light-emitting body 20e as the fifth example includes a plurality of color conversion layers 6a and 6b in place of the single color conversion layer 6. Other constituents are the same as those of the light-emitting body 20a illustrated in FIG. 4A, and the same constituents as those of light-emitting body 20a are assigned the same reference numerals.

More specifically, in the light-emitting body 20e, the above-described color conversion composition is poured into the recess by a dispensing method to the extent of covering the LED element 4 surrounded by the reflector 3 in the recess, together with the wire 5. The color conversion layer 6a includes this poured color conversion composition, and is formed in a region from the bottom to the middle part of this recess. Furthermore, a color conversion composition different from that of the color conversion layer 6a is filled on the upper part of the color conversion layer 6a into the recess. The color conversion layer 6b includes this poured color conversion composition, and seals the recess (specifically, the LED element 4 and the color conversion layer 6a, for example) and has a color conversion function of color-converting light, such as blue light from the LED element 4 and green light from the color conversion layer 6a, into red light, for example. These color conversion compositions may be separately heated and cured, or may be collectively heated and cured. For example, out of the above-mentioned color conversion layers 6a and 6b, one color conversion layer 6a is the same as the above-described color conversion layer (X), and another color conversion layer 6b is the same as the above-described color conversion layer (Y).

The above-described FIGS. 4A to 4E each illustrate the light-emitting body mounted with a wire-bonding type LED element as the LED element 4, but, even when a flip-chip type LED element is employed as the LED element 4, the effects of the present invention are not impaired. Preferred examples of a light-emitting body mounted with a flip-chip type LED element as the LED element 4 include a light-emitting body having a color conversion sheet according to the embodiment of the present invention provided on the light-emitting face of a blue LED (the LED element 4). Such a light-emitting body can be produced, for example, by previously producing a color conversion sheet containing the color conversion composition and sticking the color conversion sheet onto a blue LED. The details of the method for producing this type of light-emitting body will be described later.

Figure 5A:
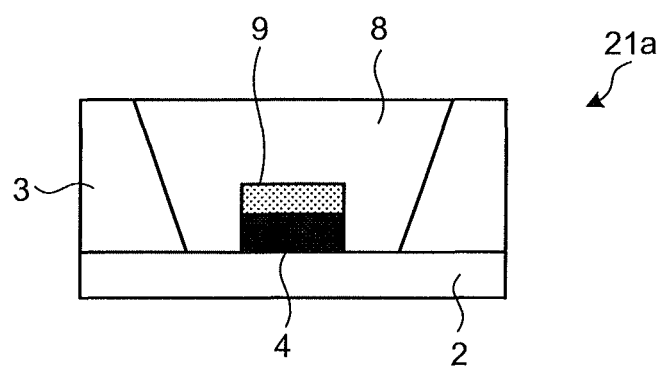
FIG. 5A is a side view illustrating an example of a light-emitting body including the color conversion sheet according to the embodiment of the present invention.
Figure 5B:
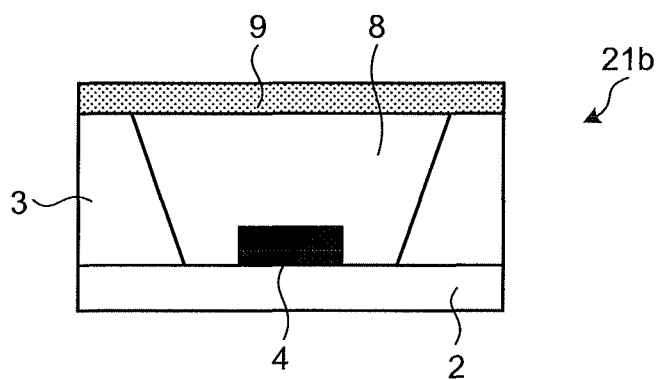
FIG. 5B is a side view illustrating another example of the light-emitting body including the color conversion sheet according to the embodiment of the present invention.

FIGS. 5A and 5B are side views of preferred examples of the light-emitting body according to the embodiment of the present invention, in which a color conversion layer is formed by a color conversion sheet including the color conversion layer containing the above-described color conversion composition.

FIG. 5A is a side view illustrating an example of the light-emitting body including the color conversion sheet according to the embodiment of the present invention. As illustrated in FIG. 5A, a light-emitting body 21a includes a substrate 2, a reflector 3, an LED element 4, and a color conversion sheet 9. In the light-emitting body 21a, the LED element 4 is a flip-chip type blue LED, and is mounted (flip-chip mounted) on the substrate 2. The substrate 2 and the LED element 4 are electrically connected via a metal ball (not illustrated), for example. The color conversion sheet 9 is stuck onto the light-emitting face of this mounted LED element 4. The color conversion sheet 9 includes a color conversion layer containing the above-described color conversion composition. For example, as this color conversion layer, the color conversion sheet 9 may include one color conversion layer (X) or may include two color conversion layers (X) and (Y), as illustrated in FIGS. 1 to 3. As is the case of the above-described light-emitting body 20a (see FIG. 4A), the reflector 3 is provided on the substrate 2 and surrounds the LED element 4. The recess formed by the reflector 3 is filled up with a transparent resin so that the resin covers the LED element 4 and the color conversion sheet 9 on the substrate 2. The sealing resin layer 8 is formed by heating and curing the filled transparent resin, and seals, for example, the LED element 4 and the color conversion sheet 9 inside this recess.

Although not particularly illustrated in FIG. 5A, the light-emitting body 21a may further include a resin layer between the LED element 4 and the color conversion sheet 9. This resin layer may be used as an adhesive for attaching the LED element 4 to the color conversion sheet 9.

FIG. 5B is a side view illustrating an example of the light-emitting body including the color conversion sheet according to the embodiment of the present invention. As illustrated in FIG. 5B, in this light-emitting body 21b, the color conversion sheet 9 is provided at least on the top of the sealing resin layer 8 (for example, on the upper ends of the reflector 3 and the sealing resin layer 8). In other words, the light-emitting body 21b includes a resin layer (the sealing resin layer 8) between the LED element 4 and the color conversion sheet 9 in order to seal the LED element 4. Furthermore, an adhesive (not illustrated) may be used to attach the color conversion sheet 9 to the sealing resin layer 8. Other constituents are the same as those of the light-emitting body 21a illustrated in FIG. 5A, and the same constituents as those of the light-emitting body 21a are assigned the same reference numerals.

The above-described FIGS. 5A and 5B each illustrate the light-emitting body including the color conversion sheet 9 as a color conversion layer and mounted with a flip-chip type LED element as the LED element 4, but, such a light-emitting body may be mounted with a wire-bonding type LED element. However, in this case, in order to perform the wire-bonding of the substrate 2 and the LED element 4, the color conversion sheet 9 needs to be subjected to processing for making a hole to make an electrode pad of the LED element 4 exposed.

From the viewpoint of enhancing heat resistance, the thickness of the color conversion sheet (for example, the color conversion sheet 9 illustrated in FIGS. 5A and 5B) according to the embodiment of the present invention is preferably 500 μm or smaller, more preferably 300 μm or smaller, and still more preferably 200 μm or smaller. This color conversion sheet may be provided with an adhesive layer between layers, such as color conversion layers, as needed. The adhesive layer is not particularly limited as long as the adhesive layer does not excessively affect the light emission and durability of the color conversion sheet, and a known material can be used for the adhesive layer. In the case where these layers need to be firmly attached to each other, a photocurable material, a thermosetting material, an anaerobic curable material, or a thermoplastic material may be preferably used as the adhesive layer. Among these materials, a thermosetting material is more preferred. Furthermore, a thermosetting material curable under a heating condition of 0° C. to 150° C. is particularly preferred.

The thickness of the adhesive layer is not particularly limited, but is preferably 0.01 μm or larger and 100 μm or smaller, and more preferably 0.01 μm or larger and 25 μm or smaller. The thickness of the adhesive layer is still more preferably 0.05 μm or larger and 5 μm or smaller, and particularly preferably 0.05 μm or larger and 1 μm or smaller.

<Method for Producing Light-Emitting Body>

Methods for producing the light-emitting bodies according to the embodiment of the present invention will be described. Hereinafter, first, a method for producing the light-emitting body including the color conversion composition according to the embodiment of the present invention will be described. Next, a method for producing the light-emitting body including the color conversion sheet according to the embodiment of the present invention will be described. Note that the production methods described below are merely examples, and the methods for producing the light-emitting bodies according to the embodiment of the present invention is not limited to these examples.

(Method for Producing Light-Emitting Body Including Color Conversion Composition)

A method for producing the light-emitting body including the color conversion composition according to the embodiment of the present invention is now described. In this method for producing the light-emitting body, by the use of the above-described color conversion composition, a color conversion layer is formed by a dispensing method to produce the light-emitting body. Specifically, first, the reflector 3 is formed on the substrate 2 by a known method; the LED element 4 (LED tip) is mounted in the recess formed on the substrate 2 by the reflector 3; and the substrate 2 and the LED element 4 are wired.

In the case where the LED element 4 has an electrode pad on the light-emitting face side thereof, with the light-emitting-face-side up, the LED element 4 is fixed to the substrate 2 by a die-bonding agent, for example, and subsequently, the electrode pad provided on the top face of the LED element 4 and the circuit wiring of the substrate 2 are connected by wire bonding. In the case where the LED element 4 has an electrode pad on a face opposite to the light-emitting face, in other words, in the case where the LED element 4 is a flip-chip type LED element, the electrode face of the LED element 4 is faced with the circuit wiring of the substrate 2, the electrode pad of the LED element 4 and the circuit wiring of the substrate 2 are butt-jointed for connection.

Subsequently, using a dispenser or other tools, the color conversion composition produced by the above-described method is poured into the recess formed by the reflector 3 on the substrate 2. Next, the poured color conversion composition is heated to form a color conversion layer (for example, one color conversion layer 6 or two color conversion layers 6a and 6b) in this recess. Here, the color conversion layer 6 may be formed as illustrated in FIG. 4C, and subsequently, a known sealing agent (a transparent resin) may be dispensed on the color conversion layer 6 and heated and cured to form the sealing resin layer 8. Alternatively, as illustrated in FIGS. 4A and 4E, one color conversion layer 6 or two color conversion layers 6*a* and 6*b* are formed, and the color conversion layer 6 or the color conversion layers 6*a* and 6*b* may also have a function as a sealing resin layer. Thus, the light-emitting body (for example, the light-emitting bodies 20*a*, 20*c*, and 20*e* respectively illustrated in FIGS. 4A, 4C, and 4E) including the above-described color conversion composition is obtained.

Furthermore, before the step of heating and drying the color conversion composition, there is preferably performed the step of leaving the substrate 2 standing in a vacuum atmosphere in a state in which the recess is filled with the color conversion composition, and removing moisture and oxygen dissolved in the color conversion composition. The step of thermosetting the color conversion composition and the transparent resin for sealing may be performed in the air, or may be performed in an atmosphere of inert gas, such as nitrogen.

(Method for Producing Light-Emitting Body Including Color Conversion Sheet)

A method for producing the light-emitting body including the color conversion sheet according to the embodiment of the present invention is now described. In this method for producing the light-emitting body, the color conversion sheet including the above-described color conversion composition is used as a color conversion layer to produce the light-emitting body. Specifically, this method for producing the light-emitting body includes mainly three steps. A first step is a singulation step of making the color conversion sheet into pieces. A second step is a pickup step of picking up the pieces of the color conversion sheet. A third step is a sticking step of sticking the picked-up color conversion sheet (the piece formed by the singulation step) onto a blue LED light source. This method for producing the light-emitting body may further include other steps, as needed.

Figure 6:
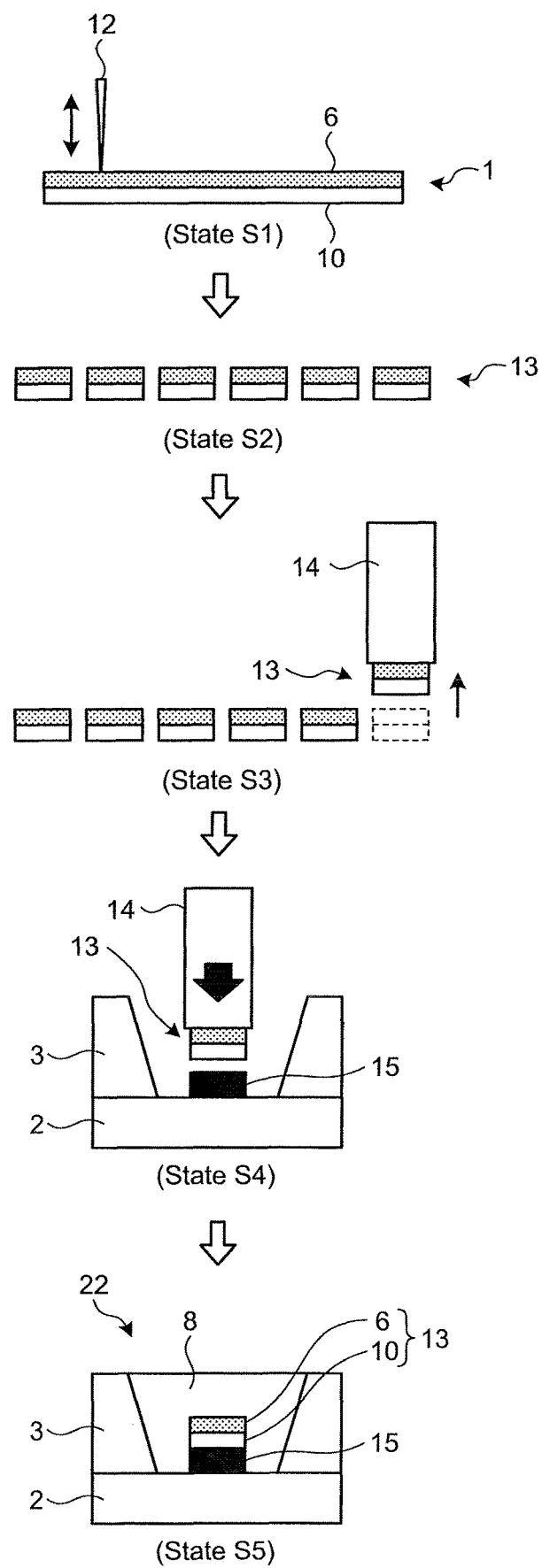
FIG. 6 is a flowchart illustrating an example of a method for producing the light-emitting body including the color conversion sheet according to the embodiment of the present invention.

FIG. 6 is a flowchart illustrating an example of the method for producing the light-emitting body including the color conversion sheet according to the embodiment of the present invention. First, in the singulation step, the color conversion sheet can be made into pieces by a method, such as punching by a die, processing by a laser, or cutting by a cutter. Among these methods, processing by a laser gives high energy to the color conversion layer of the color conversion sheet, and therefore, it is very difficult to avoid the burning of a resin (for example, the resin (B)) contained in the color conversion layer or deterioration of an organic luminescent material (for example, the organic luminescent material (A)). Therefore, as the method for making the color conversion sheet into pieces, cutting by a cutter is preferred.

For example, as illustrated in FIG. 6, the color conversion sheet 1 is a sheet in which the color conversion layer 6 is formed on the base layer 10. In the singulation step, the color conversion sheet 1 is cut by a cutter 12 into pieces each having a desired size (State S1). Thus, the color conversion layer 6 and the base layer 10 of the color conversion sheet 1 are made into a plurality of pieces to form sheet pieces 13 each having a desired size (State S2). The sheet piece 13 is a laminate of a piece of the base layer 10 and a piece of the color conversion layer 6.

Examples of the cutting by the cutter 12 include a method of pressing an object with a simple cutter to cut the object and a method of cutting an object with a rotary cutter, and both of the methods can be preferably used. As a device for cutting the color conversion sheet 1 with a rotary cutter, a device, called a dicer, for cutting (dicing) a semiconductor substrate into chips can be preferably used. The use of a dicer allows the width of the divided lines of the color conversion sheet 1 to be precisely controlled in accordance with the thickness of a rotary cutter and condition settings, and thus, the cutting with a dicer achieves higher accuracy of processing than the cutting of the color conversion sheet 1 by pressing with a simple cutter. In any of the cutting methods, the color conversion sheet 1 may be cut in such a manner that the color conversion layer 6 is made into pieces together with the base layer 10. Alternatively, the base layer 10 is not necessarily cut while the color conversion layer 6 is made into pieces. In this case, the base layer 10 is preferably subjected to what is called half-cutting in which a cut-in groove not penetrating the layer is provided.

The color conversion sheet 1 may be subjected to processing for making a hole in the color conversion layer 6 before or after the singulation step or simultaneously with the singulation step. As the processing of making a hole, known methods, such as laser processing and punching with a die, can be preferably used, but, laser processing causes the burning of a resin contained in the color conversion layer 6 or deterioration of an organic luminescent material, and hence, punching with a die is more preferred. In the case where punching with a die is performed, the color conversion layer 6 or the like of the sheet piece 13 cannot be subjected to the punching after the sheet piece 13 is stuck on an LED element, and therefore, the color conversion sheet 1 or the sheet piece 13 needs to be subjected to the punching before the sheet piece 13 is stuck on the LED element. Punching with a die allows a hole having any shape or size to be made in the color conversion layer 6, in agreement with the shape of an electrode of an LED element onto which the sheet piece 13 is stuck.

By designing a die, the hole can have any size and shape. Specifically, an electrode joining portion on the LED element approximately 1 mm per side is preferably 200 µm or smaller in size in order not to make the area of the light-emitting face small. Accordingly, the hole is formed to be 200 µm or smaller in size in agreement with the size of the electrode joining portion. The electrode pad in which, for example, wire bonding is performed needs to have a certain size, specifically, to be at least approximately 50 µm in size (for example, length and width). Therefore, the hole is preferably formed to be approximately 50 µm in size in agreement with the size of the pad. This is because, when the hole is too large compared with the electrode pad, the light-emitting face of the LED element is exposed to cause light leakage, whereby the color characteristics of the light-emitting body including the LED element deteriorate. There is another reason: when the hole is too small compared with the electrode pad, wire may come into contact with the color conversion layer 6 during wire bonding, and a joining failure between the electrode pad and the wire may occur.

A color conversion sheet piece 1 (that is, a sheet piece 13) formed through the above-described singulation step is picked up by the pickup step, which is a step subsequent to the singulation step. For example, as illustrated in FIG. 6, in the pickup step, the sheet piece 13 is picked up by a pickup device (not illustrated) equipped with a suction unit, such as a collet 14 (State S3).

The sheet piece 13 picked up at the above-described pickup step is stuck onto a blue LED light source through the sticking step, which is a step subsequent to the pickup step. For example, as illustrated in FIG. 6, the sheet piece 13 is in a state of being picked up by the collet 14. The collet 14 is transported together with the sheet piece 13 to the position of an LED element 15 (an example of the blue LED light source) mounted on the substrate 2 (specifically, inside the recess formed by the reflector 3), so that a face (light extraction face) opposite to the electrode formation face of the LED element 15 and the adhesion face of the sheet piece 13 face each other. Subsequently, the collet 14 presses and sticks the adhesion face of the sheet piece 13 onto the light extraction face of the LED element 15 (State S4).

For the sticking of the sheet piece 13 onto the LED element 15 at the sticking step, an adhesive (not illustrated) is preferably used. As this adhesive, known die-bonding agents and adhesives can be used. For example, adhesives of an acrylic resin, an epoxy resin, a urethane resin, a silicone resin, a modified silicone resin, a phenol resin, a polyimide resin, a polyvinyl alcohol resin, a polymethacrylate resin, a melamine resin, and a urea resin may be used. In the case where the color conversion layer or the base layer (in the case of State S4, the base layer) of the sheet piece 13 has adhesiveness, by making use of this adhesiveness, the sheet piece 13 and the LED element 15 may be stuck onto each other. In the case where the sheet piece 13 is a color conversion sheet in a state of being semi-cured, by making use of the curing of the sheet piece 13 by heating, the sheet piece 13 and the LED element 15 may be stuck onto each other. Alternatively, in the case where the color conversion layer of the sheet piece 13 has thermosoftening properties after being cured, by the use of the fusion bond of this color conversion layer, the color conversion layer of the sheet piece 13 can be attached to the LED element 15.

In the case where the sticking step is a step of heating the sheet piece 13 and sticking the sheet piece 13 onto the LED element 15, if this sticking step is performed in the air, bubbles sometimes enter between the LED element 15 and the sheet piece 13. In the case where bubbles enter, light is diffusely reflected on an interface between the bubbles and the LED element 15 and an interface between the bubbles and the sheet piece 13. Thus, the efficiency of light extraction from the LED element 15 decreases, and as a result, the luminance of the light-emitting body (for example, a light-emitting body 22 illustrated in FIG. 6) produced using the color conversion sheet 1 decreases. From the viewpoint of preventing bubbles from entering, this sticking step is preferably performed in a vacuum atmosphere.

(Other Steps)

The above-described method for producing the light-emitting body may further include, as another step, a connecting step of electrically connecting the LED element 15 and the substrate 2. In this connecting step, an electrode of the LED element 15 and circuit wiring of the substrate 2 are electrically connected by a known method. Thus, a light-emitting body 22 illustrated in FIG. 6 can be obtained. In the case where the LED element 15 has an electrode pad on the light-emitting face side thereof, with the light-emitting-face-side up, the LED element 15 is fixed to the substrate 2 by a die-bonding agent, for example, and subsequently, the electrode pad provided on the top face of the LED element 15 and the circuit wiring of the substrate 2 are connected by wire bonding. In the case where the LED element 15 is a flip-chip type LED element having an electrode pad provided on a face opposite to the light-emitting face, the electrode face of the LED element 15 is faced with the circuit wiring of the substrate 2, and the electrode pad of the LED element 15 and the circuit wiring of the substrate 2 are butt-jointed for connection. In this case, the connection of the substrate 2 and the LED element 15 may be performed before the sheet piece 13 is stuck onto the LED element 15.

In the case where the color conversion layer 6 of the sheet piece 13 in a state of being semi-cured is stuck onto the LED element 15, the color conversion layer 6 can be cured at a suitable timing before or after the above-described connecting step. For example, when thermos-compression bonding is performed to butt-joint the flip-chip type LED element 15 and the substrate 2, the color conversion layer 6 may be cured by the heating, simultaneously with the thermos-compression bonding. In the case where a package obtained by connecting the LED element 15 and the substrate 2 is surface-mounted on a larger circuit board, the package may be soldered to the circuit board by solder reflow, and at the same time, the sheet piece 13 may be cured.

In the case where the sheet piece 13 is stuck onto the LED element 15 in a state in which the color conversion layer 6 is cured, it is not necessary to perform the step of curing the color conversion layer 6 after the sheet piece 13 is stuck onto the LED element 15. Examples of the case in which the sheet piece 13 is stuck onto the LED element 15 in a state in which the color conversion layer 6 is cured include a case in which an adhesive layer is separately formed in the cured color conversion layer 6 or a case in which the color conversion layer 6 is thermally fusible after being cured.

The above-described method for producing the light-emitting body may further includes, as another step, a sealing step of sealing the LED element 15 and the color conversion layer 6 after the sticking step. For example, as illustrated in FIG. 6, in the sealing step, the sealing resin layer 8 is formed on the substrate 2 (specifically, inside the recess formed by the reflector 3) so as to cover the LED element 15 after the sheet piece 13 is stuck thereonto. Note that the sealing resin layer 8 includes a transparent resin with which the recess is filled. The LED element 15 and the sheet piece 13 (the color conversion layer 6 and the base layer 10) are sealed by this sealing resin layer 8 (State S5). Thus, the light-emitting body 22 as illustrated in FIG. 6 is produced. From the viewpoints of transparency and heat resistance, a silicone resin is preferably used as a transparent resin constituting the sealing resin layer 8. Furthermore, a light-emitting body (for example, the light-emitting body 21*b* illustrated in FIG. 5B) can be produced by sealing the LED element 15 by the sealing resin layer 8 without sticking the sheet piece 13 onto the LED element 15, and subsequently sticking a color conversion sheet on the sealing resin layer 8.

In the case where a face-up type LED element is applied as the LED element 15, the color conversion sheet 1 is made into pieces in the same manner as described above, and subsequently, the sheet piece 13 is stuck onto the light extraction face of the LED element 15. Here, in the face-up type LED element, at least one electrode is formed in an element face on the same side as the light extraction face side. From the electrode pad of this LED element 15, electrical conduction is brought by wire bonding, for example, as described later. Accordingly, the sheet piece 13 is stuck so that at least a part of the electrode pad of the LED element 15 is exposed. Of course, the sheet piece 13 may be stuck onto only the light extraction face of this LED element 15. Alternatively, the color conversion sheet 1 may be made into pieces having a patterned form so that a part of the electrode pad of the LED element 15 is exposed. Subsequently, a face opposite to the light extraction face of the LED element 15 is fixed to the substrate 2, and the electrode pad of the LED element 15 and circuit wiring of the substrate 2 are electrically connected by a known method, such as wire bonding, whereby a light-emitting body can be obtained.

The color conversion sheet 1 to be used for the above-described method for producing the light-emitting body may include a laminate of the color conversion layer 6 and the base layer 10 as illustrated in FIG. 6 or may include the color conversion layer 6, or may further include other layers, such as the above-described barrier film. The color conversion layer 6 may include the above-described two color conversion layers (X) and (Y).

The color conversion sheet 1 may be in a semi-cured state, or may be cured in advance. The LED element 15 may be mounted on the substrate 2 for wiring after sticking the sheet piece 13 onto the LED element 15, or the LED element 15 may be mounted on the substrate 2 and subsequently the sheet piece 13 may be stuck onto the LED element 15. Furthermore, there is another method for producing the light-emitting body in which, after sticking the color conversion sheet 1 onto a semiconductor wafer having an LED formed on a surface thereof, the resulting semiconductor wafer is cut, together with the color conversion sheet 1, into pieces of the LED element 15, and the LED element 15 with the color conversion sheet 1 is mounted on the substrate 2.

<Reflector>

In the light-emitting body according to the embodiment of the present invention, a reflector (for example, the reflector 3 illustrated in FIG. 6) that forms the recess on the circuit board is preferably inclined to spread toward an opening side (a side farther from the LED mounted face) in order to reflect light efficiently. In this case, the angle of inclination of the reflector in the side face of the recess is not particularly limited, and, for example, the angle of inclination is approximately 45° to 90° from the top face of the light-emitting element, such as a blue LED light source. Examples of a preferred material for constituting the reflector include resins, such as a thermosetting resin and a thermoplastic resin. Specific examples of the resins include an epoxy resin, a silicone resin, a polyimide resin, a modified polyimide resin, a polyphthalamide resin, a polycarbonate resin, a polyphenylene sulfide resin, a liquid crystal polymer resin, an ABS resin, a phenol resin, an acrylic resin, and a PBT resin.

Particularly, by forming a reflector with a thermosetting resin, a light-emitting body excellent in durability can be obtained. From this viewpoint, resins, such as an epoxy resin, a modified epoxy resin, a silicone resin, and a modified silicone resin, are preferred as the thermosetting resin. Furthermore, a resin constituting the reflector may also contain inorganic particles of titanium dioxide, for example, in order to increase reflectivity. The reflectivity of the reflector is preferably 80% or higher, more preferably 90% or higher, and still more preferably 95% or higher.

<Recess>

The shape of the recess formed by the above-mentioned reflector is not particularly limited, and may be any shape, such as a column, a cone, a polygonal column, a polygonal pyramid, or shapes resembling the above-mentioned shapes. From the viewpoint of size reduction, among the above-mentioned shapes, the shape of a recess extending in the longitudinal direction is preferred for a side-view type light-emitting body. In particular, it is more preferred that the recess extends in the longitudinal direction, and, when seen from above, the recess is in the shape of a quadrangle, a polygon resembling a quadrangle, or a shape resembling a polygon. The length in the longitudinal direction of the recess is referred to as the length of the recess, and the length in the lateral direction (a direction perpendicular to the longitudinal direction) of the recess is referred to as the width of the recess. The width of the recess may vary along this longitudinal direction. In this case, the width of the recess preferably becomes wider from the bottom of the recess toward the center of the longitudinal direction.

Although the length and width of the above-mentioned recess are not particularly limited, and are only required to be sufficient to arrange the LED element and mount the LED element on a substrate. Specifically, the length of the above-mentioned recess is preferably 0.5 mm or larger and 10 mm or smaller, and the width of the recess is preferably 0.05 mm or larger and 5 mm or smaller. The depth of the recess can be suitably adjusted, for example, in accordance with the thickness of the LED element or a bonding method. For example, this depth is preferably 0.1 mm or larger and 3 mm or smaller.

<Excitation Light>

The excitation light is only required to be excitation light in a wavelength region that the organic luminescent material (A) can absorb, and the LED element that exhibits light emission in this wavelength region is a preferred light source of the excitation light. In particular, in display and lighting applications, from the viewpoint of increasing the color purity of blue light, a blue LED with excitation light in a range of 400 nm or longer and 500 nm or shorter is more preferably used as a light source of excitation light.

<Lighting Device>

The lighting device according to the embodiment of the present invention includes at least the above-described light-emitting body. The lighting device including this light-emitting body is not particularly limited, and can be applied for various types of lighting. Application examples of this lighting device include lighting devices used for spaces of buildings, lighting devices for vehicles such as a room light and a headlight, lighting devices for cameras such as a flashlight, and lighting devices for displays such as a back light a front light.

<Backlight Unit>

A backlight unit according to the embodiment of the present invention includes the above-described color conversion composition. In other words, this backlight unit is provided with the lighting device including the light-emitting body according to the embodiment of the present invention. Specifically, this backlight unit includes at least: a blue LED light source having a peak wavelength of light emission in a range of 400 nm or longer and 500 nm or shorter; and a color conversion composition or a color conversion sheet including the organic luminescent material (A) and the resin (B). This backlight unit may further include a brightness enhancement film (BEF, BEFRP, DBEF) in order to enhance brightness, or may further include a color filter in order to increase color purity. The backlight unit having such a configuration can be used for applications such as displays, interior, signs, and signboards.

<Display>

A display (for example, a liquid crystal display) according to the embodiment of the present invention includes the above-mentioned backlight unit. In other words, the backlight unit including the color conversion composition according to the embodiment of the present invention can be applied for a display. This backlight unit achieves both high color reproducibility and high durability, and therefore can be suitably used for displays.

EXAMPLES

Hereinafter, the present invention will be described using examples, but the present invention is not limited by the following examples. In the following Examples and Comparative Examples, compounds G-1, G-2, G-3, G-4, R-1, Q-1, Q-2, and Q-3 are compounds illustrated below. Resins (B-1), (B-2), (B-3), and (B-4), each being used as an example of the resin (B), and resins (C-1) and (C-2), each being used as an example of the thermoplastic resin (C), are described below. Note that, in the following Examples and Comparative Examples, the above-described resin (B) and thermoplastic resin (C) are sometimes collectively referred to as "resin".

G-1

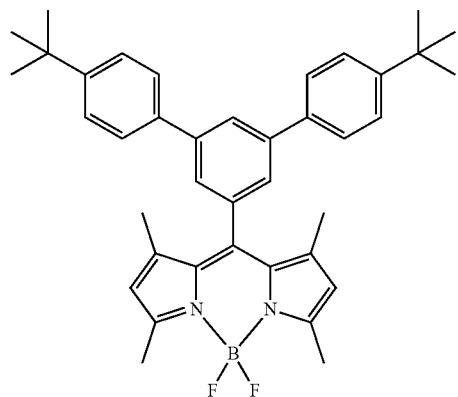

G-2

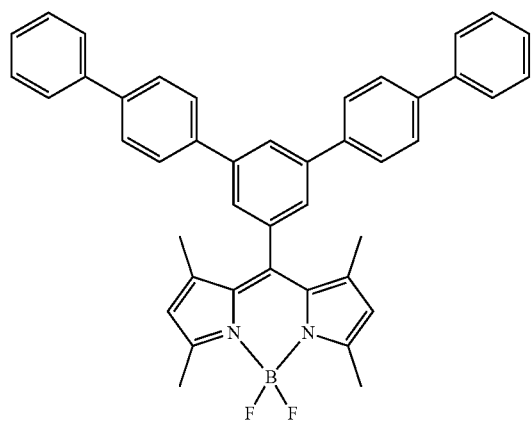

G-3

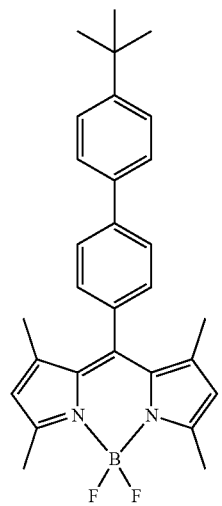

-continued

R-1

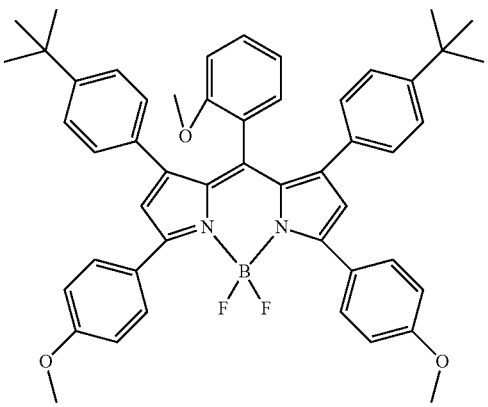

G-4

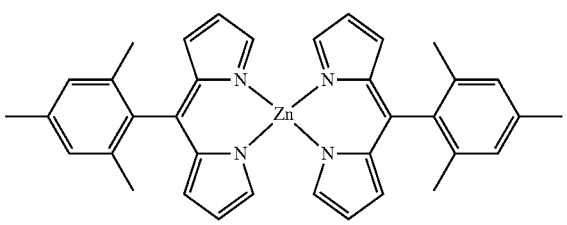

Q-1

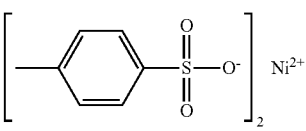

Q-2

Q-3

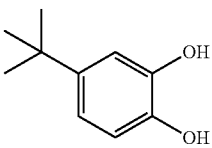

<Resin>

The resin (B-1) is a cycloolefin resin "ARTON D5450", manufactured by JSR Corporation (glass transition temperature: 128° C., SP value=7.8(cal/cm$^3$)$^{0.5}$). The resin (B-2) is a cycloolefin resin "TOPAS5013S", manufactured by POLYPLASTICS CO., LTD. (glass transition temperature: 136° C., SP value=7.8(cal/cm$^3$)$^{0.5}$). The resin (B-3) is a cycloolefin resin "TOPAS8007F", manufactured by POLYPLASTICS CO., LTD. (glass transition temperature: 78° C., SP value=8.8(cal/cm$^3$)$^{0.5}$). The resin (B-4) is a cycloolefin resin "APL5014DP", manufactured by Mitsui Chemicals, Inc. (glass transition temperature: 135° C., SP value=7.8 (cal/cm$^3$)$^{0.5}$).

The resin (C-1) is a polyester resin "VYLON 630", manufactured by TOYOBO CO., LTD. (glass transition temperature: 7° C., SP value=10.7(cal/cm$^3$)$^{0.5}$). The resin (C-2) is a silicone resin "OE-6630A/B", manufactured by Dow Corning Toray Co., Ltd. (glass transition temperature: 32° C., SP value=7.6(cal/cm$^3$)$^{0.5}$).

Measurement methods and evaluation methods in Examples and Comparative Examples are described below.

<¹H-NMR Measurement>

¹H-NMR of a compound was measured with a deuterated chloroform solution by using a superconducting FTNMR EX-270 (manufactured by JEOL Ltd.).

<Measurement of Emission Spectrum>

As for the emission spectrum of a compound, the compound was dissolved in toluene at a concentration of $1\times10^{-6}$ mol/L, and the emission spectrum at the time when the compound was excited at a wavelength of 460 nm was measured using a fluorescence spectrophotometer F-2500 (manufactured by Hitachi, Ltd.).

<Measurement of Moisture Content>

The moisture content of a color conversion composition was measured by putting 1 g of the color conversion composition into a Karl Fischer moisture meter 852 Titrando (coulometric KF moisture meter), manufactured by Metrohm.

<Measurement of Color Conversion Characteristics>

In the measurement of color conversion characteristics, by passing a current of 10 mA through a light-emitting body mounted with each of the color conversion sheets and a blue LED element (model number: PM2B-3LBE-SD, manufactured by ProLight, light emission peak wavelength: 460 nm), this blue LED element was lighted, and an emission spectrum, light emission intensity at peak wavelength, and chromaticity were measured using a spectral radiance meter (CS-1000, manufactured by KONICA MINOLTA, INC.). The distance between each of the color conversion sheets and the blue LED element was set to be 3 cm.

<Measurement of Color Reproducibility>

In the measurement of color reproducibility, each of a red color filter, a green color filter, and a blue color filter that had been produced by a known method were arranged on the light-emitting body obtained in the above-described measurement of color conversion characteristics, and chromaticity in a color space (u', v') at the time when color purity was increased by a color filter was measured. For this chromaticity measurement, a spectral radiance meter (CS-1000, manufactured by Konica Minolta, Inc.) was used. From an obtained chromaticity value, the ratio of the area of a color gamut in a color space (u', v') when the area of the BT. 2020 color gamut was set at 100% was calculated. Color reproducibility was evaluated based on the ratio of this calculated area of the color gamut.

<Durability Test>

In a durability test, by passing a current of 10 mA through a light-emitting body mounted with each of the color conversion sheets and a blue LED element (model number: PM2B-3LBE-SD, manufactured by ProLight, light emission peak wavelength: 460 nm), this blue LED element was lighted, and the light-emitting body was left standing in a room in which temperature was adjusted to 50° C. and humidity was adjusted to 60% RH. Next, using the spectral radiance meter (CS-1000, manufactured by Konica Minolta, Inc.), an initial brightness was measured. The distance between each of the color conversion sheets and the blue LED element was set to be 3 cm. Thereafter, light from the blue LED element was continuously emitted, and 1,000 hours later, brightness was measured again and the rate of change of brightness from the initial brightness value was calculated. Based on the obtained rate of change of brightness, durability was evaluated using the following criterion. In the results of this durability evaluation, "A" indicates that the rate of change was lower than 10%. "B" indicates that the above-mentioned rate of change was 10% or higher and lower than 20%. "C" indicates that the above-mentioned rate of change was 20% or higher and lower than 30%. "D" indicates that the rate of change was 30% or higher.

Synthesis Example 1

Hereinafter, a method for synthesizing the compound G-1 as Synthesis Example 1 in the present invention will be described. In the method for synthesizing the compound G-1, 3,5-dibromobenzaldehyde (3.0 g), 4-t-butylphenylboronic acid (5.3 g), tetrakis(triphenylphosphine)palladium(0) (0.4 g), and potassium carbonate (2.0 g) were put into a flask and purged with nitrogen. To the resultant mixture, degassed toluene (30 mL) and degassed water (10 mL) were added, and the resultant mixture was refluxed for 4 hours. This reaction solution was cooled to room temperature, and an organic phase was obtained by liquid separation, and then washed with a saturated saline solution. This organic phase was dried over magnesium sulfate and filtrated, and subsequently, a solvent was distilled off. The resulting reaction product was purified by silica gel chromatography to obtain 3,5-bis(4-t-butylphenyl)benzaldehyde (3.5 g) as a white solid.

Next, 3,5-bis(4-t-butylphenyl)benzaldehyde (1.5 g) and 2,4-dimethylpyrrole (0.7 g) were put into the reaction solution, and after adding dehydrated dichloromethane (200 mL) and trifluoroacetic acid (1 drop) thereto, the resultant solution was stirred in a nitrogen atmosphere for 4 hours. Subsequently, a dehydrated dichloromethane solution of 2,3-dichloro-5,6-dicyano-1,4-benzoquinone (0.85 g) was added, and the resultant solution was further stirred for 1 hour. After the completion of a reaction, a boron trifluoride-diethyl ether complex (7.0 mL) and diisopropylethylamine (7.0 mL) were added, followed by stirring for 4 hours, and then, water (100 mL) was added, followed by stirring, and an organic phase was obtained by liquid separation. This organic phase was dried over magnesium sulfate and filtrated, and subsequently, the solvent was distilled off. The resulting reaction product was purified by silica gel chromatography to obtain a compound (0.4 g) (yield: 18%). A result of a ¹H-NMR analysis of this obtained compound is as follows, and this compound was confirmed to be the compound G-1.

¹H-NMR (CDCl$_3$, ppm): 7.95 (s, 1H), 7.63 to 7.48 (m, 10H), 6.00 (s, 2H), 2.58 (s, 6H), 1.50 (s, 6H), 1.37 (s, 18H)

Note that the wavelength of a peak indicating the maximum radiant intensity in the emission spectrum of this compound G-1 was 528 nm. The full width at half maximum of the peak was 25 nm.

Synthesis Example 2

Hereinafter, a method for synthesizing the compound R-1 as Synthesis Example 2 in the present invention will be described. In the method for synthesizing the compound R-1, a mixed solution of 4-(4-t-butylphenyl)-2-(4-methoxyphenyl)pyrrole (300 mg), 2-methoxybenzoyl chloride (201 mg), and toluene (10 mL) was heated at 120° C. for 6 hours under a nitrogen flow. This heated solution was cooled to room temperature and then subjected to evaporation. Subsequently, after the resultant residue was washed with ethanol (20 mL) and vacuum-dried, whereby 2-(2-methoxybenzoyl)-3-(4-t-butylphenyl)-5-(4-methoxyphenyl)pyrrole (260 mg) was obtained.

Next, a mixed solution of 2-(2-methoxybenzoyl)-3-(4-t-butylphenyl)-5-(4-methoxyphenyl)pyrrole (260 mg), 4-(4-t-butylphenyl)-2-(4-methoxyphenyl)pyrrole (180 mg), methanesulfonic anhydride (206 mg), and degassed toluene (10 mL) was heated at 125° C. for 7 hours under a nitrogen flow. After this heated solution was cooled to room temperature, water (20 mL) was poured into the solution, and from the resultant solution, an organic phase was extracted with dichloromethane (30 mL). This organic phase was washed twice with water (20 mL) and subjected to evaporation, and the resultant residue was vacuum-dried to obtain a pyrromethene compound.

Next, diisopropylethylamine (305 mg) and a boron trifluoride-diethyl ether complex (670 mg) were added to a mixed solution of the obtained pyrromethene compound and toluene (10 mL) under nitrogen flow, and the mixture was stirred at room temperature for 3 hours. Subsequently, water (20 mL) was poured into the mixture, and, from the resultant solution, an organic phase was extracted with dichloromethane (30 mL). This organic phase was washed twice with water (20 mL, dried over magnesium sulfate, and subjected to evaporation. Subsequently, the resultant residue was purified by silica gel column chromatography and vacuum-dried, whereby a reddish purple powder (0.27 g) was obtained. A result of the $^1$H-NMR analysis of the obtained reddish purple powder is as follows, and the thus-obtained reddish-purple powder was confirmed to be R-1.

$^1$H-NMR (CDCl$_3$, ppm): 1.19 (s, 18H), 3.42 (s, 3H), 3.85 (s, 6H), 5.72 (d, 1H), 6.20 (t, 1H), 6.42 to 6.97 (m, 16H), 7.89 (d, 4H)

Note that the wavelength of a peak indicating the maximum radiant intensity in the emission spectrum of this compound R-1 was 635 nm. The full width at half maximum of the peak was 48 nm.

Example 1

In Example 1 of the present invention, the resin (B-1) was used as a resin, and 0.25 part by weight of the compound G-1 as the organic luminescent material (A), 0.005 part by weight of the compound R-1 as the organic luminescent material (E), and 20 parts by weight of toluene as a solvent were added to 100 parts by weight of the resin (B-1). A mixture of these components was heated to 50° C. and stirred, and subsequently using a planetary stirring/defoaming device "MAZERUSTAR KK-400" (manufactured by KURABO INDUSTRIES LTD.), the mixture was stirred and defoamed at 1,000 rpm for 5 minutes to obtain a color conversion composition. The moisture content of this color conversion composition was measured, and the result was 0.005% by weight.

Subsequently, the above-mentioned color conversion composition was applied onto "Cerapeel" BLK (manufactured by TORAY ADVANCED FILM Co., Ltd.) as a base layer by using a slit die coater, and heated and dried at 130° C. for 1 hour to obtain a color conversion sheet having a film thickness of 200 μm.

The color conversion characteristics, color reproducibility, and durability of a light-emitting body including this color conversion sheet were measured. As a result, the peak wavelength of green light was 530 nm, and the full width at half maximum of the peak was 25 nm. The peak wavelength of red light was 640 nm, and the full width at half maximum of the peak was 48 nm. The color reproducibility was 89%. The result of the durability evaluation was that the rate of change of brightness from an initial value was 7.5%, and this evaluation result was rated "A". The evaluation result of the light-emitting body of Example 1 and components of the color conversion composition are listed in Table 3 described later.

Examples 2 and 3 and Comparative Examples 1 to 3

In each of Examples 2 and 3 of the present invention and Comparative Examples 1 to 3 for the present invention, a color conversion sheet and a light-emitting body were obtained in the same manner as in Example 1, except that components listed in Table 3 (for example, the compounds G-1, G-2, G-3, and G-4, and resin (B-1), resin (B-4), and resin (C-2)) were suitably used as the organic luminescent material (A), a resin, the organic luminescent material (E), and a solvent which Were contained in a color conversion layer. Table 3 lists evaluation results obtained in Examples 2 and 3 and Comparative Examples 1 to 3.

Note that the wavelength of a peak indicating the maximum radiant intensity in the emission spectrum of the compound G-2 was 530 nm. The full width at half maximum of the peak was 42 nm. The wavelength of a peak indicating the maximum radiant intensity in the emission spectrum of the compound G-3 was 530 nm. The full width at half maximum of the peak was 47 nm. The wavelength of a peak indicating the maximum radiant intensity in the emission spectrum of the compound G-4 was 493 nm. The full width at half maximum of the peak was 55 nm.

In the color conversion sheet obtained in Example 2, the peak wavelength of green light was 532 nm, and the full width at half maximum of the peak was 42 nm. The peak wavelength of red light was 640 nm, and the full width at half maximum of the peak was 48 nm. The color reproducibility was 80%. The result of the durability evaluation was that the rate of change of brightness from an initial value was 8.0%, and this evaluation result was rated "A".

In the color conversion sheet obtained in Example 3, the peak wavelength of green light was 532 nm, and the full width at half maximum of the peak was 47 nm. The peak wavelength of red light was 640 nm, and the full width at half maximum of the peak was 48 nm. The color reproducibility was 75%. The result of the durability evaluation was that the rate of change of brightness from an initial value was 8.7%, and this evaluation result was rated "A".

In the color conversion sheet obtained in Comparative Example 1, the peak wavelength of green light was 495 nm, and the full width at half maximum of the peak was 55 nm. The peak wavelength of red light was 640 nm, and the full width at, half maximum of the peak was 48 nm.

The color reproducibility was 50%. The result of the durability evaluation was that the rate of change of brightness from an initial value was 40%, and this evaluation result was rated "D".

In the color conversion sheet obtained in Comparative Example 2, the peak wavelength of green light was 530 nm, and the full width at half maximum of the peak was 25 nm. The peak wavelength of red light was 640 nm, and the full width at half maximum of the peak was 48 nm. The color reproducibility was 92%. The result of the durability evaluation was that the rate of change of brightness from an initial value was 58%, and this evaluation result was rated "D".

In the color conversion sheet obtained in Comparative Example 3, the peak wavelength of green light was 530 nm, and the full width at half maximum of the peak was 25 nm. The peak wavelength of red light was 640 nm, and the full width at half maximum of the peak was 48 nm. The color reproducibility was 92%. The result of the durability evaluation was that the rate of change of brightness from an initial value was 35%, and this evaluation result was rated "D".

In Examples 1 to 3, the full width at half maximums of peaks in the emission spectrum of their organic luminescent materials (A) and (E) were 10 nm to 50 nm, and their resins had an alicyclic structure, and therefore, their light-emitting bodies were excellent in both color reproducibility and durability.

Similarly, the color conversion composition for producing the layer (Y) was applied on a PET base layer side of a light diffusion film "Chemical Matte" 125PW (manufactured by KIMOTO Co., Ltd., thickness: 138 μm) as a second base

TABLE 3

| | | Example 1 | Example 2 | Example 3 | Comparative Example 1 | Comparative Example 2 | Comparative Example 3 |
|---|---|---|---|---|---|---|---|
| Organic luminescent material (A) | Type | G-1 | G-2 | G-3 | G-4 | G-1 | G-1 |
| | Peak wavelength/full width at half maximum | 528 nm/25 nm | 530 nm/42 nm | 530 nm/47 nm | 493 nm/55 nm | 528 nm/25 nm | 528 nm/25 nm |
| | Content (wt %) | 0.25 | 0.25 | 0.25 | 0.25 | 0.25 | 0.25 |
| Resin | Type (ratio of repeating unit having alicyclic structure) | B-1 (100 wt %) | B-1 (100 wt %) | B-1 (100 wt %) | B-1 (100 wt %) | C-2 (0 wt %) | B-4 (35 wt %) |
| Organic luminescent material (E) | Type | R-1 | R-1 | R-1 | R-1 | R-1 | R-1 |
| | Peak wavelength/full width at half maximum | 635 nm/48 nm | 635 nm/48 nm | 635 nm/48 nm | 635 nm/48 nm | 635 nm/48 nm | 635 nm/48 nm |
| | Content (wt %) | 0.005 | 0.005 | 0.005 | 0.005 | 0.005 | 0.005 |
| Solvent | Type | Toluene | Toluene | Toluene | Toluene | Toluene | Toluene |
| | Content (wt %) | 20 | 20 | 20 | 20 | 20 | 20 |
| Moisture content (wt %) | | 0.005 | 0.005 | 0.005 | 0.07 | 0.2 | 0.005 |
| Light-emitting body | Green peak wavelength/full width at half maximum | 530 nm/25 nm | 532 nm/42 nm | 532 nm/47 nm | 495 nm/55 nm | 530 nm/25 nm | 530 nm/25 nm |
| | Red peak wavelength/full width at half maximum | 640 nm/48 nm | 640 nm/48 nm | 640 nm/48 nm | 640 nm/48 nm | 640 nm/48 nm | 640 nm/48 nm |
| Color reproducibility (%) | | 89 | 80 | 75 | 50 | 92 | 92 |
| Durability evaluation result | | A | A | A | D | D | D |

Example 4

In Example 4 of the present invention, the resin (B-1) was used as a resin, and 0.25 part by weight of the compound G-1 as the organic luminescent material (A) and 20 parts by weight of toluene as a solvent were added to 100 parts by weight of the resin (B-1). A mixture of these components was heated to 50° C. and stirred, and subsequently by using a planetary stirring/defoaming device, "MAZERUSTAR KK-400" (manufactured by KURABO INDUSTRIES LTD.), the mixture was stirred and defoamed at 1,000 rpm for 5 minutes to obtain a color conversion composition for producing the layer (X). The moisture content of the color conversion composition for producing the layer (X) was measured, and the result was 0.005% by weight.

Similarly, the resin (C-1) was used as a resin, and 0.005 part by weight of the compound R-1 as the organic luminescent material (E) and 20 parts by weight of toluene as a solvent were added to 100 parts by weight of the resin (C-1). A mixture of these components was stirred and defoamed at 300 rpm for 20 minutes by using a planetary stirring/defoaming device, "MAZERUSTAR KK-400" (manufactured by KURABO INDUSTRIES LTD.), whereby a color conversion composition for producing the layer (Y) was obtained. The moisture content of the color conversion composition for producing the layer (Y) was measured, and the result was 0.14% by weight.

Subsequently, the color conversion composition for producing the layer (X) was applied onto "Lumirror" U48 (manufactured by Toray Industries, Inc., thickness: 50 μm) as a first base layer by using a slit die coater, and heated and dried at 100° C. for 20 minutes to obtain the layer (X) having an average film thickness of 16 μm.

layer by using a slit die coater, and heated and dried at 100° C. for 20 minutes to obtain the layer (Y) having an average film thickness of 48 μm.

Next, the above-mentioned two layers, namely the layer (X) and the layer (Y), were directly heat-laminated on each other, whereby a color conversion sheet having a structure of "a light diffusion layer/the second base layer/the layer (Y)/the layer (X)/the first base layer" was produced.

The color reproducibility and durability of a light-emitting body including this color conversion sheet were measured. As a result, the peak wavelength of green light was 528 nm, and the full width at half maximum of the peak was 25 nm. The peak wavelength of red light was 640 nm, and the full width at half maximum of the peak was 48 nm. The color reproducibility was 92%. The result of the durability evaluation was that the rate of change of brightness from an initial value was 7.0%, and this evaluation result was rated "A". The evaluation result of the light-emitting body of Example 4 and components of the color conversion composition are listed in Table 4 described later.

Examples 5 to 11

In each of Examples 5 to 11 of the present invention, a color conversion sheet and a light-emitting body were obtained in the same manner as in Example 4, except that components listed in Table 4 (for example, the compounds G-1 and R-1, resin (B-1), resin (B-2), resin (B-3), resin (B-4), resin (C-1), and resin (C-2)) were suitably used as the organic luminescent material (A) for the layer (X), the organic luminescent material (E) for the layer (Y), a resin, an additive, and a solvent. Table 4 lists evaluation results obtained in Examples 5 to 11.

In the light-emitting body obtained in Example 5, the peak wavelength of green light was 530 nm, and the full width at half maximum of the peak was 25 nm. The peak wavelength of red light was 640 nm, and the full width at half maximum of the peak was 48 nm. The color reproducibility was 90%. The result of the durability evaluation was that the rate of change of brightness from an initial value was 16.0%, and this evaluation result was rated "B".

In the light-emitting body obtained in Example 6, the peak wavelength of green light was 530 nm, and the full width at half maximum of the peak was 25 nm. The peak wavelength of red light was 640 nm, and the full width at half maximum of the peak was 48 nm. The color reproducibility was 90%. The result of the durability evaluation was that the rate of change of brightness from an initial value was 5.5%, and this evaluation result was rated "A".

In the light-emitting body obtained in Example 7, the peak wavelength of green light was 530 nm, and the full width at half maximum of the peak was 25 nm. The peak wavelength of red light was 640 nm, and the full width at half maximum of the peak was 48 nm. The color reproducibility was 90%. The result of the durability evaluation was that the rate of change of brightness from an initial value was 5.2%, and this evaluation result was rated "A".

In the light-emitting body obtained in Example 8, the peak wavelength of green light was 530 nm, and the full width at half maximum of the peak was 25 nm. The peak wavelength of red light was 640 nm, and the full width at half maximum of the peak was 48 nm. The color reproducibility was 90%. The result of the durability evaluation was that the rate of change of brightness from an initial value was 5.4%, and this evaluation result was rated "A".

In Example 9, the resin (B-1) and the resin (C-2) for the layer (X) were mixed at a weight ratio of 2:1. Accordingly, in an obtained color conversion sheet, the peak wavelength of green light was 526 nm, and the full width at half maximum of the peak was 25 nm. The peak wavelength of red light was 640 nm, and the full width at half maximum of the peak was 48 nm. The color reproducibility was 94%. The result of the durability evaluation was that the rate of change of brightness from an initial value was 25.6%, and this evaluation result was rated "C".

In Example 10, the resin (B-3) was used for the layer (X). Accordingly, in an obtained color conversion sheet, the peak wavelength of green light was 535 nm, and the full width at half maximum of the peak was 25 nm. The peak wavelength of red light was 637 nm, and the full width at half maximum of the peak was 48 nm. The color reproducibility was 78%. The result of the durability evaluation was that the rate of change of brightness from an initial value was 16.0%, and this evaluation result was rated "B".

In Example 11, the resin (B-1) and the resin (B-4) for the layer (X) were mixed at a weight ratio of 8.3:1. Accordingly, in an obtained color conversion sheet, the peak wavelength of green light was 526 nm, and the full width at half maximum of the peak was 25 nm. The peak wavelength of red light was 640 nm, and the full width at half maximum of the peak was 48 nm. The color reproducibility was 94%. The result of the durability evaluation was that the rate of change of brightness from an initial value was 9.5%, and this evaluation result was rated "A".

TABLE 4

| | | | Example 4 | Example 5 | Example 6 | Example 7 | Example 8 | Example 9 | Example 10 | Example 11 |
|---|---|---|---|---|---|---|---|---|---|---|
| Color conversion composition for producing layer (X) | Organic luminescent material (A) | Type | G-1 | G-1 | G-1 | G-1 | G-1 | G-1 | G-1 | G-1 |
| | | Peak wavelength/full width at half maximum | 528 nm/ 25 nm | 528 nm/ 25 nm | 528 nm/ 25 nm | 528 nm/ 25 nm | 528 nm/ 25 nm | 528 nm/ 25 nm | 528 nm/ 25 nm | 528 nm/ 25 nm |
| | | Content (wt %) | 0.25 | 0.25 | 0.25 | 0.25 | 0.25 | 0.25 | 0.25 | 0.25 |
| | Additive | Type | — | — | Q-1 | Q-2 | Q-3 | — | — | — |
| | | Content (wt %) | — | — | 3 | 3 | 3 | — | — | — |
| | Resin | Type (ratio of repeating unit having alicyclic structure) | B-1 (100 wt %) | B-2 (78 wt %) | B-2 (78 wt %) | B-2 (78 wt %) | B-2 (78 wt %) | B-1 + C-2 (33 wt %) | B-3 (64 wt %) | B-1 + B-4 (93 wt %) |
| | Solvent | Type | Toluene | Toluene | Toluene | Toluene | Toluene | Toluene | Toluene | Toluene |
| | | Content (wt %) | 20 | 20 | 20 | 20 | 20 | 20 | 20 | 20 |
| Color conversion composition for producing layer (Y) | Organic luminescent material (E) | Type | R-1 | R-1 | R-1 | R-1 | R-1 | R-1 | R-1 | R-1 |
| | | Peak wavelength/full width at half maximum | 635 nm/ 48 nm | 635 nm/ 48 nm | 635 nm/ 48 nm | 635 nm/ 48 nm | 635 nm/ 48 nm | 635 nm/ 48 nm | 632 nm/ 40 nm | 632 nm/ 40 nm |
| | | Content (wt %) | 0.005 | 0.005 | 0.005 | 0.005 | 0.005 | 0.005 | 0.005 | 0.005 |
| | Resin | Type | C-1 | C-1 | C-1 | C-1 | C-1 | C-1 | C-2 | C-1 |
| | Solvent | Type | Toluene | Toluene | Toluene | Toluene | Toluene | Toluene | Toluene | Toluene |
| | | Content (wt %) | 20 | 20 | 20 | 20 | 20 | 20 | 20 | 20 |
| Moisture content (wt %) | | Color conversion composition for producing layer (X) | 0.005 | 0.005 | 0.005 | 0.005 | 0.005 | 0.005 | 0.02 | 0.005 |
| | | Color conversion composition for producing layer (Y) | 0.14 | 0.14 | 0.14 | 0.14 | 0.14 | 0.14 | 0.23 | 0.14 |

TABLE 4-continued

|  |  | Example 4 | Example 5 | Example 6 | Example 7 | Example 8 | Example 9 | Example 10 | Example 11 |
|---|---|---|---|---|---|---|---|---|---|
| Light-emitting body | Green peak wavelength/full width at half maximum | 528 nm/ 25 nm | 530 nm/ 25 nm | 530 nm/ 25 nm | 530 nm/ 25 nm | 530 nm/ 25 nm | 526 nm/ 25 nm | 535 nm/ 25 nm | 526 nm/ 25 nm |
|  | Red peak wavelength/full width at half maximum | 640 nm/ 48 nm | 640 nm/ 48 nm | 640 nm/ 48 nm | 640 nm/ 48 nm | 640 nm/ 48 nm | 640 nm/ 48 nm | 637 nm/ 48 nm | 640 nm/ 48 nm |
| Color reproducibility (%) |  | 92 | 90 | 90 | 90 | 90 | 94 | 78 | 94 |
| Durability evaluation result |  | A | B | A | A | A | C | B | A |

Example 12

In Example 12 of the present invention, a light-emitting body including a color conversion layer produced using a color conversion composition by a dispensing method was evaluated. Specifically, a substrate was sandwiched between molds for transfer molding, and a thermosetting resin was poured into the molds and cured, whereby a reflector was produced on this substrate. At this time, the shape of a recess formed by the reflector was a rectangular parallelepiped shape having a rectangular bottom 1 mm per side and a depth of 0.5 mm. A flip-chip type blue LED was arranged in this recess formed by the reflector, and an electrode of this blue LED and circuit wiring of the substrate were electrically connected.

Next, a color conversion composition produced in the same manner as in Example 1 was poured using a dispenser into the recess formed by the reflector, and heated at 120° C. for 1 hour, whereby a color conversion layer was formed in this recess to obtain a light-emitting body. By passing a current of 10 mA through this light-emitting body, the blue LED element was lighted, and an emission spectrum, light emission intensity at peak wavelength, and chromaticity were measured using a spectral radiance meter (CS-1000, manufactured by KONICA MINOLTA, INC.).

The color conversion characteristics, color reproducibility, and durability of the light-emitting body were measured. As a result, the peak wavelength of green light was 528 nm, and the full width at half maximum of the peak was 25 nm.

The peak wavelength of red light was 640 nm, and the full width at half maximum of the peak was 48 nm. The color reproducibility was 89%. The result of the durability evaluation was that the rate of change of brightness from an initial value was 8.5%, and this evaluation result was rated "A".

Example 13

In Example 13 of the present invention, a light-emitting body produced by a sheet method using a color conversion sheet was evaluated. Specifically, a color conversion sheet produced in the same manner as in Example 4 was cut into pieces with a cutting device (GCUT, manufactured by UHT). Subsequently, the cut color conversion sheet (a sheet piece) was subjected to vacuum suction with a collet by using a die-bonding device (manufactured by Toray Engineering Co., Ltd.), and positioned properly on the top of a flip-chip type blue LED and stuck thereonto. At this time, an adhesive was beforehand applied onto the flip-chip type blue LED, and the color conversion sheet was stuck onto the blue LED via the adhesive. As this adhesive, a silicone resin (OE-6630, manufactured by Dow Corning Toray Co., Ltd.) was employed. Subsequently, a reflector was formed on a substrate in the same manner as in Example 12, and the flip-chip type blue LED on which the color conversion sheet had been stuck was arranged in a recess formed by the reflector, and an electrode of this blue LED and circuit wiring of the substrate were electrically connected. Subsequently, a silicone resin (OE-6630) was poured by using a dispenser into the recess formed by the reflector, and heated at 150° C. for 3 hours to thermoset this silicone resin. Thus, a light-emitting body was obtained.

The color conversion characteristics, color reproducibility, and durability of the light-emitting body were measured in the same manner as in Example 12. As a result, the peak wavelength of green light was 528 nm, and the full width at half maximum of the peak was 25 nm. The peak wavelength of red light was 640 nm, and the full width at half maximum of the peak was 48 nm. The color reproducibility was 89%. The result of the durability evaluation was that the rate of change of brightness from an initial value was 8.0%, and this evaluation result was rated "A".

INDUSTRIAL APPLICABILITY

As described above, the color conversion composition, the color conversion sheet, and the light-emitting body, the lighting device, the backlight unit, and the display each including the same according to the present invention, are respectively suitable for a color conversion composition, a color conversion sheet, a light-emitting body, a lighting device, a backlight unit, and a display, each being capable of achieving both enhanced color reproducibility and higher durability.

REFERENCE SIGNS LIST 1, 1a, 1b, 1c color conversion sheet
2 substrate
3 reflector
4 LED element
5 wire
6, 6a, 6b color conversion layer
7 lens
8 sealing resin layer
9 color conversion sheet
10 base layer
11 barrier film
12 cutter
13 sheet piece
14 collet
15 LED element
16 layer (X)
18 layer (Y)
20a, 20b, 20c, 20d, 20e, 21a, 21b, 22 light-emitting body

The invention claimed is:

1. A color conversion sheet, comprising:
   (a) a color conversion layer (X) including a color conversion composition configured to convert incident light into light having a wavelength longer than that of the incident light, the color conversion composition comprising:
      an organic luminescent material (A) having a full width at half maximum of a peak of 10 nm or larger and 50 nm or smaller, the peak indicating a maximum radiant intensity in an emission spectrum; and
      a resin (B) having an alicyclic structure, a ratio of a repeating unit having the alicyclic structure in the resin being 50% by weight or higher in a total amount of the resin,
      wherein a wavelength of the peak indicating the maximum radiant intensity of the organic luminescent material (A) is observed in a region of 500 nm or longer and 580 nm or shorter by using excitation light having a wavelength in a range of 400 nm or longer and 500 nm or shorter, and
   (b) a color conversion layer (Y) including:
      an organic luminescent material (E) exhibiting light emission in which a wavelength of a peak is observed in a region of 580 nm or longer and 750 nm or shorter upon being excited by at least one of excitation light having a wavelength in a range of 400 nm or longer and 500 nm or shorter and light emitted from the organic luminescent material (A); and
      a thermoplastic resin (C) different from the resin (B).

2. The color conversion composition sheet according to claim 1, wherein a ratio of the repeating unit having the alicyclic structure in the resin (B) is 90% by weight or higher in the total amount of the resin (B).

3. The color conversion sheet according to claim 1, wherein the resin (B) has a cycloolefin structure in at least a part of a main chain and a side chain.

4. The color conversion sheet according to claim 1, wherein the resin (B) has a glass transition temperature of 80° C. or higher and 130° C. or lower.

5. The color conversion sheet according to claim 1, wherein the color conversion composition further comprises at least one of a tertiary amine, a catechol derivative, and a nickel compound,
   wherein the tertiary amine, the catechol derivative, and the nickel compound have a molar extinction coefficient £ of 100 L/(mol·cm) or smaller in an entire wavelength region of 400 nm or longer and 800 nm or shorter.

6. The color conversion sheet according to claim 1, wherein the organic luminescent material (A) is a pyrromethene derivative.

7. The color conversion sheet according to claim 1, wherein the organic luminescent material (A) is a compound of Formula (1):

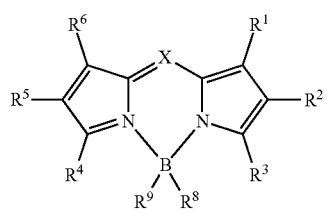

(1)

wherein X is C—$R^7$ or N; $R^1$ to $R^9$ are the same as or different from each other, and are selected from hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring each formed between adjacent substituents.

8. The color conversion sheet according to claim 7, wherein
   X in Formula (1) is C—$R^7$, and
   $R^7$ is a group of Formula (2):

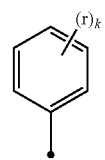

(2)

wherein r is selected from a group consisting of hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, and a phosphine oxide group; k is an integer of 1 to 3; when k is 2 or larger, r is the same as or different from each other.

9. The color conversion sheet according to claim 7, wherein the $R^1$, the $R^3$, the $R^4$, and the $R^6$ in Formula (1) are the same as or different from each other, and are a substituted or unsubstituted alkyl group.

10. The color conversion sheet according to claim 1, wherein the color conversion composition further comprises a thermoplastic resin different from the resin (B).

11. The color conversion sheet according to claim 1, wherein, when a solubility parameter of the resin (B) included in the color conversion layer (X) is $SP_B(cal/cm^3)^{0.5}$ and a solubility parameter of the thermoplastic resin (C) included in the color conversion layer (Y) is $SP_C (cal/cm^3)^{0.5}$, a relationship between $SP_B$ and $SP_C$ is $SP_B \leq SP_C$.

12. A light-emitting body, comprising:
   a blue light-emitting diode; and
   the color conversion sheet according to claim 1.

13. The light-emitting body according to claim 12, further comprising a resin layer between the blue light-emitting diode and the color conversion sheet.

14. A lighting device, comprising the light-emitting body according to claim 12.

15. A backlight unit, comprising the lighting device according to claim 14.

16. A display, comprising the backlight unit according to claim 15.

* * * * *

UNITED STATES PATENT AND TRADEMARK OFFICE
CERTIFICATE OF CORRECTION

PATENT NO. : 10,934,482 B2
APPLICATION NO. : 16/329417
DATED : March 2, 2021
INVENTOR(S) : Hiroki Sekiguchi et al.

It is certified that error appears in the above-identified patent and that said Letters Patent is hereby corrected as shown below:

In the Specification

In the Detailed Description of Embodiments, Column 117, Line 14, "molar extinction coefficient s" should read -- molar extinction coefficient $\varepsilon$ --

In the Claims

In Claim 5, Column 149, Line 47, "molar extinction coefficient £" should read -- molar extinction coefficient $\varepsilon$ --

Signed and Sealed this
Twenty-sixth Day of October, 2021

Drew Hirshfeld
*Performing the Functions and Duties of the*
*Under Secretary of Commerce for Intellectual Property and*
*Director of the United States Patent and Trademark Office*